(12) United States Patent
Ohsawa et al.

(10) Patent No.: US 10,764,974 B2
(45) Date of Patent: Sep. 1, 2020

(54) LIGHT-EMITTING DEVICE USING ORGANOMETALLIC COMPLEX HAVING A PYRAZINE SKELETON

(71) Applicant: Semiconductor Energy Laboratory Co., Ltd., Kanagawa-ken (JP)

(72) Inventors: Nobuharu Ohsawa, Kanagawa (JP); Hideko Inoue, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 104 days.

(21) Appl. No.: 16/157,497

(22) Filed: Oct. 11, 2018

(65) Prior Publication Data

US 2019/0053351 A1 Feb. 14, 2019

Related U.S. Application Data

(63) Continuation of application No. 11/986,949, filed on Nov. 27, 2007, now Pat. No. 10,129,947.

(30) Foreign Application Priority Data

Nov. 30, 2006 (JP) ................. 2006-325057

(51) Int. Cl.
*H01L 51/54* (2006.01)
*H05B 33/14* (2006.01)
(Continued)

(52) U.S. Cl.
CPC .............. *H05B 33/14* (2013.01); *C09K 11/06* (2013.01); *H01L 51/0085* (2013.01);
(Continued)

(58) Field of Classification Search
CPC . C09K 11/06; C09K 2211/10; C09K 2211/18; H01L 51/5012; H01L 2251/5384; H01L 2251/552
(Continued)

(56) References Cited

U.S. PATENT DOCUMENTS 5,085,947 A 2/1992 Saito et al.
5,756,224 A 5/1998 Borner et al.
(Continued)

FOREIGN PATENT DOCUMENTS

CN 001362746 A 8/2002
CN 001551697 A 12/2004
(Continued)

OTHER PUBLICATIONS

Tao.X et al., "Metal Complex Polymer for Second Harmonic Generation and Electroluminescence Applications", Appl. Phys. Lett. (Applied Physics Letters), Mar. 24, 1997, vol. 70, No. 12, pp. 1503-1505.
(Continued)

*Primary Examiner* — Marcos D. Pizarro
(74) *Attorney, Agent, or Firm* — Husch Blackwell LLP

(57) ABSTRACT

Light-emitting elements having high emission efficiency and long lifetime can be provided. By forming light-emitting devices including the light-emitting elements, the light-emitting devices having low power consumption and long lifetime can be provided. A light-emitting device comprises a light-emitting element including a light-emitting layer between a first electrode and a second electrode. The light-emitting layer includes a first organic compound having a hole-transporting property, a second organic compound having an electron transporting property, and an organometallic complex. A central metal of the organometallic complex is an element belonging to one of Group 9 and Group 10, and a ligand of the organometallic complex is a ligand having a pyrazine skeleton.

22 Claims, 29 Drawing Sheets

(51) Int. Cl.
*C09K 11/06* (2006.01)
*H01L 51/00* (2006.01)
*H01L 51/50* (2006.01)

(52) U.S. Cl.
CPC .. *H01L 51/5016* (2013.01); *C09K 2211/1007* (2013.01); *C09K 2211/1011* (2013.01); *C09K 2211/1029* (2013.01); *C09K 2211/1044* (2013.01); *C09K 2211/185* (2013.01); *H01L 51/006* (2013.01); *H01L 51/0072* (2013.01); *H01L 51/0081* (2013.01); *H01L 2251/5384* (2013.01); *H01L 2251/552* (2013.01)

(58) Field of Classification Search
USPC .......................................... 257/40, E51.018
See application file for complete search history.

(56) References Cited

U.S. PATENT DOCUMENTS

| | | | |
|---|---|---|---|
| 6,392,250 | B1 | 5/2002 | Aziz et al. |
| 6,465,115 | B2* | 10/2002 | Shi .................... H01L 51/0052 313/504 |
| 6,734,457 | B2 | 5/2004 | Yamazaki et al. |
| 6,780,528 | B2 | 8/2004 | Tsuboyama et al. |
| 6,803,720 | B2 | 10/2004 | Kwong et al. |
| 6,821,646 | B2 | 11/2004 | Tsuboyama et al. |
| 6,953,628 | B2 | 10/2005 | Kamatani et al. |
| 7,094,477 | B2 | 8/2006 | Kamatani et al. |
| 7,147,935 | B2 | 12/2006 | Kamatani et al. |
| 7,220,495 | B2 | 5/2007 | Tsuboyama et al. |
| 7,238,806 | B2 | 7/2007 | Inoue et al. |
| 7,419,727 | B2 | 9/2008 | Kojima et al. |
| 7,569,692 | B2 | 8/2009 | Nii et al. |
| 7,572,522 | B2 | 8/2009 | Seo et al. |
| 7,579,089 | B2 | 8/2009 | Seo et al. |
| 7,601,435 | B2 | 10/2009 | Shitagaki et al. |
| 7,601,988 | B2 | 10/2009 | Seo et al. |
| 7,902,742 | B2 | 3/2011 | Suzuki et al. |
| 7,915,409 | B2 | 3/2011 | Inoue et al. |
| 8,053,974 | B2 | 11/2011 | Seo et al. |
| 8,133,597 | B2 | 3/2012 | Yasukawa et al. |
| 8,211,553 | B2 | 7/2012 | Nii et al. |
| 8,278,444 | B2 | 10/2012 | Inoue et al. |
| 8,310,147 | B2 | 11/2012 | Seo et al. |
| 8,569,486 | B2 | 10/2013 | Inoue et al. |
| 9,219,236 | B2 | 12/2015 | Inoue et al. |
| 2002/0028346 | A1 | 3/2002 | Shi et al. |
| 2002/0074935 | A1 | 6/2002 | Kwong et al. |
| 2005/0221121 | A1 | 10/2005 | Ishihara et al. |
| 2005/0221123 | A1* | 10/2005 | Inoue .................. C07F 15/0033 428/690 |
| 2005/0242715 | A1 | 11/2005 | Inoue et al. |
| 2005/0260440 | A1* | 11/2005 | Seo .................... H01L 51/002 428/690 |
| 2006/0102910 | A1 | 5/2006 | Yamazaki et al. |
| 2006/0177694 | A1 | 8/2006 | Kamatani et al. |
| 2006/0228583 | A1 | 10/2006 | Kamatani et al. |
| 2007/0150206 | A1 | 6/2007 | Iwaki et al. |
| 2007/0161793 | A1 | 7/2007 | Murata et al. |
| 2007/0212570 | A1 | 9/2007 | Kamatani et al. |
| 2007/0213527 | A1 | 9/2007 | Inoue et al. |
| 2007/0216294 | A1 | 9/2007 | Kamatani et al. |
| 2008/0149923 | A1 | 6/2008 | Ohsawa et al. |
| 2012/0049727 | A1 | 3/2012 | Seo et al. |
| 2012/0169220 | A1 | 7/2012 | Nii et al. |

FOREIGN PATENT DOCUMENTS

| | | |
|---|---|---|
| CN | 001890255 A | 1/2007 |
| EP | 1 191 612 A2 | 3/2002 |
| EP | 1 191 614 A2 | 3/2002 |
| EP | 1 220 340 A2 | 7/2002 |
| EP | 1 348 711 A1 | 10/2003 |
| EP | 1 349 435 A1 | 10/2003 |
| EP | 1 690 866 A1 | 8/2006 |
| EP | 1 881 050 A2 | 1/2008 |
| EP | 1 889 891 A2 | 2/2008 |
| EP | 2 256 840 A2 | 12/2010 |
| EP | 2 336 143 A1 | 6/2011 |
| JP | 03-190088 A | 8/1991 |
| JP | 2004-515895 | 5/2004 |
| JP | 2004-265623 A | 9/2004 |
| JP | 2005-285708 A | 10/2005 |
| JP | 2005-314414 A | 11/2005 |
| JP | 3810789 | 8/2006 |
| TW | 543337 | 7/2003 |
| TW | 200605724 | 2/2006 |
| TW | I440397 | 6/2014 |
| WO | WO 2002/047457 A2 | 6/2002 |
| WO | WO 2004/108857 A1 | 12/2004 |
| WO | WO 2005/054261 A1 | 6/2005 |
| WO | WO 2006/043678 A1 | 4/2006 |
| WO | WO 2006/046678 A1 | 5/2006 |
| WO | WO 2006/098120 A1 | 9/2006 |
| WO | WO 2006/104177 A1 | 10/2006 |
| WO | WO 2007/029466 A1 | 3/2007 |
| WO | WO 2008/065975 A1 | 6/2008 |

OTHER PUBLICATIONS

Tsutsui.T et al., "High Quantum Efficiency in Organic Light-Emitting Devices With Iridium-Complex As a Triplet Emissive Center", Jpn. J. Appl. Phys. (Japanese Journal of Applied Physics), Dec. 15, 1999, vol. 38, No. 12B, pp. L1502-L1504.

Adachi.C et al., "High-Efficiency Red Electrophosphorescence Devices", Appl. Phys. Lett. (Applied Physics Letters), Mar. 12, 2001, vol. 78, No. 11, pp. 1622-1624.

Goldsmith.C et al., "C-H Bond Activation by a Ferric Methoxide Complex: Modeling the Rate-Determining Step in the Mechanism of Lipoxygenase", J. Am. Chem. Soc. (Journal of the American Chemical Society), 2002, vol. 124, No. 1, pp. 83-96.

Seo.S et al., "64.4: High-Performance OLEDs Based on a New Class of Ir Complexes Bearing pyrazine structures in their ligands", SID Digest '07 : SID International Symposium Digest of Technical Papers, May 22, 2007, vol. 38, pp. 1776-1779.

Onishi.T et al., "A Method of Measuring an Energy Level", High Molecular EL Materials—Development of Light-Emitting High Molecular Compounds, Dec. 25, 2004, pp. 64-67, Kyoritsu Shuppan.

Baldo.M et al., "Highly Efficient Phosphorescent Emission From Organic Electroluminescent Devices", Nature, Sep. 10, 1998, vol. 395, pp. 151-154.

Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.

Nishi.T et al., "High Efficiency TFT-OLED Display With Iridium-Complex As Triplet Emissive Center", Proceedings of the 10th International Workshop on Inorganic and Organic Electroluminescence (EL '00), Dec. 4, 2000, pp. 353-356.

Thompson.M et al., "Phosphorescent Materials and Devices", Proceedings of the 10th International Workshop on Inorganic and Organic Electroluminescence (EL'00), Dec. 4, 2000, pp. 35-38.

Seo.S et al., "P-132: Long-Lived Deeply Red Phosphorescent OLEDs Based on Electrochemically Stable Ir Complexes", SID Digest '05 : SID International Symposium Digest of Technical Papers, 2005, vol. 36, pp. 806-809.

Andrade.B et al., "White Light Emission Using Triplet Excimers in Electrophosphorescent Organic Light-Emitting Devices", Adv. Mater. (Advanced Materials), Aug. 5, 2002, vol. 14, No. 15, pp. 1032-1036.

Chung.H et al., "Designing Amoleds for Mobile Displays", Information Display, 2005, vol. 21, No. 12, pp. 22-26.

Ma.Y et al., "Electroluminescence From Triplet Metal-Ligand Chaege-Transfer Excited State of Transition Metal Complexes", Synthetic Metals, 1998, vol. 94, No. 3, pp. 245-248.

Tsuboi.T et al., "Temperature Dependence of Photoluminescence Decay Time of Ir(PPY)3", IEICE Trans. Electron. (IEICE Transactions on Electronics), Dec. 1, 2004, vol. E87-C, No. 12, pp. 2028-2032.

(56) References Cited

OTHER PUBLICATIONS

島健太郎, Development and the Constitution Materials of the Organic EL Devices—A Development Trend and Patent development—, Jul. 31, 2006, pp. 137-140/182-183.
International Search Report (Application No. PCT/JP2007/072699) dated Feb. 19, 2008.
Written Opinion (Application No. PCT/JP2007/072699) dated Feb. 19, 2008.
Steel.P et al., "Cyclometallated compounds V. Double cyclopalladation of diphenyl pyrazines and related ligands", Journal of Organometallic Chemistry, Oct. 2, 1990, vol. 395, No. 3, pp. 359-373.
Slater.J et al., "Cyclometallated nitrogen heterocycles", Journal of Organometallic Chemistry, Aug. 29, 2003, vol. 688, pp. 112-120.
Chinese Office Action (Application No. 200780044338.5) dated Dec. 23, 2011.
Chinese Office Action (Application No. 200780044338.5) dated Apr. 12, 2013.
Chang.C et al., "High efficiency red electrophosphorescent polymer light-emitting diode", Chem. Phys. Lett. (Chemical Physics Letters), 2006, vol. 418, pp. 50-53, Elsevier.
Zhang.G et al., "Synthesis and luminescence of a new phosphorescent iridium(III) pyrazine complex", Materials Letters, 2005, vol. 59, pp. 3002-3006, Elsevier.
Duan.J et al., "New Iridium Complexes As Highly Efficient Orange-Red Emitters in Organic Light-Emitting Diodes", Adv. Mater. (Advanced Materials), Feb. 5, 2003, vol. 15, No. 3, pp. 224-228.
European Search Report (Application No. 07832427.4) dated Sep. 4, 2013.
Taiwanese Office Action (Application No. 96144790) dated Oct. 18, 2013.
Chinese Office Action (Application No. 201410168082.0) dated Jan. 28, 2016.
Taiwanese Office Action (Application No. 103110653) dated Apr. 1, 2016.
Zhang, L. et al., "Synthesis and Phosphorescence of a New Iridium(III) Pyrazine Complex,"Wuli Huaxue Xuebao (Acta Physico-Chimica Sinica), Oct. 19, 2003, vol. 19, No. 10, pp. 889-891.

* cited by examiner

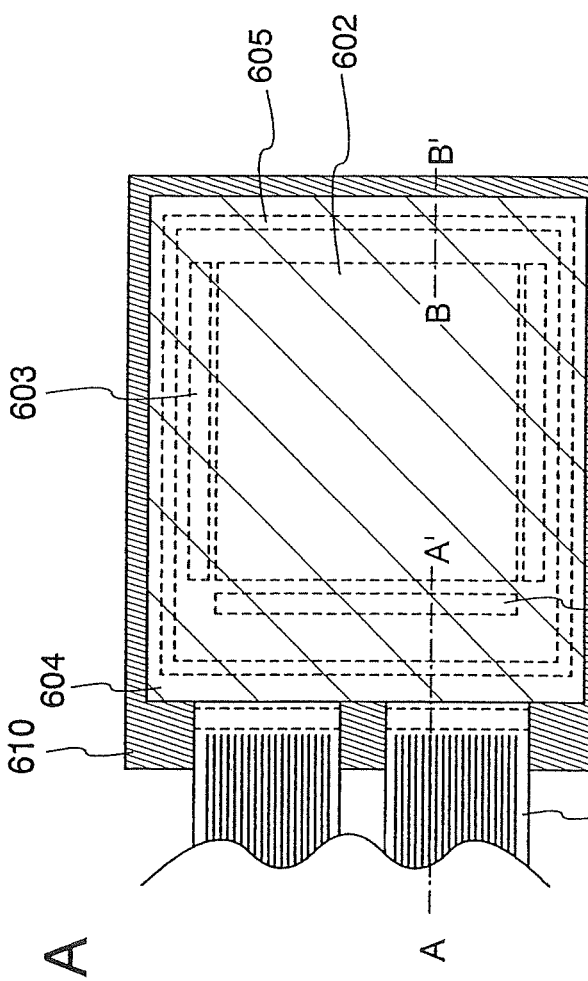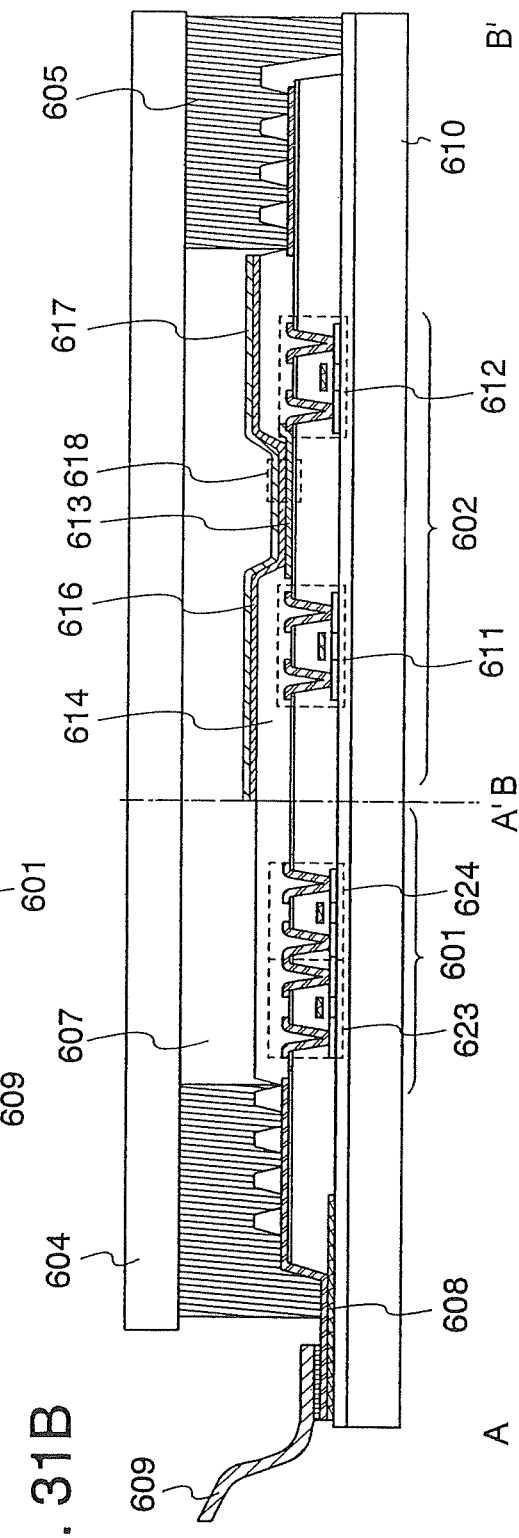
FIG. 31A
FIG. 31B

LIGHT-EMITTING DEVICE USING ORGANOMETALLIC COMPLEX HAVING A PYRAZINE SKELETON

This application is a continuation of copending application Ser. No. 11/986,949 filed on Nov. 27, 2007 which is incorporated herein by reference.

TECHNICAL FIELD

The present invention relates to light-emitting elements using a phosphorescent compound. Further, the present invention relates to light-emitting devices using the light-emitting element. Moreover, the present invention relates to electronic devices using the light-emitting device.

BACKGROUND ART

In recent years, a light-emitting element using a light-emitting organic compound or inorganic compound as a light-emitting substance has been actively developed. In particular, a light-emitting element called an EL element has a simple structure in which a light-emitting layer containing a light-emitting substance is provided between electrodes. Therefore, the light-emitting element has attracted attention as a next-generation flat panel-display element because of its characteristics such as a thin shape, lightweight, high response speed, and direct current driving at low voltage. In addition, a display using such a light-emitting element has a feature that it is excellent in contrast and image quality, and has a wide viewing angle. Further, since these light-emitting elements are plane light sources, it is considered that these light-emitting elements are applied as light sources such as a backlight of a liquid crystal display and an illumination device.

In a case of using a light-emitting organic compound as a light-emitting substance, the emission mechanism of a light-emitting element is a carrier injection type. Namely, by application of a voltage with a light-emitting layer interposed between electrodes, carriers (holes and electrons) injected from the electrodes are recombined and thus a light-emitting substance is made to be in an exited state. Light is emitted when the excited state returns to the ground state. As the type of the excited state, a singlet excited state (S*) and a triplet excited state (T*) are possible. The statistical generation ratio thereof in a light-emitting element is considered to be S*:T*=1:3.

In general, the ground state of a light-emitting organic compound is a singlet excited state. Therefore, light emission from a singlet excited state (S*) is referred to as fluorescence because it is caused by electron transition between the same multiplicities. On the other hand, light emission from a triplet excited state (T*) is referred to as phosphorescence because it is caused by electron transition between different multiplicities. Here, in a compound emitting fluorescence (hereinafter referred to as a fluorescent compound), in general, phosphorescence is not observed at room temperature, and only fluorescence is observed. Therefore, in a light-emitting element using a fluorescent compound, the theoretical limit of internal quantum efficiency (the ratio of generated photons to injected carriers) is considered to be 25% based on S*:T*=1:3.

On the other hand, when a compound emitting phosphorescence (hereinafter referred to as a phosphorescent compound) is used, internal quantum efficiency can be theoretically 75 to 100%. In other words, luminous efficiency can be three to four times as high as that of a fluorescent compound. From these reasons, in order to achieve a light-emitting element with high efficiency, a light-emitting element using a phosphorescent compound has been proposed (for example, Non Patent Document 1: TSUTSUI et al., HIGH QUANTUM EFFICIENCY IN ORGANIC LIGHT-EMITTING DEVICES WITH IRIDIUM-COMPLEX AS A TRIPLET EMISSIVE CENTER, JPN. J. APPL. PHYS. (JAPANESE JOURNAL OF APPLIED PHYSICS), vol. 38/PART. 2, No. 12B, 15 Dec. 1999, pages L1502-L1504 and Non Patent Document 2: ADACHI et al., HIGH-EFFICIENCY RED ELECTROPHOSPHORESCENCE DEVICES, APPL. PHYS. LETT. (APPLIED PHYSICS LETTERS), vol. 78, No. 11, 12 Mar. 2001, pages 1622-1624. Non Patent Documents 1 and 2 employ an iridium complex using a ligand of 2-phenylpyridine ($Ir(ppy)_3$) and a ligand of 2-(2'-benzo[4,5-a]thienyl)pyridine ($[btp_2Ir(acac)]$) as phosphorescent compounds, respectively.

Further, Patent Document 1 discloses a light-emitting element using a light-emitting layer which contains, as a host material for a phosphorescent dopant, an organic low molecular hole-transporting substance and an organic low molecular electron-transporting substance in order to improve the lifetime and efficiency of the light-emitting element using a phosphorescent compound (Patent Document 1: Japanese Translation of PCT International Application No. 2004-515895).

DISCLOSURE OF INVENTION

Non Patent Document 1 reports a problem of lifetime, that is, a half-life period of luminance is about 170 hours at constant current driving at the initial luminance of 500 $cd/m^2$. In addition, Non Patent Document 1 reports a problem of lifetime, in which BCP is used as a hole-blocking layer, because the stability of BCP is not sufficient.

However, if BCP is removed from the element structure disclosed in Non Patent Document 1, light cannot be emitted efficiently. This is because CBP used in the host material of the light-emitting layer in Non Patent Document 1 has a strong hole-transporting property, holes may reach an electron-transporting layer, if BCP is not used as the hole-blocking layer. In addition, BCP has a function of blocking excitation energy (in this case, triplet excitation energy) generated in the light-emitting layer. Thus, the element structure of Non Patent Document 1 can achieve high efficiency but cannot obtain long lifetime, due to BCP.

On the other hand, Patent Document 1 reports improvement in lifetime of an element and efficiency. However, the performance of a phosphorescent compound cannot be utilized efficiently. Actually, the light-emitting element 1 of Patent Document 1 employs an iridium complex, [$btp_2Ir$(acac)], which is also used in Non Patent Document 2, and the efficiency is about 0.9 cd/A to 2.0 cd/A, which is still lower than the efficiency described in Non Patent Document 2.

For the above reasons, it is difficult to obtain a high efficiency and long lifetime of a phosphorescent compound at the same time. Practically, light-emitting elements using phosphorescent compounds secure lifetime at efficiency's expense somewhat.

In view of the above, it is an object of the present invention to provide light-emitting elements having high efficiency and long lifetime. It is another object of the present invention to provide light-emitting devices with long lifetime which consumes less power by forming the light-emitting devices using the light-emitting elements. Further, it is still another object of the present invention to provide electronic devices with long lifetime, which consumes less power by applying such light-emitting devices to the electronic devices.

The present inventors have studied diligently and thus found that the above problem can be solved by devising a structure of a light-emitting layer including a light-emitting substance, in a light-emitting element using, as a light-emitting substance, a certain kind of organometallic complex having a strong electron-trapping property. Specifically, in a light-emitting element using, as a light-emitting substance, an organometallic complex having a ligand of a pyrazine derivative, a compound having a hole-transporting property and a compound having an electron-transporting property can both be included in the light-emitting layer. This solution is found by the present inventors.

An aspect of the present invention is a light-emitting element comprising a light-emitting layer between a first electrode and a second electrode, the light-emitting layer including a first organic compound having a hole-transporting property, a second organic compound having an electron transporting property, and an organometallic complex. In the light-emitting element, a ligand of the organometallic complex is a ligand having a pyrazine skeleton, and a central metal of the organometallic complex is an element belonging to Group 9 or an element belonging to Group 10.

Another aspect of the present invention is a light-emitting element comprising a light-emitting layer between a first electrode and a second electrode, the light-emitting layer including a first organic compound having a hole-transporting property, a second organic compound having an electron transporting property, and an organometallic complex. In the light-emitting element, a ligand of the organometallic complex is a 2-arylpyrazine derivative, and a central metal of the organometallic complex is an element belonging to Group 9 or an element belonging to Group 10.

As the above 2-arylpyrazine derivative, a 2-phenylpyrazine derivative is preferable. Thus, another aspect of the present invention is a light-emitting element comprising a light-emitting layer between a first electrode and a second electrode, in which the light-emitting layer includes a first organic compound having a hole-transporting property, a second organic compound having an electron transporting property, and an organometallic complex. In the light-emitting element, a ligand of the organometallic complex is a 2-phenylpyrazine derivative, and a central metal of the organometallic complex is an element belonging to Group 9 or an element belonging to Group 10.

As the above 2-arylpyrazine derivative, in particular, a 2,5-diphenylpyrazine derivative is preferable. Thus, another aspect of the present invention is a light-emitting element comprising a light-emitting layer between a first electrode and a second electrode, in which the light-emitting layer includes a first organic compound having a hole-transporting property, a second organic compound having an electron transporting property, and an organometallic complex. In the light-emitting element, a ligand of the organometallic complex is a 2,5-diphenylpyrazine derivative, and a central metal of the organometallic complex is an element belonging to Group 9 or an element belonging to Group 10.

Note that in the above structures, the central metal is iridium or platinum in terms of emission efficiency. In particular, iridium is preferable since iridium can provide extremely high efficiency.

Specifically, the organometallic complex using a ligand having a pyrazine skeleton is an organometallic complex having a structure represented by the following general formula (G1). Thus, another aspect of the present invention is a light-emitting element comprising a light-emitting layer between a first electrode and a second electrode, in which the light-emitting layer includes a first organic compound having a hole-transporting property, a second organic compound having an electron transporting property, and an organometallic complex, and the organometallic complex has a structure represented by a general formula (G1).

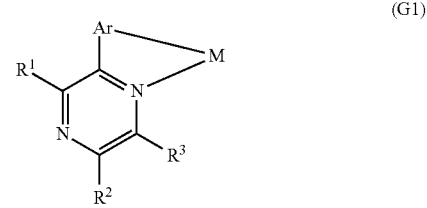

(G1)

In the formula, $A_r$ represents an arylene group. $R^1$ represents either an alkyl group or an aryl group. $R^2$ represents hydrogen, an alkyl group or an aryl group. $R^3$ represents either hydrogen or an alkyl group. $R^2$ and $R^3$ may be bound to each other to form an alicycle. M is a central metal, and represents either an element belonging to Group 9 or an element belonging to Group 10.

As the organometallic complex having a structure represented by the general formula (G1), an organometallic complex represented by the general formula (G2) is preferable. Thus, another aspect of the present invention is a light-emitting element comprising a light-emitting layer between a first electrode and a second electrode, in which the light-emitting layer includes a first organic compound having a hole-transporting property, a second organic compound having an electron transporting property, and an organometallic complex, and the organometallic complex has a structure represented by a general formula (G2).

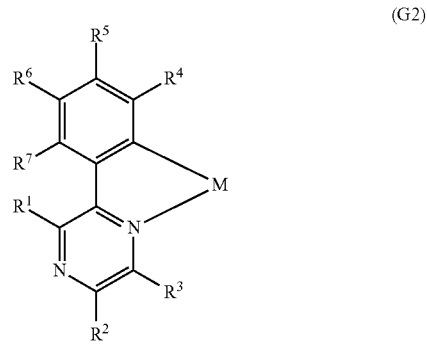

(G2)

In the formula, $R^1$ represents either an alkyl group or a phenyl group. $R^2$ represents hydrogen, an alkyl group or a phenyl group. $R^3$ represents either hydrogen or an alkyl group. $R^2$ and $R^3$ may be bound to each other to form an alicycle. $R^4$ to $R^7$ represent any of hydrogen, an alkyl group, a halogen group, a haloalkyl group, an alkoxy group, and an alkoxycarbonyl group. M is a central metal, and represents either an element belonging to Group 9 or an element belonging to Group 10.

As the organometallic complex having a structure represented by the general formula (G1), an organometallic complex represented by the general formula (G3) is preferable in particular. Thus, another aspect of the present invention is a light-emitting element comprising a light-emitting layer between a first electrode and a second electrode, in which the light-emitting layer includes a first organic compound having a hole-transporting property, a second organic compound having an electron transporting property, and an organometallic complex, and the organometallic complex has a structure represented by a general formula (G3).

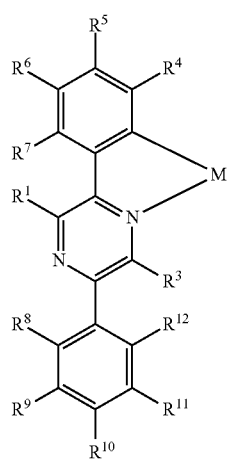

(G3)

In the formula, $R^1$ represents either an alkyl group or a phenyl group. $R^3$ represents either hydrogen or an alkyl group. $R^4$ to $R^{12}$ represent any of hydrogen, an alkyl group, a halogen group, a haloalkyl group, an alkoxy group, and an alkoxycarbonyl group. M is a central metal, and represents either an element belonging to Group 9 or an element belonging to Group 10.

More specifically, the organometallic complex having a structure represented by the general formula (G1) is an organometallic complex represented by the general formula (G4). Thus, another aspect of the present invention is a light-emitting element comprising a light-emitting layer between a first electrode and a second electrode, in which the light-emitting layer includes a first organic compound having a hole-transporting property, a second organic compound having an electron transporting property, and an organometallic complex, and the organometallic complex has a structure represented by a general formula (G4).

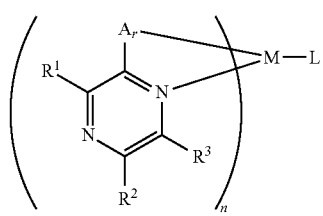

(G4)

In the formula, $A_r$ represents an arylene group. $R^1$ represents either an alkyl group or an aryl group. $R^2$ represents hydrogen, an alkyl group or an aryl group. $R^3$ represents either hydrogen or an alkyl group. $R^2$ and $R^3$ may be bound to each other to form an alicycle. In addition, M is a central metal, and represents either an element belonging to Group 9 or an element belonging to Group 10. In addition, L is a monoanionic ligand. When the M is an element belonging to Group 9, n is 2 (n=2) and when the M is an element belonging to Group 10, n is 1 (n=1).

More specifically, the organometallic complex having a structure represented by the general formula (G2) is an organometallic complex represented by the general formula (G5). Thus, another aspect of the present invention is a light-emitting element comprising a light-emitting layer between a first electrode and a second electrode, in which the light-emitting layer includes a first organic compound having a hole-transporting property, a second organic compound having an electron transporting property, and an organometallic complex, and the organometallic complex has a structure represented by a general formula (G5).

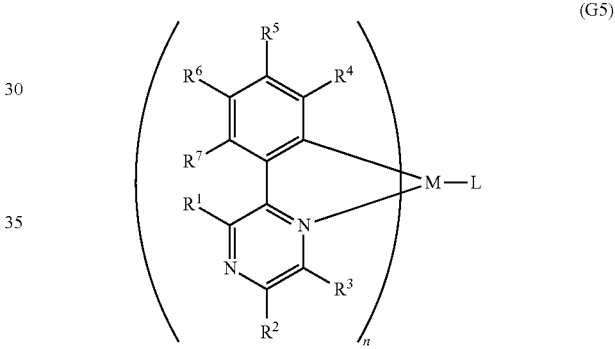

(G5)

In the formula, $R^1$ represents either an alkyl group or a phenyl group. $R^2$ represents hydrogen, an alkyl group or a phenyl group. $R^3$ represents either hydrogen or an alkyl group. $R^2$ and $R^3$ may be bound to each other to form an alicycle. $R^4$ to $R^7$ represent any of hydrogen, an alkyl group, a halogen group, a haloalkyl group, an alkoxy group, and an alkoxycarbonyl group. In addition, M is a central metal, and represents either an element belonging to Group 9 or an element belonging to Group 10. L is a monoanionic ligand. In addition, when the M is an element belonging to Group 9, n is 2 (n=2) and when the M is an element belonging to Group 10, n is 1 (n=1).

More specifically, the organometallic complex having a structure represented by the general formula (G3) is an organometallic complex represented by the general formula (G6). Thus, another aspect of the present invention is a light-emitting element comprising a light-emitting layer between a first electrode and a second electrode, in which the light-emitting layer includes a first organic compound having a hole-transporting property, a second organic compound having an electron transporting property, and an organometallic complex, and the organometallic complex has a structure represented by a general formula (G6).

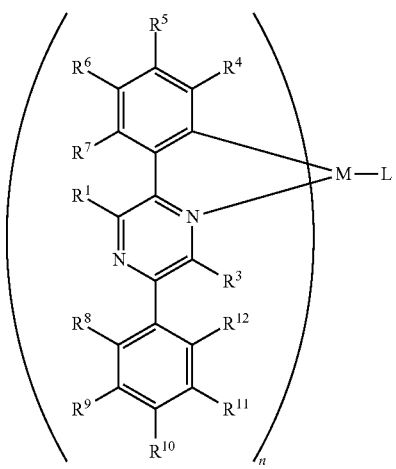

(G6)

In the formula, $R^1$ represents either an alkyl group or a phenyl group. $R^3$ represents either hydrogen or an alkyl group. $R^4$ to $R^{12}$ represent any of hydrogen, an alkyl group, a halogen group, a haloalkyl group, an alkoxy group, and an alkoxycarbonyl group. In addition, M is a central metal, and represents either an element belonging to Group 9 or an element belonging to Group 10. L is a monoanionic ligand. When the M is an element belonging to Group 9, n is 2 (n=2) and when the M is an element belonging to Group 10, n is 1 (n=1).

In addition, in the above general formulae (G1) to (G6), the M is preferably iridium or platinum in terms of emission efficiency. In particular, iridium is preferable since iridium can provide extremely high efficiency.

In the above light-emitting elements, the first organic compound is preferably an aromatic amine compound or a carbazole derivative. The second organic compound is preferably a heteroaromatic compound or a metal complex. More preferably, the first organic compound is an aromatic amine compound or a carbazole derivative and the second organic compound is a heteroaromatic compound or a metal complex.

In the above light-emitting elements, an amount of the first organic compound and/or an amount of the second organic compound is/are preferably larger than that of the organometallic complex. In other words, the first organic compound and/or the second organic compound preferably function as a host of the organometallic complex. More preferably, an amount of the organometallic complex in the light-emitting layer is greater than or equal to 1 percent by mass and less than or equal to 10 percent by mass.

In the above light-emitting elements, the ratio between the first organic compound and the second organic compound is also important. Therefore, in the light-emitting elements of the present invention, a mass ratio of the second organic compound to the first organic compound is preferably greater than or equal to 1/20 to less than or equal to 20. In particular, a mass ratio of the second organic compound to the first organic compound is preferably greater than or equal to 1 to less than or equal to 20.

The above structures of the present invention are made in view of a strong electron-trapping property of the organometallic complexes. Thus, in the above light-emitting elements of the present invention, a LUMO level of the organometallic complex is deeper than a LUMO level of the first organic compound and a LUMO level of the second organic compound by 0.2 eV or more.

A light-emitting element obtained in this manner of the present invention has a feature that emission efficiency is high and lifetime is long, and thus a light-emitting device (such as an image display device or a light-emitting device) using the light-emitting element can achieve low power consumption and long lifetime. Therefore, the present invention includes light-emitting devices using light-emitting elements of the present invention. Furthermore, the present invention includes electronic devices having the light-emitting devices.

It is to be noted that the light-emitting device in this specification includes image display devices and illumination devices using a light-emitting element. Further, the light-emitting device includes various types of modules e.g., a module in which a connector such as an FPC (Flexible Printed Circuit), a TAB (Tape Automated Bonding) tape, or a TCP (Tape Carrier Package) is attached to a light-emitting element, a module in which a print wiring board is provided at an end of a TAB tape or an TCP, and a module in which an IC (Integrated Circuit) is directly mounted on a light-emitting device by a COG (Chip On Glass) method.

According to the present invention, light-emitting elements having high emission efficiency can be provided. In particular, light-emitting elements having high emission efficiency and long lifetime can be provided.

When light-emitting devices are formed using the light-emitting elements described above, the light-emitting devices can consume less power and have long lifetime. Further, since such light-emitting devices are applied to electronic devices, the electronic devices can have long lifetime, which consumes less power.

BRIEF DESCRIPTION OF DRAWINGS

In the accompanying drawings:

FIGS. 31A and 31B illustrate a light-emitting device using a light-emitting element according to an aspect of the present invention;

BEST MODE FOR CARRYING OUT THE INVENTION

Figure 1:
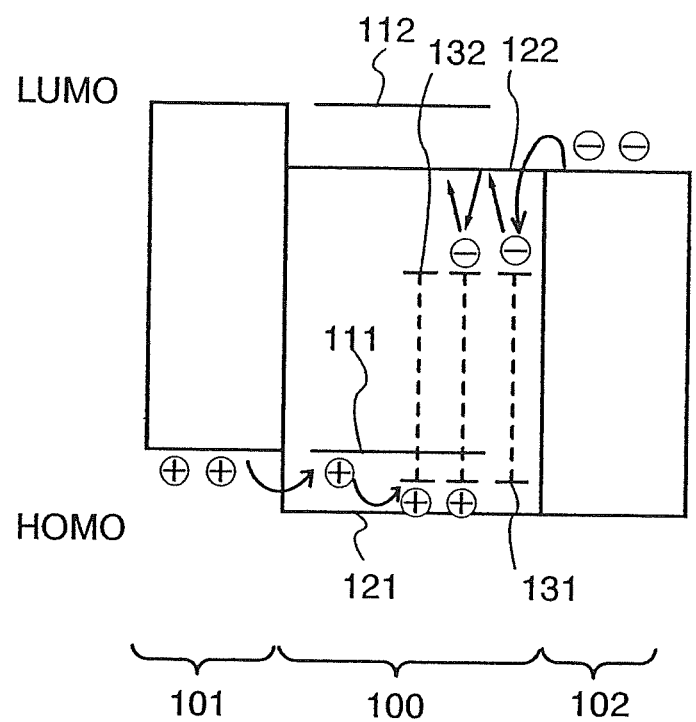
FIG. 1 is a band diagram of a light-emitting element according to an aspect of the present invention.

Embodiment modes of the present invention will now be described with reference to the drawings in detail. However, the present invention is not limited to the following description and it is easily understood by those skilled in the art that the mode and details can be variously changed without departing from the scope and spirit of the present invention. Therefore, the present invention is not construed as being limited to the description of the embodiment modes shown below.

Embodiment Mode 1

Embodiment Mode 1 will describe a concept of a light-emitting element of the present invention. Note that in this specification, "the HOMO level or the LUMO level is deep" means that the energy level is low, and "the HOMO level or the LUMO level is shallow" means that the energy level is high. For example, a substance A having a LUMO level of −2.54 eV has the LUMO level which is deeper by 0.26 eV than a substance having a LUMO level of −2.28 eV, and the LUMO level which is shallower by 0.31 eV than a substance C having a LUMO level of −2.85 eV.

Recently, the present inventors have focused on phosphorescent compounds for the sake of high performance of light-emitting elements and examined a wide variety of phosphorescent organometallic complexes. As one result thereof, the present inventors have found that an organometallic complex which has a ligand of a pyrazine skeleton and whose central metal belongs to Group 9 or 10 (hereinafter, referred to a pyrazine-based organometallic complex) emits phosphorescence with much higher efficiency as compared to known phosphorescent organometallic complexes.

The property evaluation made by the present inventors found that, as compared with a general host material (a material used to disperse a light-emitting substance in a light-emitting layer), the pyrazine-based organometallic complex has a relatively deep LUMO level (i.e., it has relatively high level of an electron-trapping property). On the other hand, a conventional organometallic complex having a pyridine derivative as a ligand (hereinafter, a pyridine-based organometallic complex), such as $Ir(ppy)_3$ or $[btp_2Ir(acac)]$, has a high hole trapping property because it has a shallow HOMO level, but is difficult to trap electrons. In other words, it is found that pyrazine-based organometallic complexes and pyridine-based organometallic complexes have opposite properties in terms of affinity to holes and electrons. Note that this point will be described in Example 1.

The present inventors have found out that the electron-trapping property of the pyrazine-based organometallic complexes causes disadvantages as well as advantages in manufacturing light-emitting elements, from a large number of experiment results.

One of the advantages is that, as compared with conventional pyridine-based organometallic complexes, pyrazine-based organometallic complexes have hole accepting properties as well as electron accepting properties. In other words, when a pyrazine-based organometallic complex is dispersed in a host material of a light-emitting layer, carriers are easily recombined directly in the pyrazine-based organometallic complex. Therefore, it is not so necessary to pay attention to the efficiency of energy transfer from the host material, and thus high efficiency emission can be achieved.

However, in terms of the carrier balance in the light-emitting layer, it is extremely difficult to select a host material suitable for the pyrazine-based organometallic complex, which is a disadvantage. This problem is described with reference to FIGS. 2A and 2B.

Figure 2A:
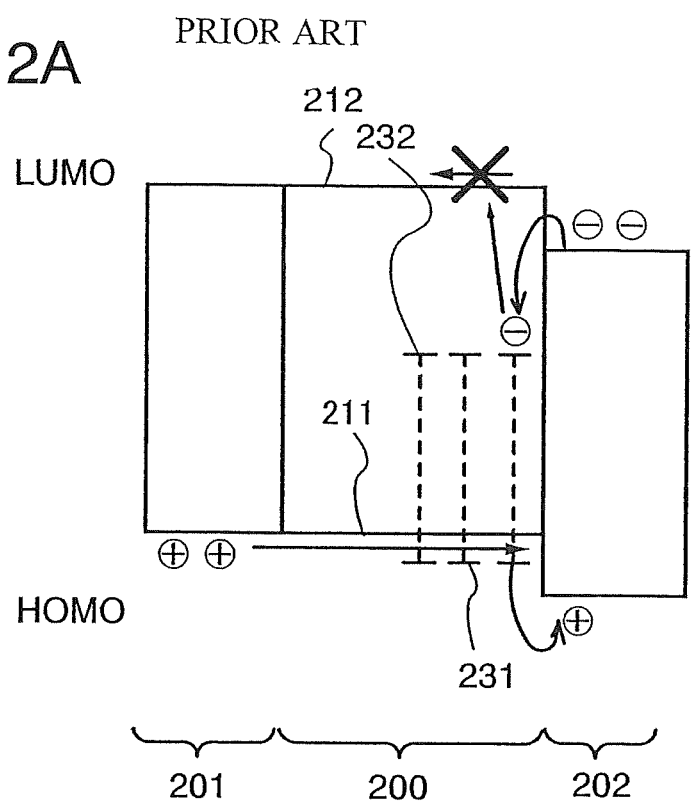
FIGS. 2A and 2B are band diagrams of conventional light-emitting elements.
Figure 2B:
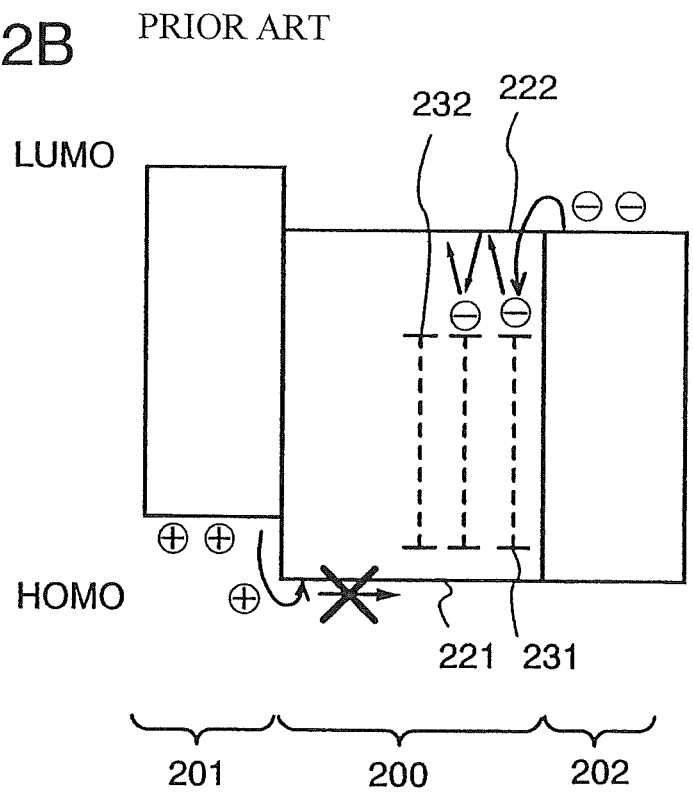

FIGS. 2A and 2B are each a band diagram in the case where a light-emitting layer 200 in which a pyrazine-based organometallic complex is dispersed in a host material is sandwiched by a hole-transporting layer 201 and an electron-transporting layer 202. FIG. 2A is a band diagram in the case where a first organic compound having a hole-transporting property is used as the host material and FIG. 2B is a band diagram in the case where a second organic compound having an electron-transporting property is used as the host material.

In FIG. 2A, electrons are trapped by a LUMO level 232, since the LUMO level 232 of the pyrazine-based organometallic complex is relatively deep. Even if electrons are injected into a LUMO level 212 of the first organic compound, electrons moves very slowly because the first organic compound has a hole-transporting property. On the other hand, holes are transported through the HOMO level 211 of the first organic compound and to the vicinity of the interface with the electron-transporting layer 202, since the first organic compound has a hole-transporting property, and a HOMO level 231 of the pyrazine-based organometallic complex does not hinder holes (i.e., does not form a deep trap). In other words, a light-emitting region is limited to an extremely narrow area which is an interface between the light-emitting layer 200 and the electron-transporting layer 202.

If the electron-transporting layer 202 has a low hole blocking property, holes may reach the electron-transporting layer 202 depending on combination of materials as illustrated in FIG. 2A. Thus, the electron-transporting layer 202 emits light, thereby drastically reducing the emission efficiency of the light-emitting element. Needless to say, the present inventors have confirmed that the problem is solved when a highly hole-blocking substance is used for the electron-transporting layer 202, and high emission efficiency can be achieved; however, the lifetime is adversely affected, as described above. Further, there is a concern about reduction in efficiency on the high luminance side due to the triplet-triplet extinction.

Next, in FIG. 2B, since the pyrazine-based organometallic complex has a relatively deep LUMO level 232, electrons are trapped by the LUMO level 232. Since the second organic compound has an electron-transporting property, some electrons are trapped, but some electrons are transported through a LUMO level 222 of the second organic compound and to the hole-transporting layer 201 little by little. Note that the mobility is lower than the original electron mobility of the second organic compound. On the other hand, since the second organic compound has an electron-transporting property, the HOMO level 221 is relatively deep and holes are difficult to be injected. Even if holes are injected, the mobility of the holes is extremely low, since the first organic compound has an electron-transporting property. There may be a case where holes are injected in the HOMO level 231 of the pyrazine-based organometallic complex, but the transporting ability is small. In other words, in the structure of FIG. 2B, the light-emitting layer 200 has normally an electron-transporting property; however, electrons are difficult to move due to the trapping. On the other hand, holes are accumulated at the interface between the hole-transporting layer 201 and the light-emitting layer 200.

In this case, the hole density is extremely high at the interface between the light-emitting layer 200 and the hole-transporting layer 201 but is extremely low in the other regions. On the other hand, electrons spread across the whole region of the light-emitting layer 200 due to the trapping, but the electron density is low as a whole. In other words, the hole distribution and the electron distribution are different from each other in terms of the density and the distribution profile. Therefore, it becomes difficult to recombine holes and electrons in a balanced manner and achieve the high emission efficiency. In addition, this imbalance causes an adverse affect on the lifetime.

In view of the above problems, the present inventors have thought that the following points are important. In other words, the first point is that a certain large amount of holes are allowed to be injected into the light-emitting layer 200 in the structure of FIG. 2B. The second point is that holes injected into the light-emitting layer 200 move toward the electron-transporting layer 202 little by little, so that the balance with electrons which move slowly can be obtained in the structure of FIG. 2B. The structure to fulfill these two points is a structure of the present invention, which is typified by a band diagram as illustrated in FIG. 1.

A light-emitting layer 100 in FIG. 1 includes a first organic compound having a hole-transporting property, a second organic compound having an electron-transporting property and a pyrazine-based organometallic complex. Since a LUMO level 132 of the pyrazine-based organometallic complex is lower than a LUMO level 112 of the first organic compound and a LUMO level 122 of the second organic compound, electrons are trapped by the LUMO level 132 of the pyrazine-based organometallic complex. Note that some electrons move toward a hole-transporting layer 101 side little by little without being trapped whereas some electrons are trapped by the LUMO level 132 of the pyrazine-based organometallic complex since the second organic compound has an electron-transporting property. On the other hand, since the first organic compound has a hole-transporting property and also a hole accepting property, holes are injected into the HOMO level 111 of the first organic compound first. Holes are difficult to be injected to the HOMO level 121 of the second organic compound. In this case, the amount of the first organic compound is adjusted to control the mobility of the injected holes, so that it can be balanced with the mobility of electrons coming from the electron-transporting layer 102. In other words, in the light-emitting layer 100, the balance between holes and electrons can be good. Then, holes are injected into the HOMO level 131 of the pyrazine-based organometallic complex and are recombined with trapped electrons to emit light.

By exercising such an ingenuity, the present inventors have found out that the potential of pyrazine-based organometallic complexes, which is high emission efficiency, can be utilized to the maximum. To our surprise, the present inventors have also found out that the structure illustrated in FIG. 1 of the present invention can achieve several times to dozen of times long lifetime of the structures in FIGS. 2A and 2B. The first organic compound and the second organic compound are used for hosts in FIGS. 2A and 2B respectively. In FIG. 1, two types of organic compounds, the first organic compound and the second organic compound are used for a host. This point is different from FIGS. 2A and 2B. The phenomenon that the lifetime is extremely longer just because of that point cannot be seen in general, and is our surprise.

Patent Document 1 also describes that longer lifetime can be achieved by using a mixed layer for a light-emitting layer, and it is at highest two times improvement. Patent Document 1 cannot obtain as good improvement in lifetime as the present invention. According to Patent Document 1, the charge accumulation which leads to degradation of organic materials seems to be reduced by the mixed layer. However, Patent Document 1 does not appear to refer to the problem of carrier balance caused by the electron-trapping property of pyrazine-based organometallic complexes. In other words, Patent Document 1 uses a different organometallic complex from the present invention. Thus, it is thought that the principle and effect in the case where two types of host materials are used are also different, which leads to the difference in the improvement of lifetime. A phosphorescent compound employed in Patent Document 1 is PtOEP, which is a porphyrin complex, and a pyridine-based organometallic complex [$btp_2Ir(acac)$], and they are both have low electron-trapping properties and high hole trapping properties. In other words, the compounds have properties opposite to pyrazine-based organometallic complexes of the present invention.

The conception and effect of the present invention has been described above with reference the band diagrams. Hereinafter, a more specific structure will be described.

Embodiment Mode 2

Figure 3:
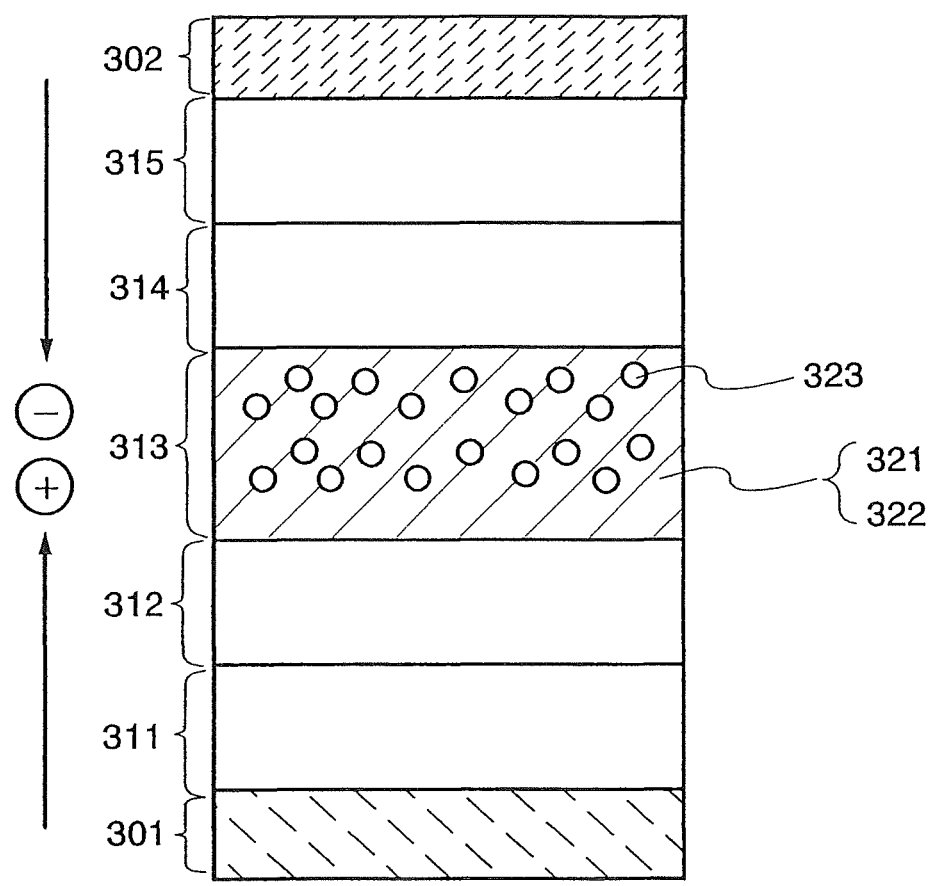
FIG. 3 illustrates an element structure of a light-emitting element according to an aspect of the present invention.

Embodiment Mode 2 will cite specific materials which can be used for a structure of a light-emitting element according to the present invention. FIG. 3 illustrates a structure of a light-emitting element.

FIG. 3 illustrates a light-emitting element of the present invention. The light-emitting element includes a light-emitting layer 313 between a first electrode 301 serving as anode and a second electrode 302 serving as a cathode, and the light-emitting layer 313 includes a first organic compound 321 having a hole-transporting property, a second organic compound 322 having an electron-transporting property and a pyrazine-based organometallic complex 323. A structure of the light-emitting layer 313 is described below.

In the light-emitting layer 313, the first organic compound 321 is a compound having a hole-transporting property. Specifically, an aromatic amine compound such as 4,4'-bis[N-(1-napthyl)-N-phenylamino]biphenyl (abbreviation: NPB), 4,4'-bis[N-(9-phenanthryl)-N-phenylamino]biphenyl (abbreviation: PPB), 4,4'-bis[N-(3-methylphenyl)-N-phenylamino]biphenyl (abbreviation: TPD), 4,4'-bis[N-(9,9-dimethylfluoren-2-yl)-N-phenylamino]biphenyl (abbreviation: DFLDPBi), 4,4',4"-tris(N,N-diphenylamino)triphenylamine (abbreviation: TDATA), 4,4',4"-tris[N-(3-methylphenyl)-N-phenylamino]triphenylamine (abbreviation: m-MTDATA), 4,4',4"-tri(N-carbazolyl)triphenylamine (abbreviation: TCTA), 1,1-bis[4-(diphenylamino)phenyl]cyclohexane (abbreviation: TPAC), 9,9-bis[4-(diphenylamino)phenyl]fluorene (abbreviation: TPAF), 4-(9-carbazolyl)-4'-(5-phenyl-1,3,4-oxadiazol-2-yl)triphenylamine (abbreviation: YGAO11), or N-[4-(9-carbazolyl)phenyl]-N-phenyl-9,9-dimethylfluoren-2-amine (abbreviation: YGAF) can be used. Also, a carbazole derivative such as 4,4'-di(N-carbazolyl)biphenyl (abbreviation: CBP), 1,3-bis(N-carbazolyl)benzene (abbreviation: mCP), or 1,3,5-tris(N-carbazolyl)benzene (abbreviation: TCzB) can be used. Further, a high molecular compound such as poly(4-vinyltriphenylamine) (abbreviation: PVTPA) can also be used as such aromatic amine compound. As a carbazole derivative, a high molecular compound such as poly(N-vinylcarbazole) (abbreviation: PVK) can also be used. The triplet excitation energy of the first organic compound 321 as described above is preferably larger than that of the pyrazine-based organometallic complex 323.

On the other hand, the second organic compound 322 is a compound having an electron-transporting property. Specifically, a heteroaromatic compound such as 9-[4-(5-phenyl-1,3,4-oxadiazol-2-yl)phenyl]carbazole (abbreviation: CO11), 1,3-bis[5-(p-tert-buthylphenyl)-1,3,4-oxadiazol-2-yl]benzene (abbreviation: OXD-7), 2-(4-biphenylyl)-5-(4-tert-butylphenyl)-1,3,4-oxadiazole (abbreviation: PBD), 2,2',2"-(1,3,5-benzenetriyl)tris(1-phenyl-1H-benzimidazole) (abbreviation: TPBI), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 9,9',9"-[1,3,5-triazine-2,4,6-triyl]tricarbazole (abbreviation: TCzTRZ), 2,2',2"-(1,3,5-benzenetriyl)tris(6,7-dimethyl-3-phenylquinoxaline) (abbreviation: TriMeQn), 9,9'-(quinoxaline-2,3-diyldi-4,1-phenylene)di(9H-carbazole) (abbreviation: CzQn), 3,3',6,6'-tetraphenyl-9,9'-(quinoxaline-2,3-diyldi-4,1phenylene)di(9H-carbazole) (abbreviation: DCzPQ), bathophenanthroline (abbreviation: BPhen), or bathocuproine (abbreviation: BCP) can be used. A metal complex such as is bis(2-methyl-8-quinolinolato)(4-phenylphenolato)aluminum(II) (abbreviation: BAlq), tris[2-(2-hydroxyphenyl)-5-phenyl-1,3,4-oxadiazolato]aluminum(II) (abbreviation: Al(OXD)$_3$), tris(2-hydroxyphenyl-1-phenyl-1H-benzimidazolato)aluminum(III) (abbreviation: Al(BIZ)$_3$), bis[2-(2-hydroxyphenyl)benzothiazolato]zinc(II) (abbreviation: Zn(BTZ)$_2$), or bis[2-(2-hydroxyphenyl)benzoxazolato]zinc(II) (abbreviation: Zn(PBO)$_2$) can be used. Further, a high molecular compound such as poly(2,5-pyridine-diyl) (abbreviation: PPy) can also be used as such a heteroaromatic compound. As a metal complex, metal complex high molecular compounds disclosed as in the following reference can also be used (TAO et al., C—H BOND ACTIVATION BY A FERRIC METHOXIDE COMPLEX: MODELING THE RATE-DETERMINING STEP IN THE MECHANISM OF LIPOXYGENASE, APPL. PHYS. LETT. (APPLIED PHYSICS LETTERS, vol. 70, No. 12, 24 Mar. 1997, pages 1503-1505.). Note that the triplet excitation energy of the second organic compound 322 as described above is preferably larger than that of the pyrazine-based organometallic complex 323.

The pyrazine-based organometallic complex 323 is an organometallic complex which has a ligand having a pyrazine skeleton, and whose a central metal is an element belonging to Group 9 (Co, Rh, Ir) or an element belonging to Group 10 (Ni, Pd, Pt). Further, the organometallic complex has a property of emitting phosphorescence. A specific structure of this pyrazine-based organometallic complex will be described in Embodiment Mode 3.

As described above, the first organic compound, the second organic compound and the pyrazine-based organometallic complex are combined suitably to constitute a light-emitting layer of a light-emitting element of the present invention. Note that the light-emitting layer may include another substance.

In the light-emitting layer, preferably, at least one of the first organic compound and the second organic compound serves as a host material and the pyrazine-based organometallic complex serves as a guest material. This is in order to prevent concentration quenching of the pyrazine-based organometallic complex. Also, this is in order that the carrier balance in the light-emitting layer can be adjusted by the first organic compound and the second organic compound.

Therefore, in the light-emitting element of the present invention, preferably, the amount of the first organic compound and/or the second organic compound is larger than that of the pyrazine-based organometallic complex. Specifically, its volume fraction or its mass fraction is preferably high. In addition, in terms of prevention of concentration quenching, the ratio of the pyrazine-based organometallic complex to the light-emitting layer is preferably 1 mass % to 10 mass %, inclusive.

In the light-emitting layer, the mass ratio of the first organic compound to the second organic compound is preferably in the range of 1:20 to 20:1. In other words, the mass ratio of the second organic compound to the first organic compound is preferably 1/20 to 20, inclusive. The light-emitting element having the first and second compounds whose mass ratio are not within the range can be substantially the same as the state of FIG. 2A or 2B described above, if.

The present inventors have found that the structure of the light-emitting layer in which the amount of the second organic compound having an electron-transporting property is equal to or higher than that of the first organic compound having a hole-transporting property is extremely effective. This appears to be caused from that the hole mobility is higher than the electron mobility in general organic compounds. Accordingly, in the present invention, the mass ratio of the second organic compound to the first organic compound is more preferably 1 to 20, inclusive. The range which is extremely effective for obtaining long lifetime is 5 to 20, inclusive, in particular.

The electron-trapping property of the pyrazine-based organometallic complex used in the present invention is often deeper than the LUMO level of the first organic compound and the LUMO level of the second organic compound by 0.2 eV or more, specifically. In such a case, the lifetime improvement and the efficiency improvement are significant, and thus one feature of the present invention is that the LUMO level of the pyrazine-based organometallic complex is deeper than the LUMO level of the first organic compound and the LUMO level of the second organic compound by 0.2 eV or more.

Next, layers other than the light-emitting layer 313 are described. A hole-transporting layer 312 and a hole-injecting layer 311 are not necessarily provided, and they may be provided as necessary. Specific materials for forming these layers are preferably hole-transporting compounds, and NPB, PPB, TPD, DFLDPBi, TDATA, m-MTDATA, TCTA, TPAC, TPAF, YGAO11, YGAF, CBP, mCP, TCzB, PVTPA, PVK or the like as described above can be used. An anthracene derivative having a low triplet excitation energy such as 9,10-bis[4-(diphenylamino)phenyl]anthracene (abbreviation: TPA2A) or 2-tert-butyl-9,10-di(2-naphthyl)anthracene (abbreviation: t-BuDNA) can also be used. The present invention is also characterized that an anthracene derivative having a low triplet excitation energy is applied to the hole-transporting layer 312 and the hole-injecting layer 311.

This feature can be explained as below. The light-emitting layer 313 of the present invention has a good carrier balance as described in Embodiment Mode 1, and a light-emitting region does not exist close to the interface between the light-emitting layer 313 and the hole-transporting layer 312. Therefore, if a substance having a lower triplet excitation energy than the pyrazine-based organometallic complex 323 is applied to the hole-transporting layer 312, the substance is difficult to serve as a quencher to the pyrazine-based organometallic complex 323.

The hole-transporting layer 312 or the hole-injecting layer 311 may be formed by mixing the above hole-transporting compound and an electron acceptor. As the electron acceptor, in addition to an organic compound such as chloranil or 7,7,8,8-tetracyano-2,3,5,6-tetrafluoroquinodimethane (abbreviation: $F_4$-TCNQ), transition metal oxide such as molybdenum oxide, vanadium oxide, or rhenium oxide can be used. In particular, as the hole-injecting layer 311, an organic compound such as copper phthalocyanine, vanadyl phthalocyanine, or fluorocarbon, or an inorganic compound such as molybdenum oxide, ruthenium oxide, or aluminum oxide can also be used. The hole-injecting layer 311 may have a multilayer structure formed by stacking two or more layers. Further, the hole-injecting layer 311 and the hole-transporting layer 312 may be formed by mixing two or more kinds of substances.

The electron-transporting layer 314 and the electron-injecting layer 315 are not necessarily required, and may be provided as necessary. As a specific material which forms these layers, an electron-transporting compound is preferable. The above-described CO11, OXD-7, PBD, TPBI, TAZ, p-EtTAZ, TCzTRZ, TriMeQn, CzQn, DCzPQ, BPhen, BCP, BAlq, Al(OXD)$_3$, Al(BIZ)$_3$, Zn(BTZ)$_2$, Zn (PBO)$_2$, PPy, or the like can be used. A substance having a low triplet excitation energy such as tris(8-quinolinolato)aluminum(I) (abbreviation Alq$_3$), tris(4-methyl-8-quinolinolato)aluminum(III) (abbreviation: Almq$_3$), or bis(10-hydroxybenzo[h]quinolinato)beryllium(II) (abbreviation: BeBq$_2$) can be used (for example, it is reported that the phosphorescence spectrum of Alq$_3$ is about 650 to 700 nm of deep red). The present invention is also characterized that a substance having a low triplet excitation energy is applied as the electron-transporting layer 314 and the electron-injecting layer 315.

This feature can be explained as below. The light-emitting layer 313 of the present invention has a good carrier balance as described in Embodiment Mode 1, and a light-emitting region does not exist close to the interface between the light-emitting layer 313 and the electron-transporting layer 314. Therefore, even if a substance having a lower triplet excitation energy than the pyrazine-based organometallic complex 323 is applied to the electron-transporting layer 314, the substance is difficult to serve as a quencher to the pyrazine-based organometallic complex 323.

The electron-transporting layer 314 and the electron-injecting layer 315 may be formed by mixing the above-described electron-transporting compounds and an electron donor. As the electron donor, in addition to an organic compound such as tetrathiafulvalene, alkali metal such as lithium or cesium, alkaline earth metal such as magnesium or calcium, rare-earth metal such as erbium or ytterbium, or an oxide of these metals can be used. In particular, as the electron-injecting layer 315, an alkali metal compound, an alkaline earth metal compound, or a rare-earth metal compound, such as lithium oxide, lithium fluoride, calcium fluoride, erbium fluoride, can be used alone. The electron-injecting layer 315 may have a multilayer structure formed by stacking two or more layers. Further, the electron-transporting layer 314 and the electron-injecting layer 315 may be formed by mixing two or more kinds of substances.

Although the first electrode 301 is not limited in particular, as described in Embodiment Mode 2, the first electrode 301 is preferably formed using a substance with high work function when the first electrode 301 serves as an anode. Specifically, in addition to indium tin oxide (ITO), indium tin oxide containing silicon oxide (ITSO), or indium oxide containing 2 to 20 wt % zinc oxide (IZO), gold (An), platinum (Pt), nickel (Ni), tungsten (W), chromium (Cr), molybdenum (Mo), iron (Fe), cobalt (Co), copper (Cu), palladium (Pd), or the like can be used. The first electrode 301 can be formed by, for example, a sputtering method, an evaporation method, or the like.

Although the second electrode 302 is not limited in particular, as described in Embodiment Mode 2, the second electrode 302 is preferably formed using a substance with low work function when the second electrode 302 serves as a cathode. Specifically, in addition to aluminum (Al) or indium (In), alkali metal such as lithium (Li) or cesium (Cs), alkaline earth metal such as magnesium (Mg) or calcium (Ca), or rare-earth metal such as erbium (Er) or ytterbium (Yb) can be used. In addition, alloy such as aluminum-lithium alloy (AlLi) or magnesium-silver alloy (MgAg) can also be used. In addition, when the electron-transporting compound and an electron donor are combined to form the electron-injecting layer 315, a highly light-transmitting substance having a high work function can be used. The second electrode 302 can be formed by, for example, a sputtering method, an evaporation method, or the like.

In order to extract generated light to the outside, it is preferable that one or both of the first electrode 301 and the second electrode 302 be an electrode formed of a highly light-transmitting substance, such as ITO, ITSO, or IZO. Alternatively, one or both of the first electrode 301 and the second electrode 302 is preferably an electrode formed to have a thickness of several to several tens of nanometers so that visible light can be transmitted.

In the light-emitting element of the present invention described above, each of the hole-injecting layer 311, the hole-transporting layer 312, the light-emitting layer 313, the electron-transporting layer 314, and the electron-injecting layer 315 may be formed by any method such as an evaporation method, an ink-jet method, or a coating method. The first electrode 301 or the second electrode 302 may also be formed by any method such as a sputtering method, an evaporation method, an ink-jet method, or a coating method.

The above-described light-emitting element of the present invention may be applied to a tandem type light-emitting element (also referred to as a multiphoton element).

Embodiment Mode 3

Embodiment Mode 3 will specifically describe a structure of a pyrazine-based organometallic complex which can be used for a light-emitting element of the present invention.

The pyrazine-based organometallic complex is an organometallic complex which has a ligand having a pyrazine skeleton, and whose a central metal is an element belonging to Group 9 (Co, Rh, Ir) or an element belonging to Group 10 (Ni, Pd, Pt). Further, the organometallic complex may have a property of emitting phosphorescence.

Many of organometallic complexes belonging to Group 9 or 10 exhibit MLCT (Metal to Ligand Charge Transfer) transition. In particular, the triplet MLCT transition is often observed in phosphorescent compounds. The LUMO level of the organometallic complex exhibiting MLCT transition is determined by the rank of the LUMO level of a ligand. Thus, if a ligand having a high LUMO level is used, the LUMO level of the organometallic complex is also high, and if a ligand having a low LUMO level, the LUMO level of the organometallic complex is also low. Pyrazine has a LUMO level lower than pyridine, and thus, a pyrazine-based organometallic complex of the present invention exhibits a LUMO level lower (i.e., a higher electron-trapping property) than a conventional pyridine-based organometallic complex.

A ligand of the pyrazine-based organometallic complex used in the present invention may have a pyrazine skeleton. In particular, when the ligand is a 2-arylpyrazine derivative, the ligand can be cyclometalated to the central metal. The cyclometalated complex can realize a high phosphorescence quantum yield. Therefore, the ligand is preferably a 2-arylpyrazine derivative.

As an organometallic complex whose 2-arylpyrazine derivative is cyclometalated, an organometallic complex typified by the following general formula (G1) is given.

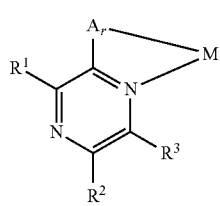

(G1)

In the formula, $A_r$ represents an arylene group. $R^1$ represents either an alkyl group or an aryl group. $R^2$ represents hydrogen, an alkyl group or an aryl group. $R^3$ represents either hydrogen or an alkyl group. In addition, $R^2$ and $R^3$ may be bound to each other to form an alicycle. In addition, M is a central metal, and represents either an element belonging to Group 9 or an element belonging to Group 10.

Further, when a 2-phenylpyrazine derivative which is a kind of 2-arylpyrazine derivatives is a ligand, the ligand can be ortho-metalated to the central metal (ortho-metalation is a kind of cyclometalation). The present inventors have found that such an ortho-metal complex in which 2-phenylpyrazine is ortho-metalated can realize particularly high phosphorescence quantum yield. Therefore, a preferred mode of the ligand is a 2-phenylpyrazine derivative.

As an organometallic complex in which a 2-phenylpyrazine derivative is ortho-metalated, an organometallic complex having a structure represented by the following general formula (G2) is given.

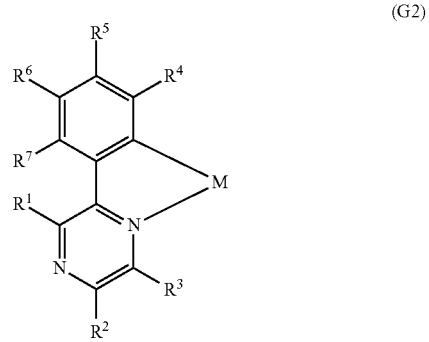

(G2)

In the formula, $R^1$ represents either an alkyl group or an aryl group. $R^2$ represents hydrogen, an alkyl group or a phenyl group. $R^3$ represents either hydrogen or an alkyl group. In addition, $R^2$ and $R^3$ may be bound to each other to form an alicycle. $R^4$ to $R^7$ represent any of hydrogen, an alkyl group, a halogen group, a haloalkyl group, an alkoxy group, and an alkoxycarbonyl group. In addition, M is a central metal, and represents either an element belonging to Group 9 or an element belonging to Group 10.

Among organometallic complexes in which a 2-phenylpyrazine derivative is ortho-metalated, an organometallic complex in which a 2,5-diphenylpyrazine derivative is ortho-metalated has a still deeper LUMO level. Therefore, when a ligand is a 2,5-diphenylpyrazine derivative, the effect of a light-emitting element of the present invention is remarkable, which is preferable.

As an organometallic complex in which a 2,5-diphenylpyrazine derivative is ortho-metalated, an organometallic complex having the following general formula (G3) is given.

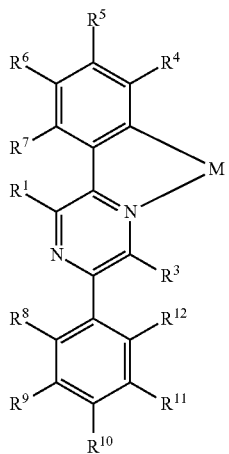

(G3)

In the formula, $R^1$ represents either an alkyl group or a phenyl group. $R^3$ represents either hydrogen or an alkyl group. $R^4$ to $R^{12}$ represent any of hydrogen, an alkyl group, a halogen group, a haloalkyl group, an alkoxy group, and an alkoxycarbonyl group. In addition, M is a central metal, and represents either an element belonging to Group 9 or an element belonging to Group 10.

Specifically, the organometallic complexes having structures represented by the general formulae (G1) to (G3) are preferably mixed ligand organometallic complexes having a ligand L represented by the general formulae (G4) to (G6) other than the pyrazine derivative. This is because such complexes are easy to be synthesized.

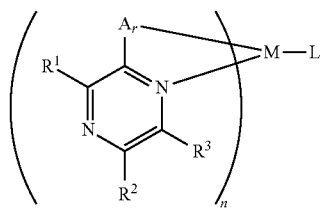

(G4)

In the formula, $A_r$ represents an arylene group. $R^1$ represents either an alkyl group or an aryl group. $R^2$ represents hydrogen, an alkyl group or an aryl group. $R^3$ represents either hydrogen or an alkyl group. In addition, $R^2$ and $R^3$ may be bound to each other to form an alicycle. In addition, M is a central metal, and represents either an element belonging to Group 9 or an element belonging to Group 10. L is a monoanionic ligand. When the M is an element belonging to Group 9, n is 2 (n=2) and when the M is an element belonging to Group 10, n is 1 (n=1).

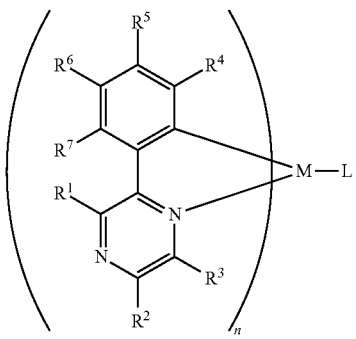

(G5)

In the formula, $R^1$ represents either an alkyl group or a phenyl group. $R^2$ represents hydrogen, an alkyl group or a phenyl group. $R^3$ represents either hydrogen or an alkyl group. In addition, $R^2$ and $R^3$ may be bound to each other to form an alicycle. $R^4$ to $R^7$ represent any of hydrogen, an alkyl group, a halogen group, a haloalkyl group, an alkoxy group, and an alkoxycarbonyl group. In addition, M is a central metal, and represents either an element belonging to Group 9 or an element belonging to Group 10. L is a monoanionic ligand. When the M is an element belonging to Group 9, n is 2 (n=2) and when the M is an element belonging to Group 10, n is 1 (n=1).

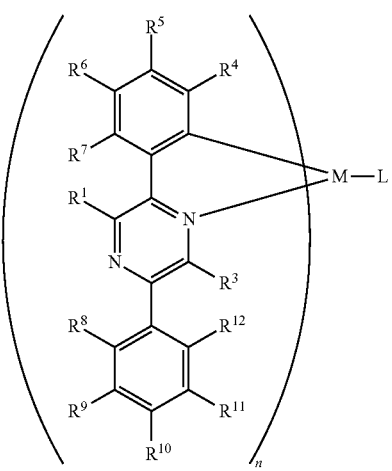

(G6)

In the formula, $R^1$ represents either an alkyl group or a phenyl group. $R^3$ represents either hydrogen or an alkyl group. $R^4$ to $R^{12}$ represent any of hydrogen, an alkyl group, a halogen group, a haloalkyl group, an alkoxy group, and an alkoxycarbonyl group. In addition, M is a central metal, and represents either an element belonging to Group 9 or an element belonging to Group 10. L is a monoanionic ligand. When the M is an element belonging to Group 9, n is 2 (n=2) and when the M is an element belonging to Group 10, n is 1 (n=1).

The central metal of the above pyrazine-based organometallic complex is preferably iridium or platinum in terms of heavy atom effect. In particular, iridium is preferable since iridium can provide remarkable heavy atom effect, extremely high efficiency and is chemically stable.

Next, the arylene group $A_r$, each subsistent $R^1$ to $R^{12}$, and the monoanionic ligand L in the above general formulae (G1) to (G6) are described in detail.

As the arylene group $A_r$, an arylene group having 6 to 25 carbon atoms is preferably used, specifically, phenylenes, julolidilenes, naphtylenes, spirofluorene-diyls, 9,9-dimetyl-fluoren-diyls, 9,9-dialkylfluonren-diyls can be applied. Further, these arylene groups $A_r$ may have a substituent. As the substituent at that time, an alkyl group, a halogen group, a haloalkyl group, an alkoxy group, an alkoxycarbonyl group or the like can be used.

Next, $R^1$ represents either an alkyl group or a phenyl group. Further, the phenyl group may have a substituent. As the substituent at that time, an alkyl group, a halogen group, a haloalkyl group, an alkoxy group, an alkoxycarbonyl group or the like can be used.

$R^2$ represents hydrogen, an alkyl group or a phenyl group. Further, the phenyl group may have a substituent. As the substituent at that time, an alkyl group, a halogen group, a haloalkyl group, an alkoxy group, an alkoxycarbonyl group or the like can be used.

$R^3$ represents hydrogen or an alkyl group. In addition, $R^2$ and $R^3$ may be bound to each other to form an alicycle. Specifically, $R^2$ and $R^3$ are bound to each other to form a 1,4-butylenes group.

$R^4$ to $R^{12}$ represent hydrogen, an alkyl group, a halogen group, a haloalkyl group, an alkoxy group, or an alkoxycarbonyl group.

In the above structure, the alkyl group preferably has 1 to 4 carbon atoms, specifically, a methyl group, an ethyl group, an isopropyl group, a t-butyl group or the like can be given. In addition, a fluoro group, and a chloro group are nominated for a halogen group, and a fluoro group is preferable in terms of chemical stability. As the haloalkyl group, a trifluoromethyl group is preferable. Further, the alkoxy group preferably has 1 to 4 carbon atoms, specifically, a methoxy group, an ethoxy group, an isopropoxy group, and a t-butoxy group are given. In addition, the alkoxycarbonyl group preferably has 2 to 5 carbon atoms, and specifically, a methoxycarbonyl group, an ethoxycarbonyl group, an isopropoxy carbonyl group, and a t-butoxycarbonyl group are nominated for the alkoxycarbonyl group.

Next, the monoanionic ligand L will be described. The monoanionic ligand L is preferably a monoanionic bidentate chelate ligand having a β-diketone structure, a monoanionic bidentate chelate ligand having a carboxyl group, a monoanionic bidentate chelate ligand having a phenolic hydroxyl group, or a monoanionic bidentate chelate ligand in which two ligand elements are both nitrogen, since they have a high coordinative ability. More specifically, monoanionic ligands represented by the following structural formulae (L1) to (L8) are given. However, the monoanionic ligand L is not limited to these ligands.

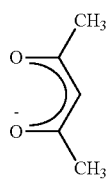
(L1)

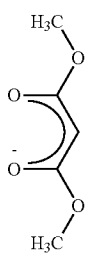
(L2)

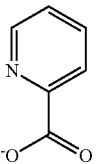
(L3)

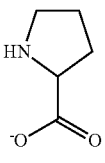
(L4)

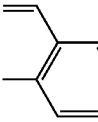
(L5)

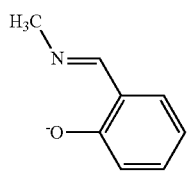
(L6)

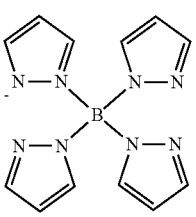
(L7)

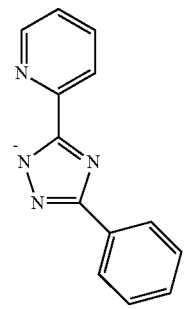
(L8)

From the above described modes, pyrazine-based organometallic complexes which can be used in the present invention are structured. Specific structural formulae are given below (the structural formulae (1) to (17)). Note that the pyrazine-based organometallic complex of the present invention is not limited to these complexes.

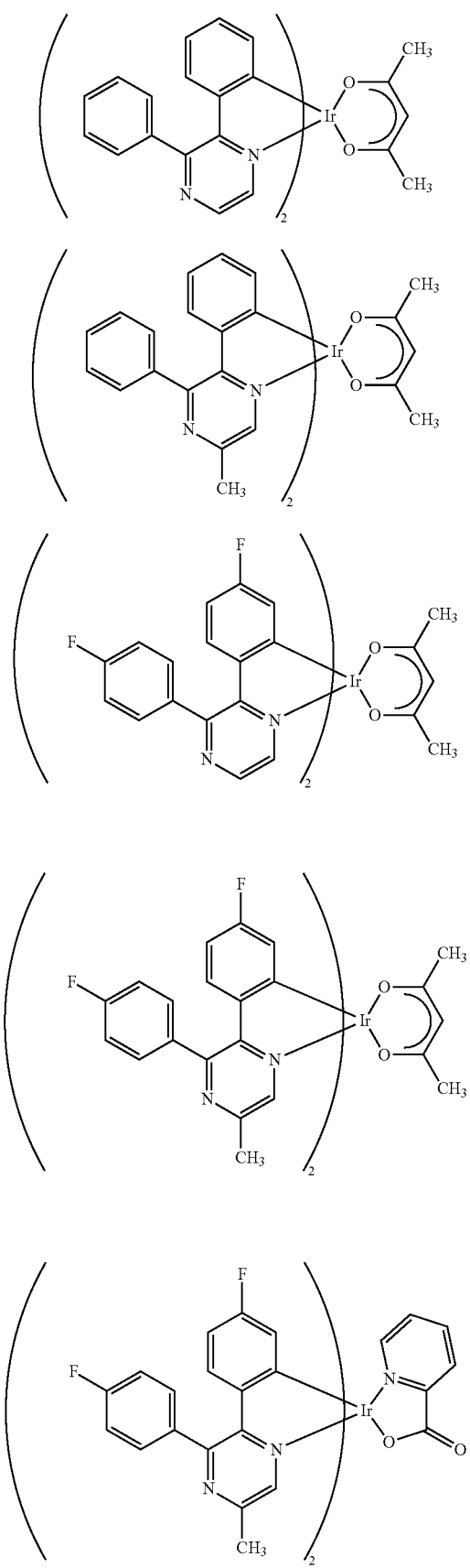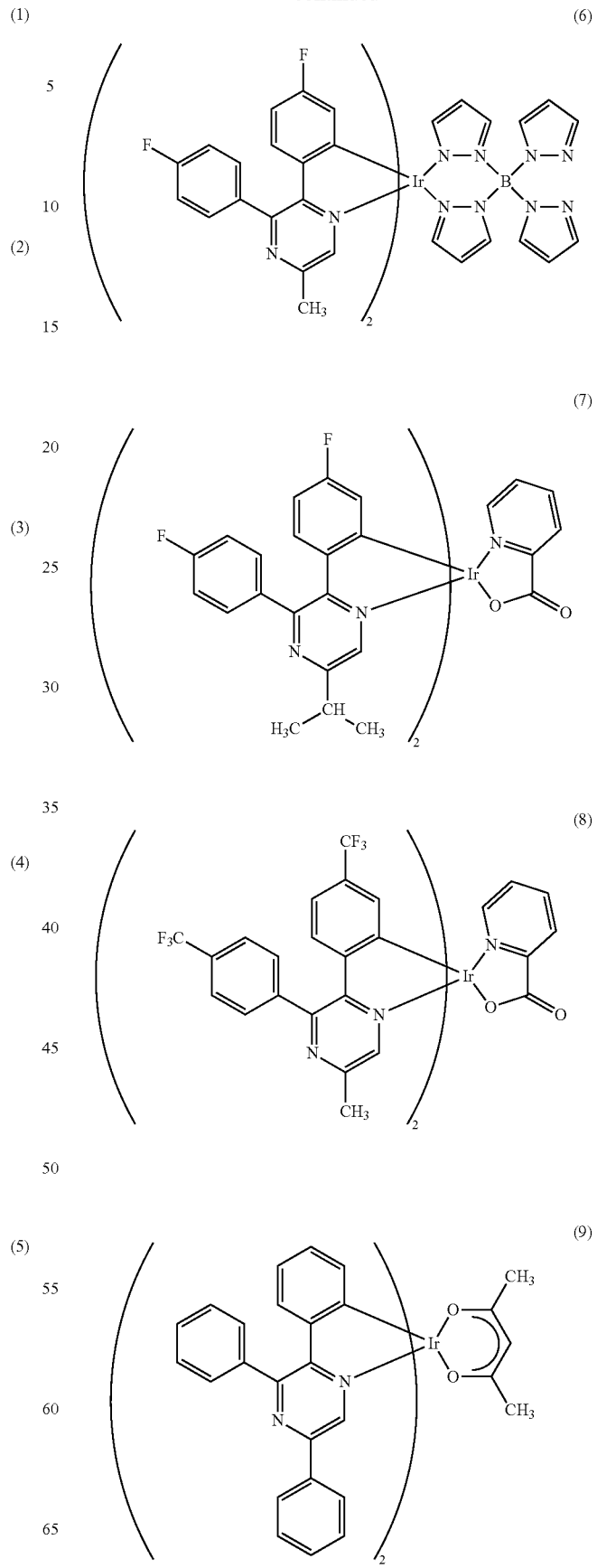

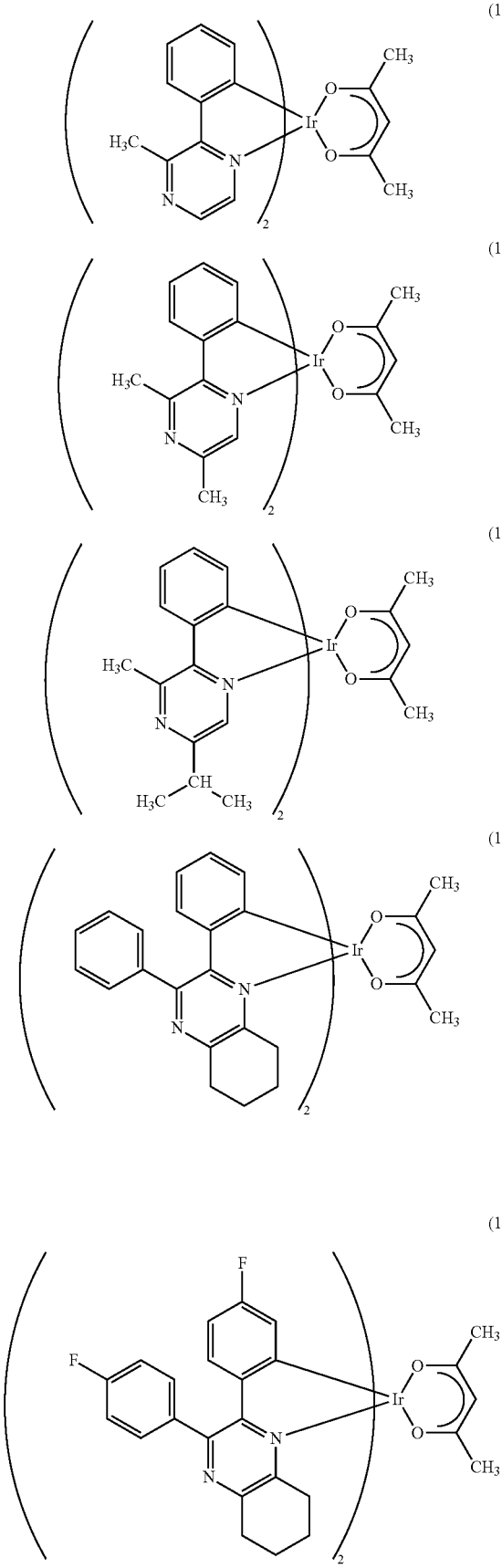

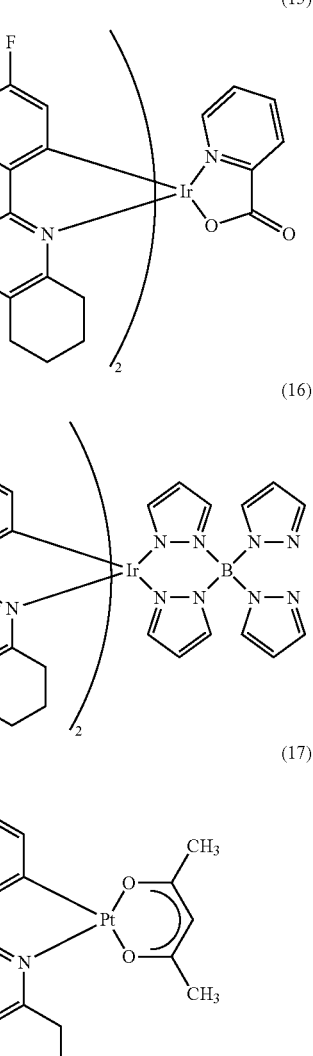

Embodiment Mode 4

Embodiment Mode 4 will explain an image display device as an example of light-emitting device having a light-emitting element of the present invention.

This embodiment mode will describe an image display device having a light-emitting element of the present invention in a pixel portion, with reference to FIGS. 31A and 31B. FIG. 31A is a top view illustrating a light-emitting device while FIG. 31B is a cross-sectional view taken along the lines A-A' and B-B' of FIG. 31A. This image display device includes a driver circuit portion (source side driver circuit) 601 shown with a dotted line; a pixel portion 602 shown with a dotted line; and a driver circuit portion (gate side driver circuit) 603 shown with a dotted line, to control emission of the light-emitting element. Moreover, a reference numeral 604 denotes a sealing substrate; 605, a sealing material; and 607, a space surrounded by the sealing material 605.

A leading wiring 608 is provided to transmit a signal to be inputted to the source side driver circuit 601 and the gate side driver circuit 603, and receive a video signal, a clock signal, a start signal, a reset signal, and the like from an FPC (Flexible Printed Circuit) 609, which serves as an external input terminal. Although only the FPC is illustrated here, the FPC may be provided with a printed wiring board (PWB). The light-emitting device in this specification includes not only a light-emitting device itself but also a light-emitting device has an FPC or a PWB attached thereto.

Next, the cross-sectional structure is described with reference to FIG. 31B. Over an element substrate 610 are formed the driver circuit portion and the pixel portion. Here, the source side driver circuit 601, which is the driver circuit portion, and one pixel in the pixel portion 602 are shown.

In the source side driver circuit 601, a CMOS circuit in which an n-channel TFT 623 and a p-channel TFT 624 are combined is formed. Such a driver circuit may be formed by using various circuits such as a CMOS circuit, a PMOS circuit, or an NMOS circuit. Although this embodiment mode illustrates a driver-integrated type where the driver circuit is formed over the substrate, the present invention is not restricted to this, and the driver circuit may be formed outside the substrate, not over the substrate.

The pixel portion 602 includes a plurality of pixels each including a switching TFT 611, a current control TFT 612, and a first electrode 613 electrically connected to a drain of the current control TFT 612. An insulator 614 is formed so as to cover an end portion of the first electrode 613. Here, the insulator 614 is formed using a positive photosensitive acrylic resin film.

In order to improve the coverage, an upper end portion or a lower end portion of the insulator 614 is formed so as to have a curved surface with curvature. For example, in the case of using a positive photosensitive acrylic for the insulator 614, only the upper end portion of the insulator 614 preferably has a curved surface with curvature (a radius of curvature of 0.2 to 3 μm). As the insulator 614, either a negative type which becomes insoluble in etchant by irradiation with light or a positive type which becomes soluble in etchant by irradiation with light can be used.

Over the first electrode 613, a layer 616 including a light-emitting layer and a second electrode 617 are formed. Here, the first electrode 613 can be formed with various metals, alloys, electrically conductive compounds, or mixture thereof. When the first electrode is used as an anode, it is preferable to use, among those materials, a metal, an alloy, an electrically conductive compound or a mixture thereof having a high work function (work function of 4.0 eV or higher), or the like. For example, a single layer of indium tin oxide containing silicon, indium zinc oxide (IZO), a titanium nitride film, a chromium film, a tungsten film, a Zn film, a Pt film, or the like can be used. Moreover, a multilayer including a titanium nitride film and a film containing aluminum as its main component; a three-layer structure including a titanium nitride film, a film containing aluminum as its main component, and a titanium nitride film; or the like can be used. The multilayer structure achieves to have low wiring resistance, favorable ohmic contact, and a function as an anode.

The layer 616 including a light-emitting layer is formed by various methods such as an evaporation method using an evaporation mask, an inkjet method, a spin coating method, or the like. The layer 616 including a light-emitting layer has the light-emitting layer described in Embodiment Mode 1 to Embodiment Mode 3. As another material for the layer 616 including a light-emitting layer, a low molecular material, a medium molecular material having an intermediate property between a high molecular material and a low molecular material (including oligomer and dendrimer), or a high molecular material may be used. As the material for the layer including the light-emitting layer, not only an organic compound but also an inorganic compound may be used.

As the material for the second electrode 617, various types of metals, alloys, electrically conductive compounds, mixtures of these, or the like can be used. When the second electrode is used as a cathode, among them, a metal, alloy, electrically conductive compound, mixture of these, or the like each having a low work function (work function of 3.8 eV or lower) is preferable. As an example, an element belonging to Group 1 or Group 2 in the periodic table, i.e., an alkali metal such as lithium (Li) or cesium (Cs), an alkaline earth metal such as magnesium (Mg), calcium (Ca), or strontium (Sr), or an alloy containing any of these (such as Mg:Ag or Al:Li); and the like can be given. In the case where light generated in the layer 616 including a light-emitting layer is transmitted through the second electrode 617, the second electrode 617 is preferably formed with a multilayer of a metal thin film whose thickness is made thin, and a transparent conductive film (indium tin oxide (ITO), indium tin oxide including silicon or silicon oxide, indium zinc oxide (IZO), indium oxide containing tungsten oxide and zinc oxide (IWZO), or the like).

When the sealing substrate 604 and the element substrate 610 are attached to each other by the sealing material 605, the light-emitting element 618 is provided in the space 607 surrounded by the element substrate 610, the sealing substrate 604, and the sealing material 605. The space 607 may be filled with filler, and may be filled with an inert gas (such as nitrogen or argon), the sealing material 605, or the like.

An epoxy-based resin is preferable for the sealing material 605. The material preferably allows as little moisture and oxygen as possible to penetrate. As a material for the sealing substrate 604, a plastic substrate made of FRP (Fiberglass-Reinforced Plastics), PVF (polyvinyl fluoride), polyester, acrylic, or the like can be used besides a glass substrate or a quartz substrate.

In this way, the active matrix image display device having the light-emitting element of the present invention can be provided.

Figure 32A:
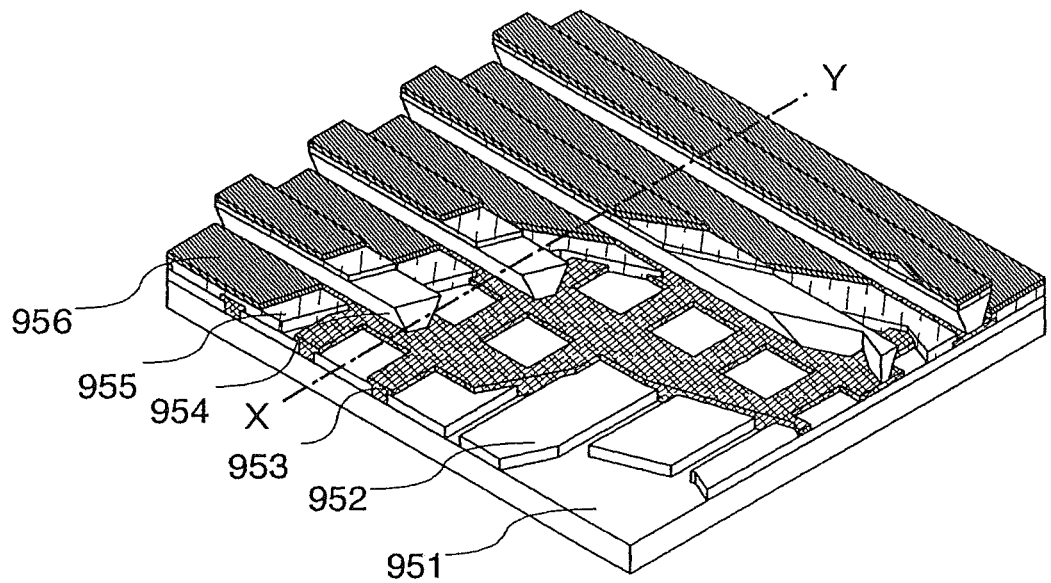
FIGS. 32A and 32B illustrate a light-emitting device using a light-emitting element according to an aspect of the present invention.
Figure 32B:
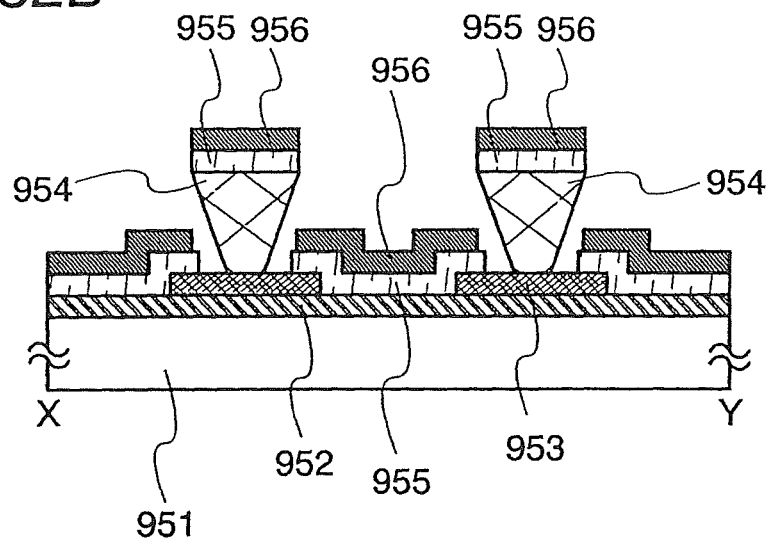

Although this embodiment mode has described the active matrix type image display device in which the driving of the light-emitting element is controlled by transistors, the image display device may be of a passive type in which the light-emitting element is driven without particularly providing elements for driving, such as transistors. FIG. 32 is a perspective view of a passive type image display device manufactured by applying the present invention. In FIG. 32, a layer 955 including a light-emitting layer is provided between an electrode 952 and an electrode 956 over a substrate 951. An end portion of the electrode 952 is covered with an insulating layer 953. Then, over the insulating layer 953 is provided a partition layer 954. A side wall of the partition layer 954 has such a gradient that the distance between one side wall and the other side wall becomes shorter as approaching the substrate surface. That is to say, a cross section of the partition layer 954 in a short-side direction is trapezoid-like, in which a bottom side (a side in the same direction as a surface direction of the insulating layer 953, which is in contact with the insulating layer 953) is shorter than an upper side (a side in the same direction as the surface direction of the insulating layer 953, which is not in contact with the insulating layer 953). In this way, by providing the partition layer 954, a problem of defects in a light-emitting element due to electrostatic and the like can be prevented.

As described above, the image display device of the present invention described in Embodiment Mode 4 has the light-emitting element of the present invention described in Embodiment Modes 1 to 3. Thus, the image display device has high emission efficiency and long lifetime. Therefore, the image display device using a light-emitting element of the present invention consumes low electric power and has a long lifetime.

Embodiment Mode 4 can be freely combined with any of the other embodiment modes.

Embodiment Mode 5

The light-emitting element of the present invention can be used for an illumination device, which is an example of light-emitting devices, because the light-emitting element of the present invention has high emission efficiency and long lifetime. Embodiment Mode 5 will describe an application example of an illumination device using the light-emitting element of the present invention.

Figure 4A:
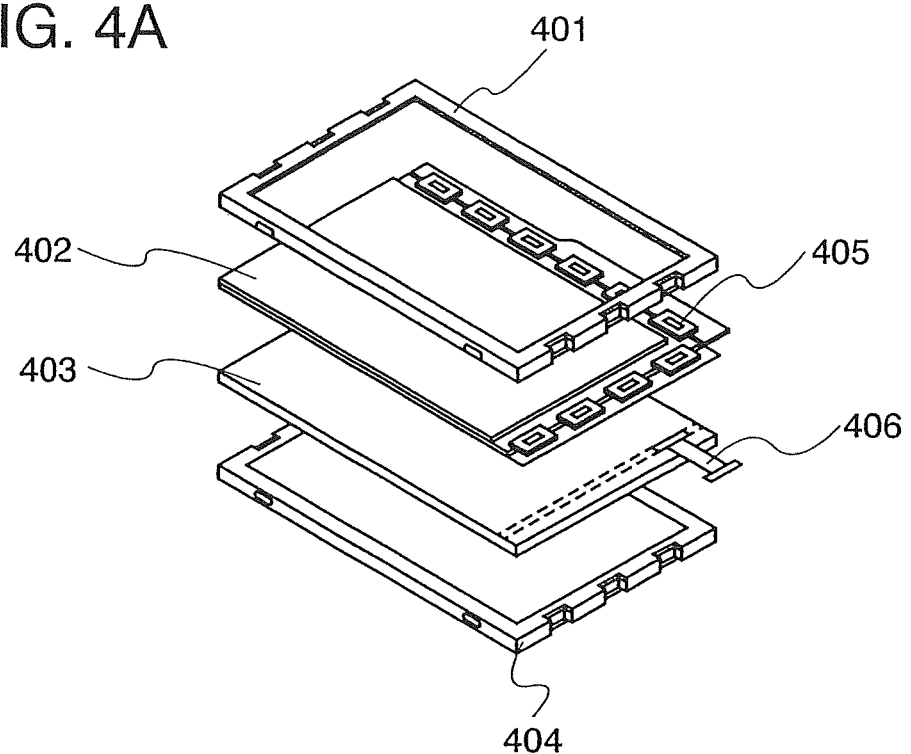
FIGS. 4A and 4B illustrate illumination devices using a light-emitting element according to an aspect of the present invention.

FIG. 4A shows an example of a liquid crystal display device in which the light-emitting element of the present invention is used as a backlight. The liquid crystal display device illustrated in FIG. 4A includes a housing 401, a liquid crystal layer 402, a backlight 403, and a housing 404, in which the liquid crystal layer 402 is connected to a driver IC 405. The backlight 403 uses the light-emitting element of the present invention, and current is supplied to the backlight 403 through a terminal 406.

When the light-emitting element of the present invention is used as the backlight of the liquid crystal display device, the backlight having high emission efficiency and a long lifetime can be obtained. Moreover, since a backlight using the light-emitting element of the present invention is an illumination device of surface light emission and can be formed in a large area, the backlight can be made larger and the liquid crystal display device can also have a larger area. Moreover, since the light-emitting device is thin and consumes less electric power, reduction in thickness and power consumption of the display device is possible.

Figure 4B:
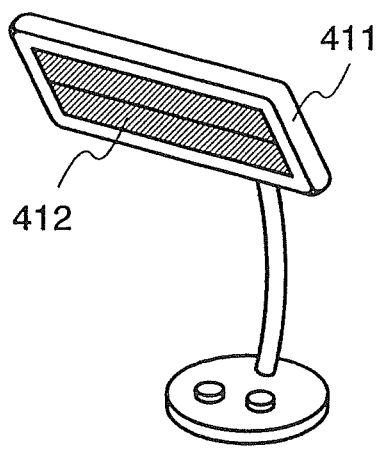

FIG. 4B illustrates an example in which an illumination device using the light-emitting element of the present invention is used as a light source of a desk lamp. The desk lamp illustrated in FIG. 4B includes a housing 411 and a light source 412. The light-emitting element of the present invention is used as the light source 412. Since the light-emitting element of the present invention has a long lifetime, the desk lamp can also have a long lifetime.

The illumination device of the present invention described in Embodiment Mode 5 has the light-emitting element of the present invention described in Embodiment Modes 1 to 3. Thus, the illumination device has high emission efficiency and long lifetime. Therefore, the illumination device using a light-emitting element of the present invention consumes low electric power and has a long lifetime.

Embodiment Mode 6

An image display device of the present invention, described in Embodiment Mode 4, can display an excellent image. Therefore, electronic devices that are capable of providing an excellent image can be obtained by applying the image display device of the present invention to display portions of the electronic devices. In addition, the image display device or the illumination device (i.e., a light-emitting device) including the light-emitting element of the present invention consumes low power and has long life. Therefore, electronic devices with low power consumption can be obtained by applying the light-emitting device of the present invention to the display portions of the electronic devices, and for example, a telephone or the like that has long battery standing time, and the like can be obtained. Hereinafter, an embodiment of electronic devices incorporating a light-emitting device to which a light-emitting element of the present invention is applied is shown.

Figure 5A:
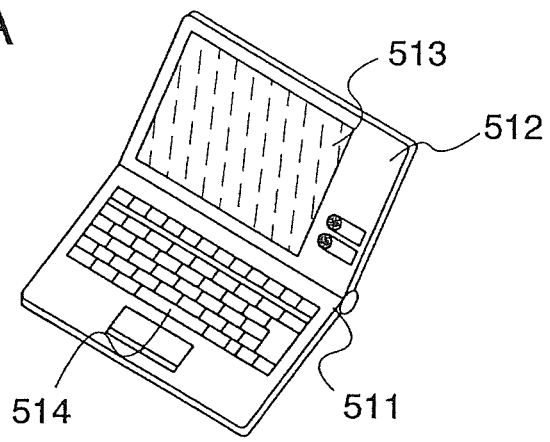
FIGS. 5A to 5C illustrate electronic devices using a light-emitting device according to an aspect of the present invention.

FIG. 5A is a computer manufactured by applying the present invention, which includes a main body 511, a casing 512, a display portion 513, a keyboard 514, and the like. The computer can be completed by incorporating the light-emitting device including the light-emitting element of the present invention in the display portion.

Figure 5B:
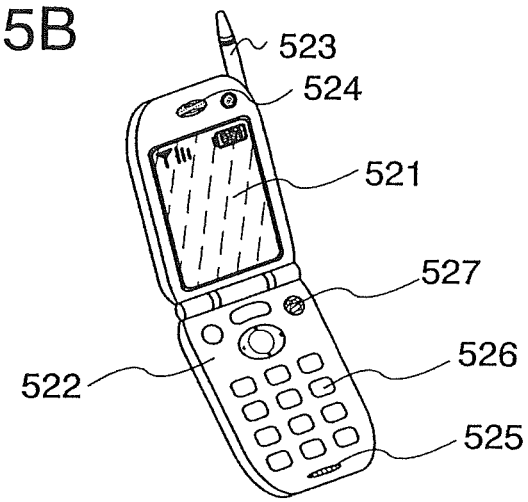

FIG. 5B is a telephone manufactured by applying the present invention, in which a main body 522 includes a display portion 521, an audio output portion 524, an audio input portion 525, operation switches 526 and 527, an antenna 523, and the like. The telephone can be completed by incorporating the light-emitting device including the light-emitting element of the present invention in the display portion.

Figure 5C:
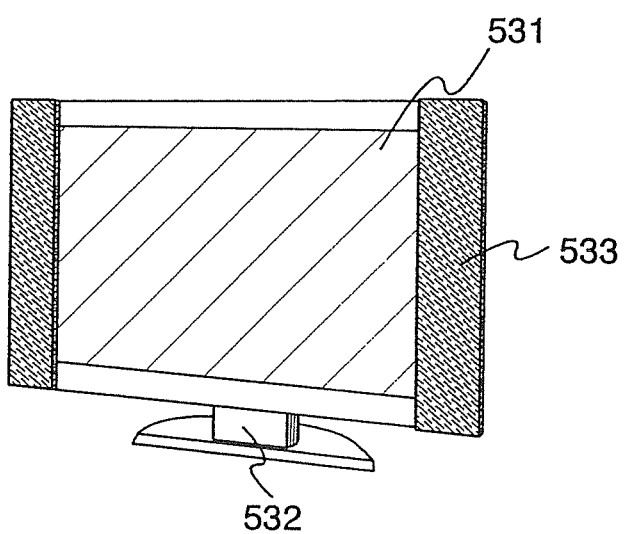

FIG. 5C is a television receiver set manufactured by applying the present invention, which includes a display portion 531, a casing 532, a speaker 533, and the like. The television receiver set can be completed by incorporating the light-emitting device including the light-emitting element of the present invention in the display portion.

As described above, the light-emitting devices of the present invention are extremely suitable for the display portions of various kinds of electronic devices.

Although the computer and the like have been described in Embodiment Mode 5, the light-emitting device having the light-emitting element of the present invention may also be mounted in a navigation system, an illumination device, or the like.

Example 1

In Example 1, the electron-trapping property of an organometallic complex (a pyrazine-based organometallic complex) which can be used for a light-emitting element of the present invention was evaluated. The organometallic complex has a ligand having a pyrazine skeleton and a central metal which is an element belonging to Group 9 or 10.

In the evaluation, reductive reaction characteristics of the pyrazine-based organometallic complex were measured by a cyclic voltammetry (CV) measurement, and the LUMO level was calculated from the evaluation result. For comparison, the LUMO levels of a conventional pyridine-based organometallic complex and substances serving as host materials were calculated in the same way, and were compared to the LUMO level of the pyrazine-based organometallic complex. Note that an electrochemical analyzer (ALS model 600A or 600C, manufactured by BAS Inc.) was used for the measurement.

As for a solution used in the CV measurement, dehydrated dimethylformamide (DMF, manufactured by Aldrich, 99.8%, catalog number. 22705-6) was used as a solvent. Tetra-n-butylammonium perchlorate (n-$Bu_4NClO_4$, manufactured by Tokyo Chemical Industry Co., Ltd., catalog number: T0836), which was a supporting electrolyte, was dissolved in the solvent such that the concentration of the tetra-n-butylammonium perchlorate was 100 mmol/L. Moreover, the object to be measured was dissolved such that the concentration thereof was set to 1 mmol/L. Further, a platinum electrode (a PTE platinum electrode, manufactured by BAS Inc.) was used as a working electrode. A platinum electrode (a VC-3 Pt counter electrode (5 cm), manufactured by BAS Inc.) was used as a counter electrode. An Ag/Ag+ electrode (an RE5 nonaqueous solvent reference electrode, manufactured by BAS Inc.) was used as a reference electrode. It is to be noted that the measurement was conducted at room temperature (20 to 25° C.). In addition, the scan speed at the CV measurement was 0.1 V/sec.

(Calculation of Potential Energy with Respect to a Vacuum Level of a Reference Electrode)

The potential energy (eV) with respect to a vacuum level of a reference electrode (Ag/Ag$^+$ electrode) used in this example was calculated first. In other words, Fermi level of the Ag/Ag+ electrode was calculated. It is known that the oxidation-reduction potential of ferrocene in methanol is +0.610 [V vs. SHE] with respect to the normal hydrogen electrode (Reference: Christian R. Goldsmith et al., J. Am. Chem. Soc., Vol. 124, No. 1, 83-96, 2002). On the other hand, when the oxidation-reduction potential of ferrocene in methanol was calculated by using a reference electrode used in this example, it was +0.20 V [vs. Ag/Ag+]. Therefore, it was found that the potential energy of the reference electrode used in this example was lower than that of the normal hydrogen electrode by 0.41 [eV].

Note that it is known that the potential energy from the vacuum level of the normal hydrogen electrode is −4.44 eV (Reference: ONISHI.T et al., High molecular EL materials-development of light-emitting high molecular compounds-, 2004, pages 64-67, KYORITSU SHUPPAN). Accordingly, the potential energy used in this example with respect to the vacuum level of the reference electrode was as follows: −4.44−0.41=−4.85 [eV].

(Measurement Example: Structural Formula (9))

Figure 30:
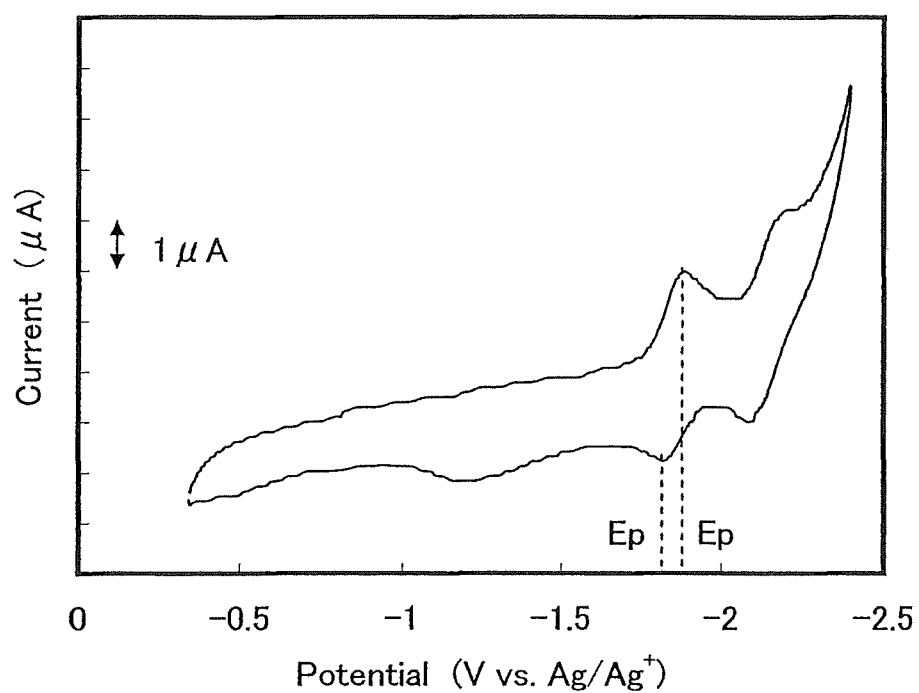
FIG. 30 is a graph showing a CV curve obtained by measurement in Example 1.

In this measurement example, the calculation of the LUMO level by CV measurement is described taking Ir(tppr)$_2$(acac) represented by the structural formula (9) as an example. FIG. 30 is a graph showing CV measurement results of reductive reaction characteristics. In the measurement of the reductive reaction characteristics, the potential of the working electrode with respect to the reference electrode was shifted from −0.34 to −2.40 V, and then, from −2.40 V to −0.34 V.

As illustrated in FIG. 30, the reduction peak potential $E_{pc}$ was −1.88 V. The oxidation peak potential $E_{pa}$ was −1.82 V. Therefore, the half-wave potential (the intermediate potential between $E_{pc}$ and $E_{pa}$) was calculated to be −1.85 V. This indicates that Ir(tppr)$_2$(acac) is reduced by an electric energy of −1.85 (V vs. Ag/Ag+) and this energy corresponds to the LUMO level. As described above, the potential energy of the reference electrode used in Example 1 with respect to the vacuum level was −4.85 [eV], and thus, it was found that the LUMO level of the pyrazine-based organometallic complex represented by the structural formula (9) was as follows: −4.85−(−1.85)=−3.00 [eV].

(Measurement Results)

In the same way, the LUMO level of the pyrazine-based organometallic complex disclosed in Embodiment Mode 3 was measured. For comparison, the LUMO levels of pyridine-based organometallic complexes such as [btpIr(acac)] (the following structural formula (I)) and Ir(ppy)$_2$(acac) (the following structural formula (II)) were measured. [btpIr (acac)] is an organometallic complex used in the Patent Document 1. In addition, as reference, the LUMO level of an electron-transporting compound BAlq (the following structural formula (III)) which is widely used as a host material of a red phosphorescent compound was also evaluated.

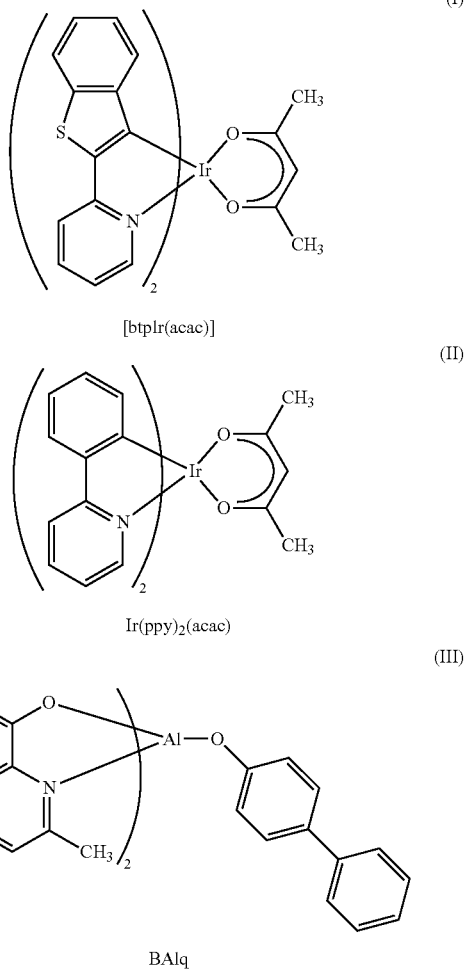

[btpIr(acac)]

Ir(ppy)$_2$(acac)

BAlq

The results are shown in Table 1. As seen from Table 1, as compared with the pyridine-based organometallic complex ((I) to (III) in Table 1), all the pyrazine-based organometallic complexes ((1), (3)-(9), (13)-(15), and (17) in Table 1) have deeper LUMO levels, which are deeper than −2.7 eV. The LUMO levels of the pyrazine-based organometallic complexes are deeper than that of BAlq. On the other hand, the pyridine-based organometallic complexes have a shallower LUMO level than that of BAlq. Therefore, from the results of this example, it is shown that the pyrazine-based organometallic complex used in the present invention has a relatively high electron-trapping property.

TABLE 1

| Structural Formula No. | Substance (abbreviation) | $E_{1/2}$ [V vs. Ag/Ag$^+$] | LUMO level [eV] |
|---|---|---|---|
| (1) | Ir(dppr)$_2$(acac) | −1.98 | −2.87 |
| (3) | Ir(Fdppr)$_2$(acac) | −1.92 | −2.93 |
| (4) | Ir(Fdppr-Me)$_2$(acac) | −2.00 | −2.85 |
| (5) | Ir(Fdppr-Me)$_2$(pic) | −1.82 | −3.03 |
| (6) | Ir(Fdppr-Me)$_2$(bpz4) | −1.86 | −2.99 |

TABLE 1-continued

| Structural Formula No. | Substance (abbreviation) | $E_{1/2}$ [V vs. Ag/Ag$^+$] | LUMO level [eV] |
|---|---|---|---|
| (7) | Ir(Fdppr-iPr)$_2$(pic) | −1.83 | −3.02 |
| (8) | Ir(CF3dppr-Me)2(pic) | −1.63 | −3.22 |
| (9) | Ir(tppr)$_2$(acac) | −1.85 | −3.00 |
| (13) | Ir(dpqtH)$_2$(acac) | −2.11 | −2.74 |
| (14) | Ir(FdpqtH)$_2$(acac) | −2.03 | −2.82 |
| (15) | Ir(FdpqtH)$_2$(pic) | −1.90 | −2.85 |
| (17) | Pt(FdpqtH)(acac) | −1.81 | −3.04 |
| (I) | [btpIr(acac)] | −2.39 | −2.46 |
| (II) | Ir(ppy)$_2$(acac) | −2.57 | −2.28 |
| (III) | BAlq | −2.31 | −2.54 |

Example 2

Example 2 will specifically exemplify the light-emitting element of the present invention with reference to comparative examples. Molecular structures of substances used in Example 2 are shown below. In addition, FIG. 3 illustrates a structure of the element.

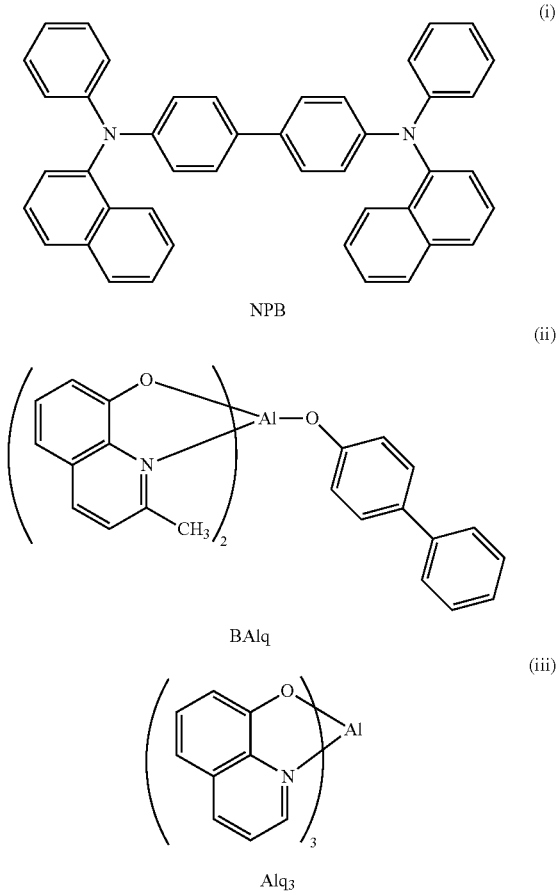

<<Fabrication of a Light-Emitting Element 1 of the Present Invention, a Light-Emitting Element 2 of the Present Invention, a Comparative Light-Emitting Element 3, and a Comparative Light-Emitting Element 4>>

First, a glass substrate on which a 110-nm-thick indium tin silicon oxide (ITSO) film was formed was prepared. The periphery of surface of ITSO was covered with a polyimide film so that the area, 2 mm×2 mm of the surface was exposed. Note that ITSO was a first electrode 301 serving as an anode of the light-emitting element. As a pretreatment for forming the light-emitting element, the surface of the substrate was washed with a porous resin brush, baked at 200° C. for one hour and was subjected to UV ozone treatment for 370 seconds.

Then, the substrate was fixed to a holder provided in a vacuum evaporation apparatus so that the surface provided with ITSO faced downward.

After the pressure in the vacuum evaporation apparatus was reduced to $10^{-4}$ Pa, NPB represented by the structural formula (i) and molybdenum(VI) oxide were co-evaporated so as to satisfy NPB: molybdenum (VI) oxide=4:1 (mass ratio), whereby a hole-injecting layer 311 was formed. The thickness thereof was 50 nm. Note that a co-evaporation method is an evaporation method in which a plurality of different substances is concurrently vaporized from respective different evaporation sources. Next, NPB was evaporated to be 10 nm thick, whereby a hole-transporting layer 312 was formed.

Further, over the hole-transporting layer 312, a light-emitting layer 313 having a thickness of 30 nm was formed. Structures of the light-emitting layer 313 of each of the light-emitting element 1, the light-emitting element 2, the comparative light-emitting element 3 and the comparative light-emitting element 4 are shown in Table 2. The light-emitting element 1 and the light-emitting element 2 are light-emitting elements of the present invention, which employ NPB as the first organic compound, BAlq represented by the structural formula (ii) as the second organic compound, and Ir(tppr)$_2$(acac) represented by the structural formula (9) in Embodiment Mode 3 as the pyrazine-based organic compound. As seen from Table 2, the ratio of NPB to BAlq is different between the light-emitting element 1 and the light-emitting element 2. On the other hand, the comparative light-emitting element 3 employs only NPB as a host material without using BAl$_q$. In addition, the comparative light-emitting element 4 employs only BAlq as a host material without using NPB. The light-emitting layers 313 are all formed by a co-evaporation method.

TABLE 2

| | Ratio of the substances in the light-emitting layer (mass ratio) |
|---|---|
| Light-emitting element 1 | NPB:BAlq:Ir(tppr)$_2$(acac) = 0.25:1:0.06 |
| Light-emitting element 2 | NPB:BAlq:Ir(tppr)$_2$(acac) = 0.10:1:0.06 |
| Comparative light-emitting element 3 | NPB:Ir(tppr)$_2$(acac) = 1:0.06 |
| Comparative light-emitting element 4 | BAlq:Ir(tppr)$_2$(acac) = 1:0.06 |

Then, BAlq was evaporated to be 10 nm thick over the light-emitting layer 313, whereby an electron-transporting layer 314 was formed. Furthermore, over the electron-transporting layer 314, Alq$_3$ represented by the structural formula (iii) and lithium (Li) were co-evaporated so as to satisfy Alq$_3$:Li=1:0.01 (mass ratio), whereby an electron-injecting layer 315 was formed. The thickness thereof was 50 nm. Finally, aluminum was formed to be 200 nm thick as a second electrode 302 serving as a cathode, whereby the light-emitting elements were obtained. Note that, in the above evaporation process, evaporation was all performed by a resistance heating method.

<<Operation Characteristics of the Light-Emitting Element 1, the Light-Emitting Element 2, the Comparative Light-Emitting Element 3 and the Comparative Light-Emitting Element 4>>

After the light-emitting element 1, the light-emitting element 2, the comparative light-emitting element 3 and the comparative light-emitting element 4 obtained as described above were sealed in a glove box with a nitrogen atmosphere so as not to be exposed to the air, operation characteristics of these light-emitting elements were measured. Note that the measurement was performed at room temperature (an atmosphere kept at 25° C.).

Figure 6A:
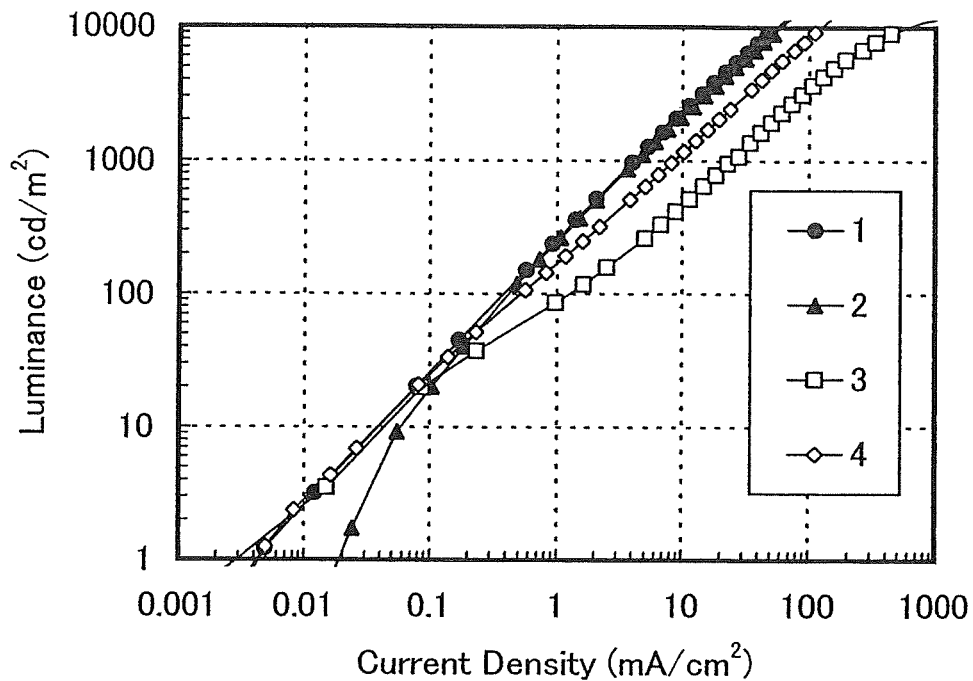
FIGS. 6A and 6B are graphs showing characteristics of light-emitting elements formed in Example 2.
Figure 6B:
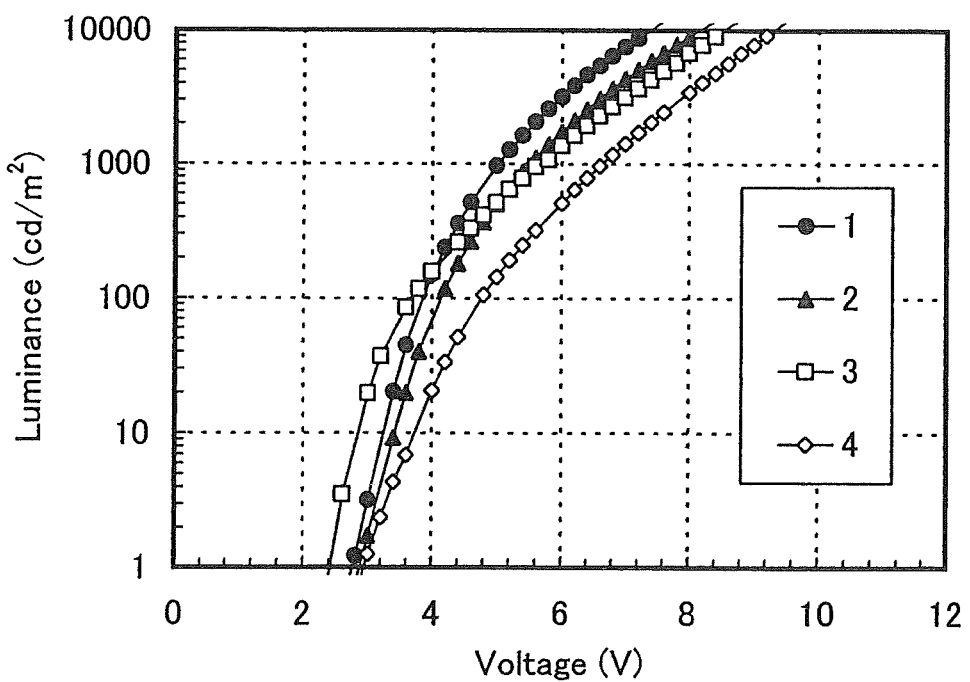
Figure 7:
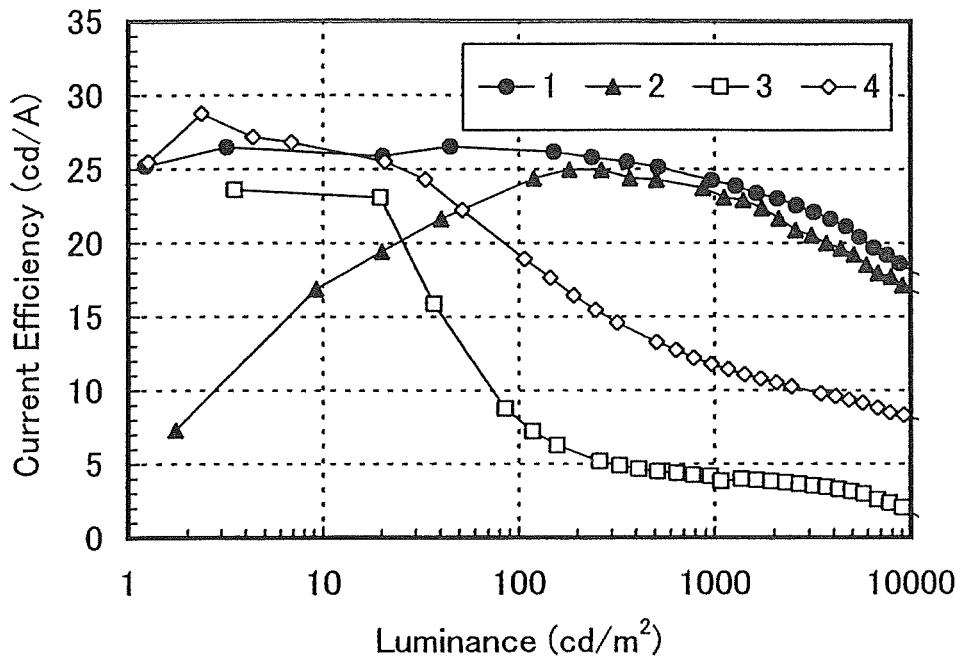
FIG. 7 is a graph showing characteristics of light-emitting elements formed in Example 2.
Figure 8:
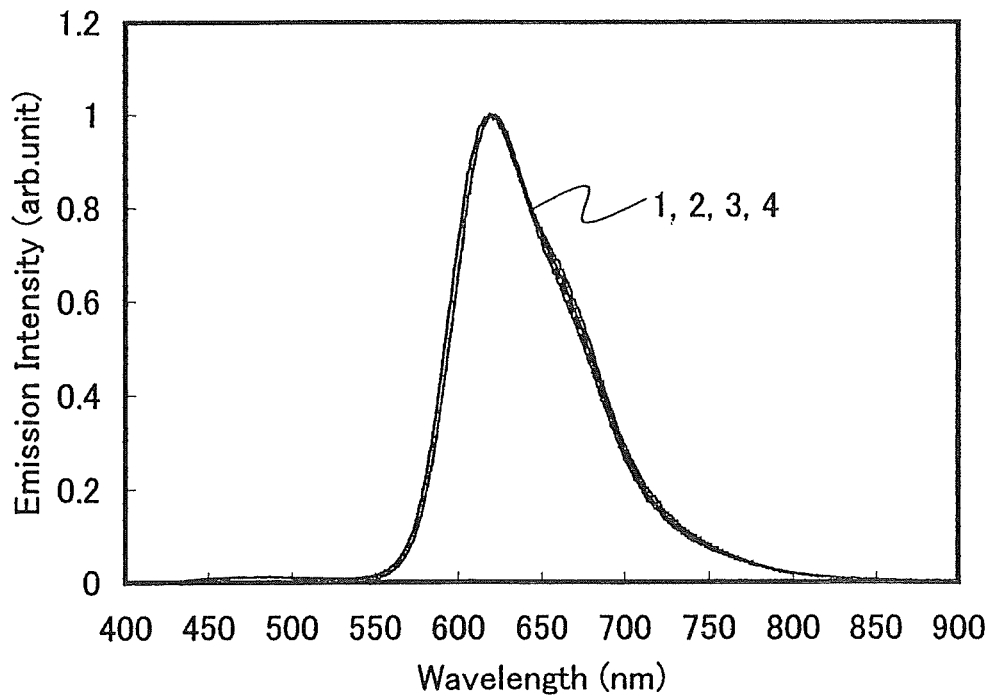
FIG. 8 is a graph showing emission spectra of light-emitting elements formed in Example 2.

FIG. 6A shows current density-luminance characteristics of the light-emitting elements, and FIG. 6B shows voltage-luminance characteristics thereof. FIG. 7 shows luminance-current efficiency characteristics of these light-emitting elements. FIG. 8 shows emission spectra of these light-emitting elements. The emission spectra of the light-emitting elements were almost the same, and emission was red emission derived from $Ir(tppr)_2(acac)$. Note that as to only the comparative light-emitting element 3, emission of BAlq was slightly observed around 480 nm.

As seen from FIG. 7, current efficiencies of the comparative light-emitting element 3 and the comparative light-emitting element 4 both drastically decrease in practical luminance region (100 $cd/m^2$ or more). The comparative light-emitting element 3 is in the state illustrated in FIG. 2A in Embodiment Mode 1. Since $Ir(tppr)_2(acac)$ having a high electron-trapping property was added into NPB which was a hole-transporting compound, a light-emitting region was limited to the vicinity of the interface between the light-emitting layer 313 and the electron-transporting layer 314. In the spectrum of the comparative light-emitting element 3 of FIG. 8, emission of BAlq used for the electron-transporting layer 314 is slightly observed. In other words, it is seen that holes reached the electron-transporting layer 314, which caused reduction of current efficiency. The comparative light-emitting element 4 is in the state illustrated in FIG. 2B in Embodiment Mode 1. Since $Ir(tppr)_2(acac)$ having a high electron-trapping property was added into BAlq which was an electron-transporting compound, it is considered that the carrier balance was bad and current efficiency was decreased. In addition, as apparent from FIG. 6B, driving voltage is high.

On the other hand, the light-emitting element 1 and the light-emitting element 2 of the present invention exhibit extremely high emission efficiency as apparent from FIG. 7. In particular, their external quantum efficiencies are significant as apparent from Table 3, higher than 20% at 1000 $cd/m^2$.

Figure 9:
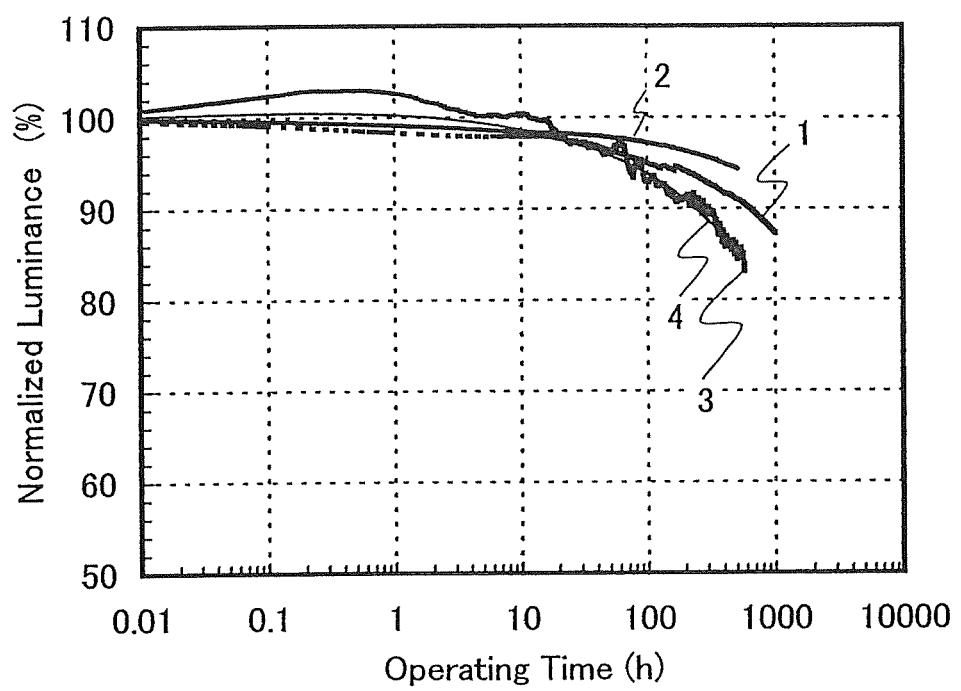
FIG. 9 is a graph showing luminance degradation curves of light-emitting elements formed in Example 2.

Next, the initial luminance was set at 1000 $cd/m^2$, and these elements were driven at the constant current density. At that time, luminance degradation curves as seen in FIG. 9 are obtained. FIG. 9 is a graph in which the horizontal axis represents time and the vertical axis represents relative luminance (%) when the initial luminance is 100. As apparent from FIG. 9, the light-emitting elements of the present invention have greatly improved lifetime.

Table 3 shows the comparison in the characteristics at 1000 $cd/m^2$ and lifetime. Note that since it takes much time for the elements to reach the luminance half-life period, the lifetimes of the elements are compared, in terms of the period until which the luminance was reduced by 10%.

TABLE 3

| | Voltage [V] | Current Efficiency [cd/A] | External quantum efficiency [%] | Power efficiency [lm/W] | 10% degradation of luminance [hr] |
|---|---|---|---|---|---|
| Light-emitting element 1 | 5.0 | 24 | 21 | 15 | 640 |
| Light-emitting element 2 | 5.6 | 23 | 20 | 13 | 3,000* |
| Comparative light-emitting element 3 | 5.6 | 4.2 | 3.5 | 2.3 | 300 |
| Comparative light-emitting element 4 | 6.6 | 12 | 10 | 5.6 | 240 |

*Extrapolation value

The current efficiency, the external quantum efficiency, and the power efficiency were extremely low in the comparative light-emitting element using only NPB as a host material and in the comparative light-emitting element 4 using only BAlq as a host material. On the contrary, the current efficient, the external quantum efficiency, and the power efficiency of the light-emitting element 1 and the light-emitting element 2 using NPB and BAlq for the light-emitting layer were extremely high, as apparent from Table 3. These results were not expected from the characteristics of NPB or BAlq which was used alone. The same can be applied to the lifetime. In particular, the light-emitting element 2 can have extremely long lifetime, and its luminance half-life period is estimated to be about 50,000 hours.

As described above, it can be found that the light-emitting elements of the present invention can achieve both high emission efficiency and long lifetime. Accordingly, by implementing the present invention, light-emitting elements having high emission efficiency and long lifetime can be provided.

Example 3

Example 3 will specifically describe a fabrication example of a light-emitting element (a light-emitting element 5) of the present invention. FIG. 3 illustrates a structure of the light-emitting element.

<<Fabrication of the Light-Emitting Element 5 of the Present Invention>>

The hole-injecting layer 311 and the hole-transporting layer 312 were formed in the same way as those of the light-emitting element 1 in Example 2. The light-emitting layer 313 was formed over the hole-transporting layer 312. The light-emitting layer 313 includes NPB as the first organic compound, BAlq as the second organic compound, and $Ir(tppr)_2(acac)$ represented by the structural formula (9) in Embodiment Mode 3, as the pyrazine-based organometallic complex. The light-emitting layer 313 was formed by co-evaporation such that the mass ratio is NPB: BAlq:Ir$(tppr)_2(acac)$=0.1:1:0.06. The thickness was 50 nm.

Next, a 10-nm-thick $Alq_3$ was evaporated to form the electron-transporting layer 314. Over the electron-transporting layer 314, $Alq_3$ and lithium (Li) were co-evaporated at the mass ratio of $Alq_3$:Li=1:0.01 to form the electron-injecting layer 315. The thickness was 20 nm. Lastly, a 200-nm-thick aluminum was formed as the second electrode 302 serving as a cathode. In this manner, the light-emitting element of the present invention was fabricated. All the above evaporation processes were conducted by resistance heating.

<<Operation Characteristics of the Light-Emitting Element 5>>

The thus obtained light-emitting element 5 was sealed in a glove box with a nitrogen atmosphere so as not to expose the light-emitting elements to the air, operation characteristics of the light-emitting element were measured. Note that the measurement was performed at room temperature (an atmosphere kept at 25° C.).

Figure 10A:
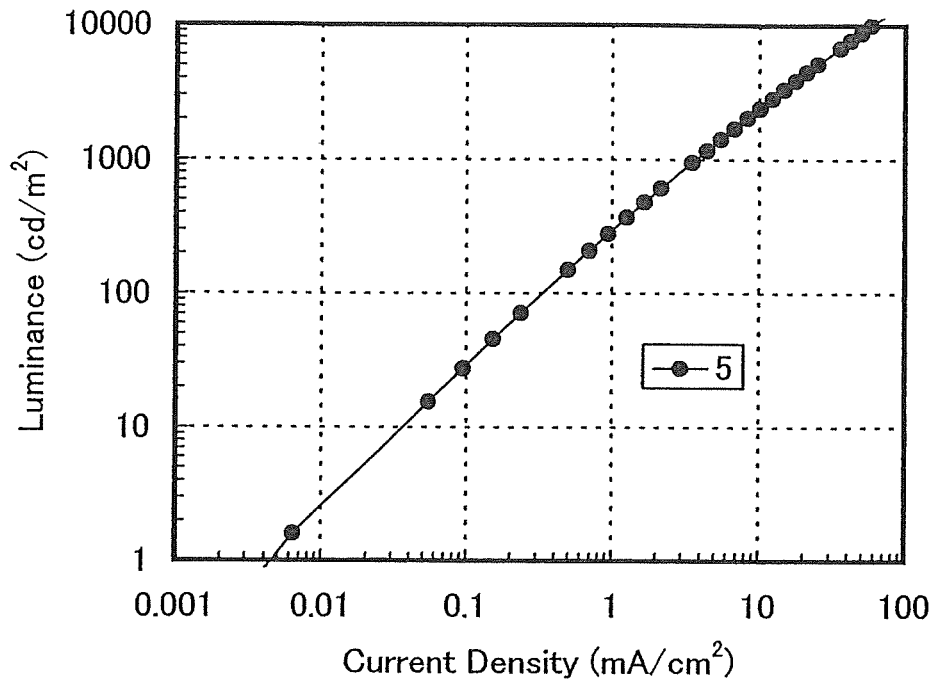
FIGS. 10A and 10B are graphs showing characteristics of a light-emitting element formed in Example 3.
Figure 10B:
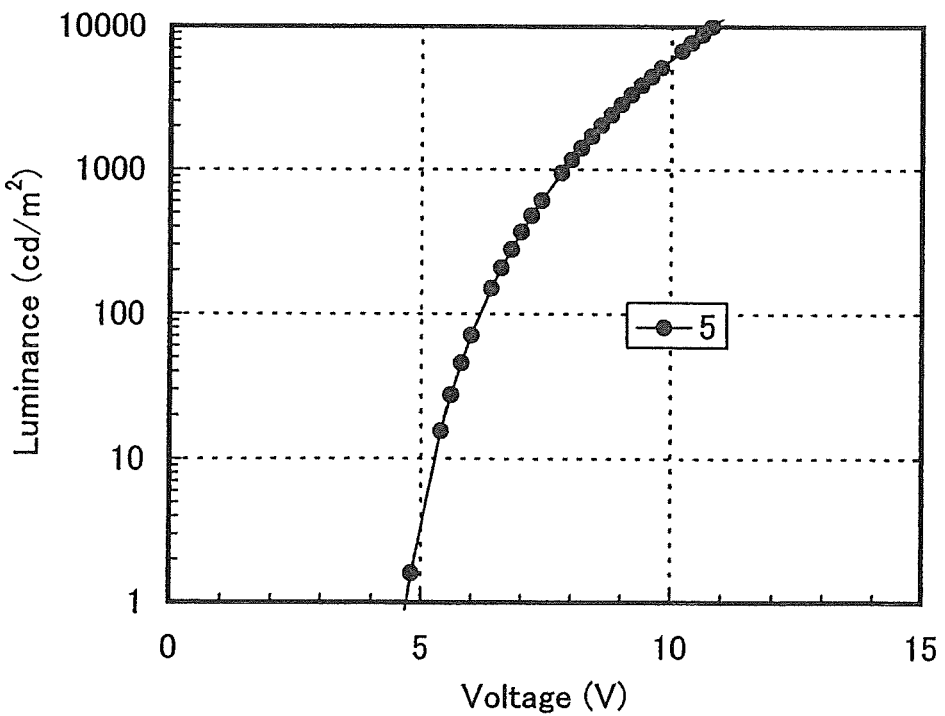
Figure 11:
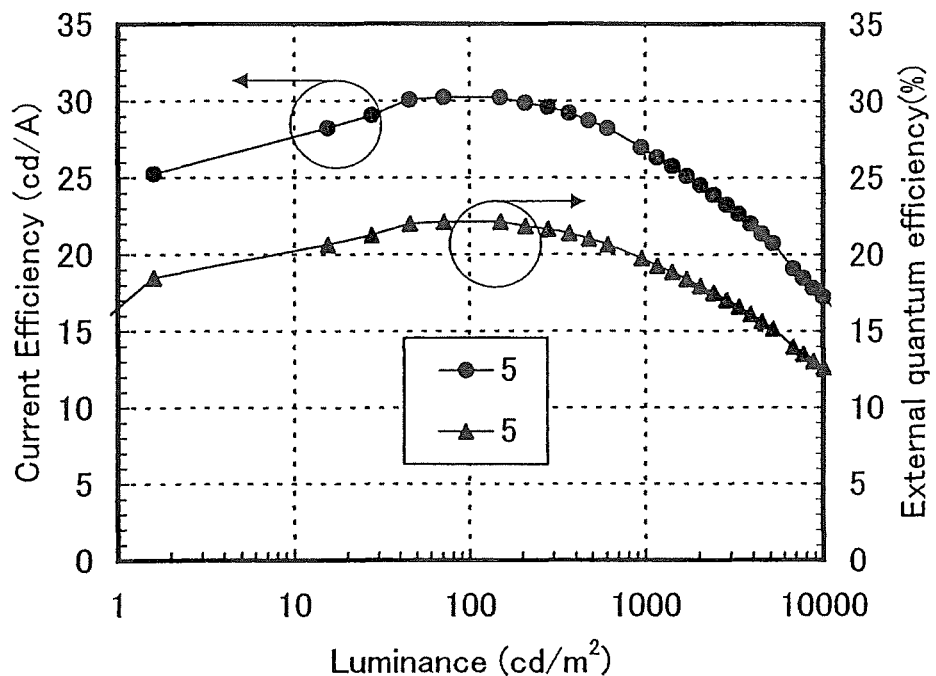
FIG. 11 is a graph showing characteristics of a light-emitting element formed in Example 3.
Figure 12:
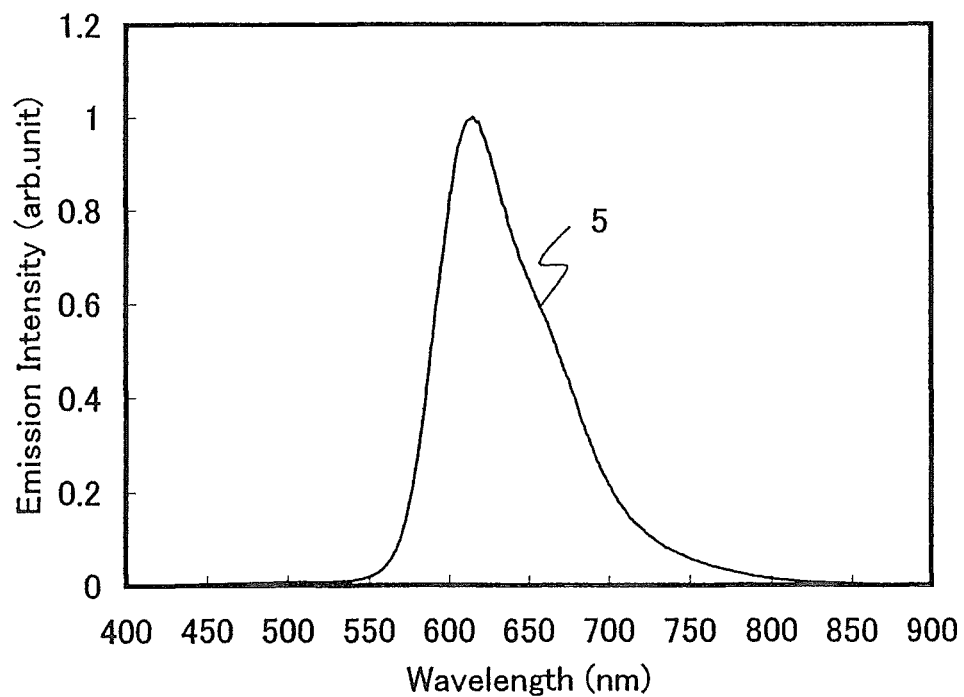
FIG. 12 is a graph showing emission spectrum of a light-emitting element formed in Example 3.

FIG. 10A shows current density-luminance characteristics of the light-emitting element 5, and FIG. 10B shows voltage-luminance characteristics thereof. FIG. 11 shows luminance-current efficiency characteristics and luminance-external quantum efficiency characteristics of the light-emitting element 5. FIG. 12 shows emission spectrum of the light-emitting element 5. The emission spectrum of the light-emitting element 5 was derived from Ir(tppr)$_2$(acac).

As seen from FIG. 12, the peak of the emission spectrum of the light-emitting element 5 is around 620 nm, and the light-emitting element 5 exhibited red emission whose CIE chromaticity coordinates were (x, y)=(0.65, 0.35).

Also, as seen from FIG. 11, the current efficiency of the light-emitting element 5 of the present invention reached a maximum, 30 cd/A at 200 cd/m$^2$, which was extremely high efficiency. The external quantum efficiency in this case was 23%. Further, at the 1000 cd/m$^2$ which was regarded as a practical luminance region, the current efficiency was 27 cd/A (the external quantum efficiency was 20%) and extremely high efficiency.

The light-emitting element 5 uses Alq$_3$ having a lower triplet excitation energy than Ir(tppr)$_2$(acac) (emission wavelength: 620 nm or less) serving as a light-emitting substance, as the electron-transporting layer 314 in contact with the light-emitting layer 313. Despite this, high efficiency that the external quantum efficiency is higher than 20% as described above can be achieved. This suggests that the light-emitting region in the light-emitting element of the present invention does not locate only at the interface between the light-emitting layer 313 and the electron-transporting layer 314. This is also one feature of the present invention.

Figure 13:
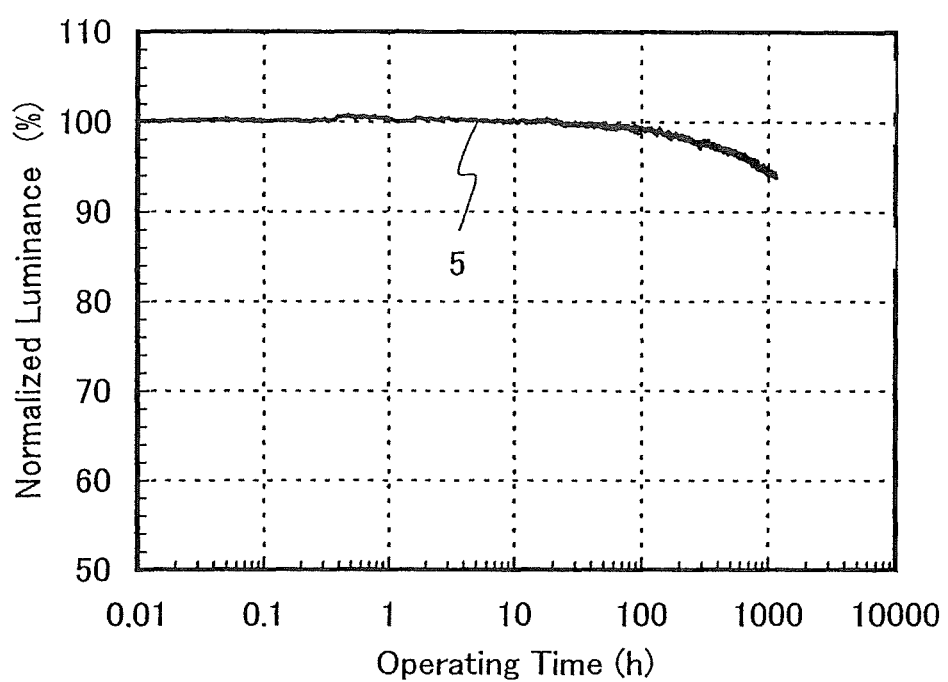
FIG. 13 is a graph showing a luminance degradation curve of a light-emitting element formed in Example 2.

Next, the initial luminance was set at 1000 cd/m$^2$, and the element was driven at the constant current density. At that time, a luminance degradation curve as seen in FIG. 13 is obtained. FIG. 13 is a graph in which the horizontal axis represents time and the vertical axis represents relative luminance (%) when the initial luminance is 100. As apparent from FIG. 13, the light-emitting element 5 of the present invention has extremely long lifetime, since 10% degradation time of luminance was estimated at as long as 4000 hours from an extrapolation value of the curve in FIG. 13. In addition, its luminance half-life period is estimated to be about 100,000 hours.

Example 4

Example 4 will specifically exemplify the light-emitting element of the present invention with reference to comparative examples. In addition, FIG. 3 illustrates a structure of the element.

<<Fabrication of a Light-Emitting Element 6, a Comparative Light-Emitting Element 7 and a Comparative Light-Emitting Element 8>>

A light-emitting element 6 of the present invention was fabricated in the same way as the light-emitting element 2 of Example 2, except that Ir(tppr)$_2$(acac) of the light-emitting layer 313 was changed to Ir(dppr)$_2$(acac) (the structural formula (I) in Embodiment Mode 3), and that the thickness of the electron-injecting layer 315 was 40 nm. In addition, the comparative light-emitting element 7 was fabricated in the same way as the comparative light-emitting element 3 of Example 2, except that Ir(tppr)$_2$(acac) of the light-emitting layer 313 was changed to Ir(dppr)$_2$(acac), and that the thickness of the electron-injecting layer 315 was 40 nm. In addition, the comparative light-emitting element 8 was fabricated in the same way as the comparative light-emitting element 4 of Example 2, except that Ir(tppr)$_2$(acac) of the light-emitting layer 313 was changed to Ir(dppr)$_2$(acac), and that the thickness of the electron-injecting layer 315 was 40 nm. In summary, the light-emitting element 6, the comparative light-emitting element 7 and the comparative light-emitting element 8 have different structures of the light-emitting layer 313 from one another as shown in Table 4, but the other layers than the light-emitting layer 313 were fabricated in the same way.

TABLE 4

| | Ratio of substances in the light-emitting layer (mass ratio) |
|---|---|
| Light-emitting element 6 | NPB:BAlq:Ir(dppr)$_2$(acac) = 0.10:1:0.06 |
| Comparative light-emitting element 7 | NPB:Ir(dppr)$_2$(acac) = 1:0.06 |
| Comparative light-emitting element 8 | BAlq:Ir(dppr)$_2$(acac) = 1:0.06 |

<<Operation Characteristics of the Light-Emitting Element 6, the Comparative Light-Emitting Element 7 and the Comparative Light-Emitting Element 8>>

The thus obtained light-emitting element 6, comparative light-emitting element 7 and comparative light-emitting element 8 were sealed in a glove box with a nitrogen atmosphere so as not to expose the light-emitting elements to the air, operation characteristics of the light-emitting elements were measured. Note that the measurement was performed at room temperature (an atmosphere kept at 25° C.).

Figure 14A:
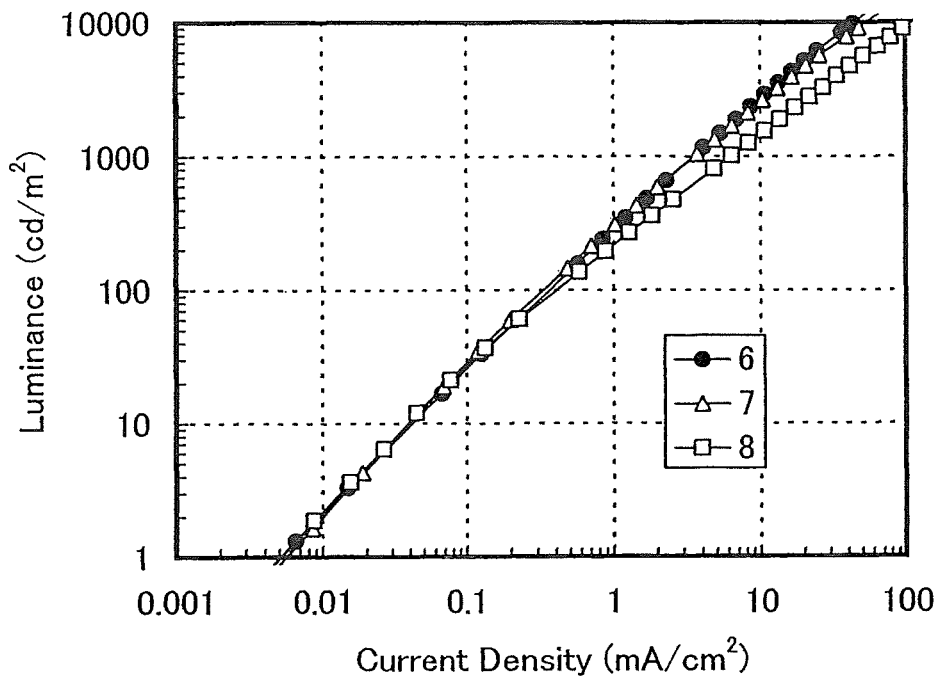
FIGS. 14A and 14B are graphs showing characteristics of light-emitting elements formed in Example 4.
Figure 14B:
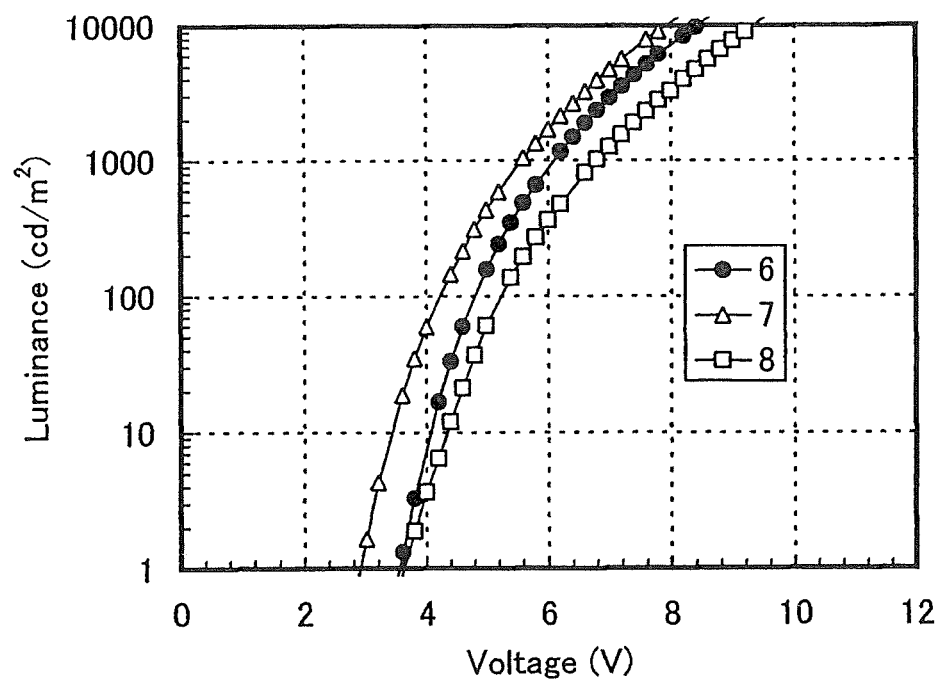
Figure 15:
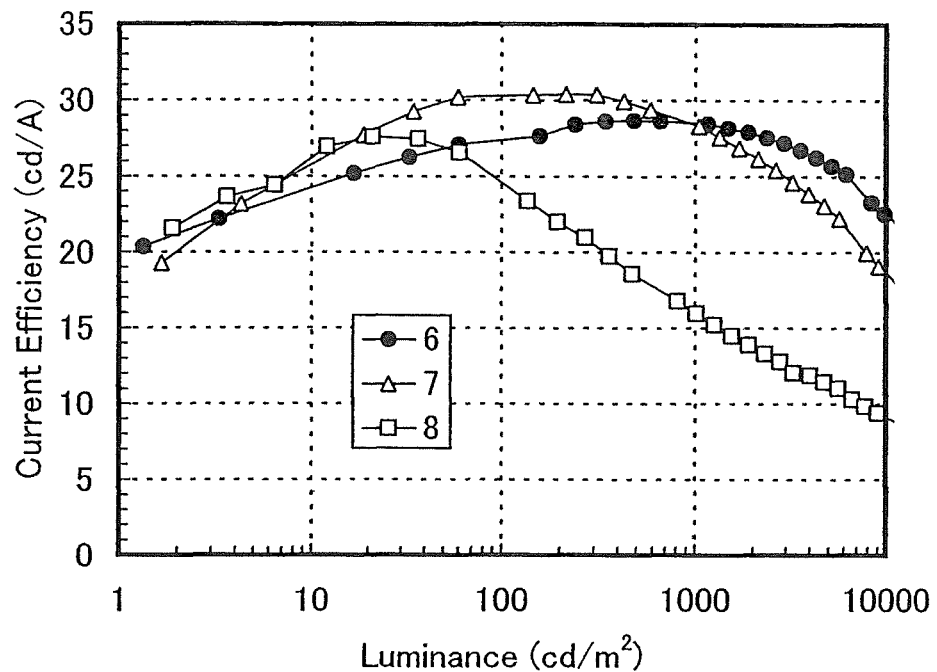
FIG. 15 is a graph showing characteristics of light-emitting elements formed in Example 4.
Figure 16:
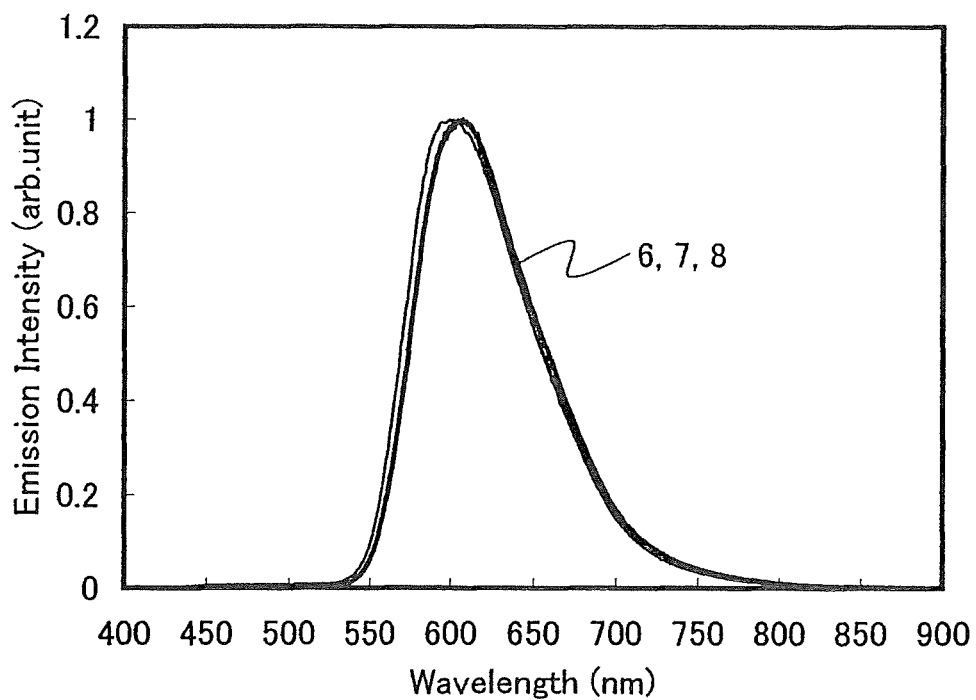
FIG. 16 is a graph showing emission spectra of light-emitting elements formed in Example 4.

FIG. 14A shows current density-luminance characteristics of the light-emitting elements, and FIG. 14B shows voltage-luminance characteristics thereof. FIG. 15 shows luminance-current efficiency characteristics of the light-emitting elements. FIG. 16 shows emission spectra of the light-emitting elements. The emission spectra of the light-emitting elements were almost the same and emission was orange, which was derived from Ir(dppr)$_2$(acac) (Note that only the comparative light-emitting element 7 slightly emitted light with a short wavelength.).

As apparent from FIG. 15, the current efficiency of the comparative light-emitting element 8 is decreased in the practical luminance region (100 cd/m$^2$ or more). The comparative light-emitting element 8 is in the state illustrated in FIG. 2B in Embodiment Mode 1. Since Ir(dppr)$_2$(acac) having a high electron-trapping property is added into BAlq which is an electron-transporting compound, it is considered that the carrier balance is bad and current efficiency is decreased. In addition, as apparent from FIG. 14B, driving voltage is high.

The comparative light-emitting element 7 has a mode similar to the mode of FIG. 2A; however, its initial characteristics are almost the same as those of the light-emitting element 6 of the present invention. This seems to be because emission of BAlq used for the electron-transporting layer 314 was not observed, unlike the comparative light-emitting element 3 of Example 2. As seen from Example 1, Ir(dppr)$_2$(acac) used in Example 4 has a weaker electron-trapping property than Ir(tppr)$_2$(acac) used in Example 2. Thus, it is inferred that in the comparative light-emitting element 7, more or less electrons reached the inside of the light-emitting layer 313, and emission of BAlq used for the electron-transporting layer 314 was suppressed.

Figure 17:
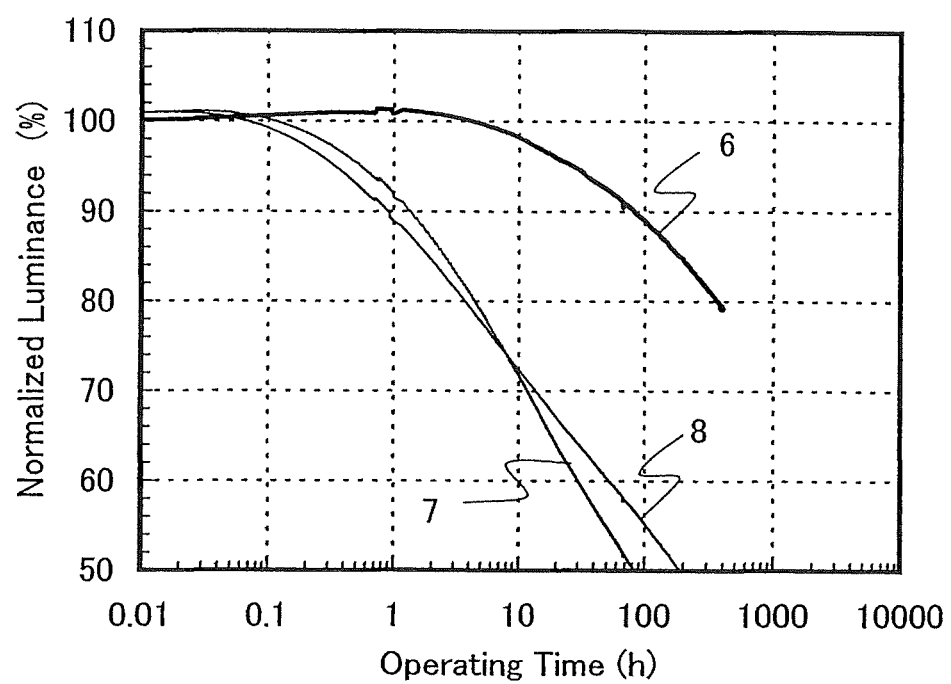
FIG. 17 is a graph showing luminance degradation curves of light-emitting elements formed in Example 4.

However, surprisingly, the remarkable difference of the lifetime between the light-emitting element 6 of the present invention and the comparative light-emitting element 7 was seen. The initial luminance was set at 1000 cd/m$^2$, and these elements were driven at the constant current density. Luminance degradation curves in this case are shown in FIG. 17. FIG. 17 is a graph in which the horizontal axis represents time and the vertical axis represents relative luminance (%) when the initial luminance is 100. As apparent from FIG. 17, only the light-emitting element 6 of the present invention has greatly improved lifetime.

The comparison of characteristics at 1000 cd/m$^2$ and lifetime is shown in Table 5.

TABLE 5

| | Voltage [V] | Current Efficiency [cd/A] | External quantum efficiency [%] | Power efficiency [lm/W] | Luminance half-life period [hr] |
|---|---|---|---|---|---|
| Light-emitting element 6 | 6.2 | 28 | 15 | 14 | 4,100* |
| Comparative light-emitting element 7 | 5.6 | 28 | 14 | 16 | 84 |
| Comparative light-emitting element 8 | 6.8 | 16 | 8.0 | 7.4 | 190 |

*Extrapolation value

As seen in Table 5, the current efficiency, the external quantum efficiency, and the power efficiency were extremely low in the comparative light-emitting element 8 using only BAlq as a host material, while the current efficiency, the external quantum efficiency, and the power efficiency were extremely high in the light-emitting element 6 using two kinds, NPB and BAlq as a host material and in the comparative light-emitting element 7 using only NPB as a host material. As for the lifetime, the luminance half-life period of the comparative light-emitting element 7 and the comparative light-emitting element 8 are both around 100 hours, while the luminance half-life period of the light-emitting element 6 of the present invention is estimated to be about 4000 hours from an extrapolation value.

In particular, although the light-emitting element 6 and the comparative light-emitting element 7 have almost the same initial characteristics, the lifetime of the light-emitting elements are remarkably different, which is an amazing result. The cause is not surely ascertained; however, it is thought that in the comparative light-emitting element 7, the excitation state of BAlq used for the electron-transporting layer 314 may influence on the lifetime due to the light-emitting region in some way.

As described above, it can be found that the light-emitting element of the present invention can achieve both high emission efficiency and long lifetime. Accordingly, by implementing the present invention, a light-emitting element having high emission efficiency and long lifetime can be provided.

Example 5

Example 5 will specifically exemplify the light-emitting element of the present invention with reference to a comparative example. In addition, FIG. 3 illustrates a structure of the element.

<<Fabrication of a Light-Emitting Element 9 and a Comparative Light-Emitting Element 10>>

A light-emitting element 9 of the present invention was fabricated in the same way as the light-emitting element 2 of Example 2, except that BAlq of the light-emitting layer 313 was changed to CO11 represented by the structural formula (iv). Note that the ratio of NPB, CO11 and Ir (tppr)$_2$(acac) was NPB:CO11:Ir(tppr)$_2$(acac)=0.5:1:0.06 (mass ratio). In addition, a comparative light-emitting element 10 was fabricated in the same way as the comparative light-emitting element 3 of Example 2, except that BAlq of the light-emitting layer 313 was changed to CO11. CO11 is a heteroaromatic compound having a 1,3,4-oxadiazole skeleton.

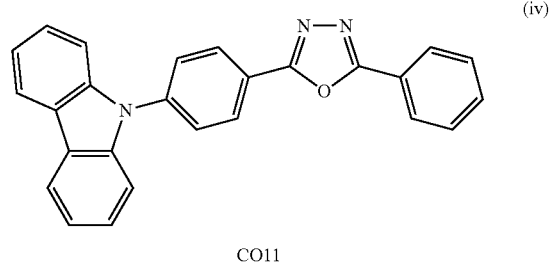

(iv)

CO11

<<Operation Characteristics of the Light-Emitting Element 9 and the Comparative Light-Emitting Element 10>>

The thus obtained light-emitting element 9 and the comparative light-emitting element 10 were sealed in a glove box with a nitrogen atmosphere so as not to expose the light-emitting elements to the air, operation characteristics of the light-emitting element were measured. Note that the measurement was performed at room temperature (an atmosphere kept at 25° C.).

Figure 18A:
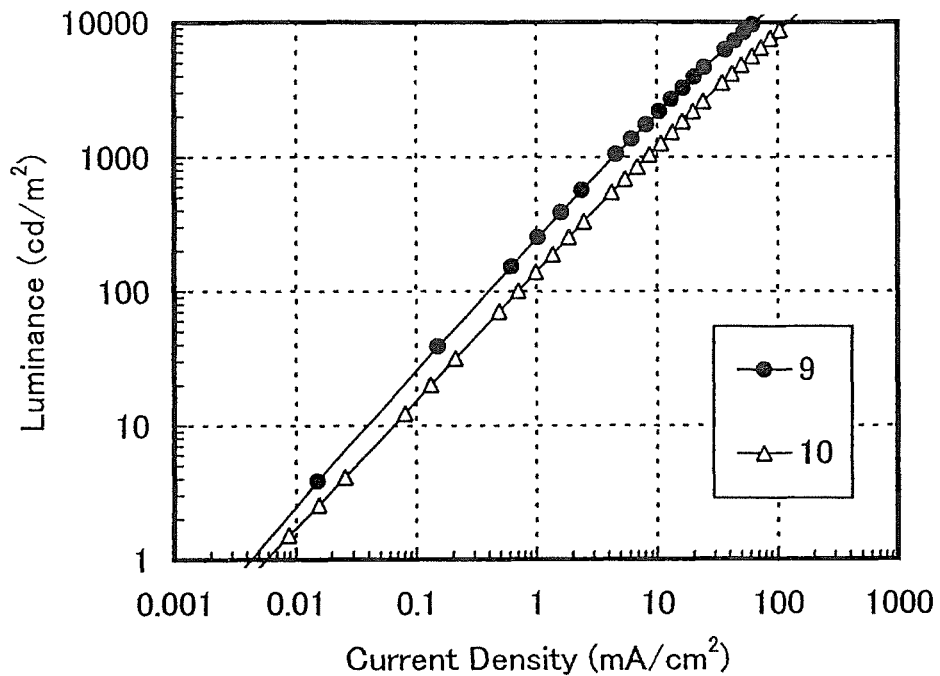
FIGS. 18A and 18B are graphs showing characteristics of light-emitting elements formed in Example 5.
Figure 18B:
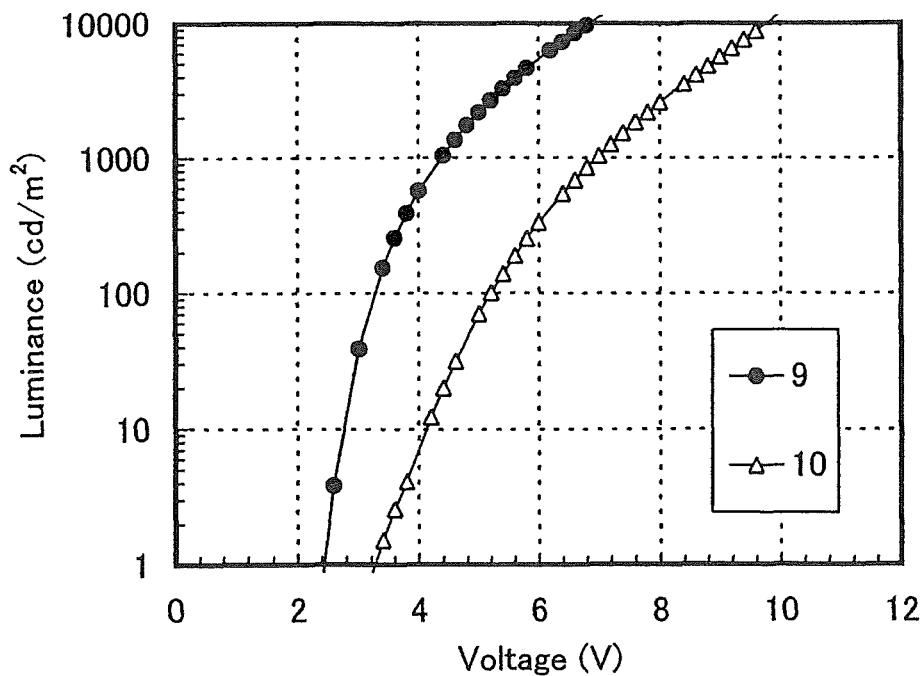
Figure 19:
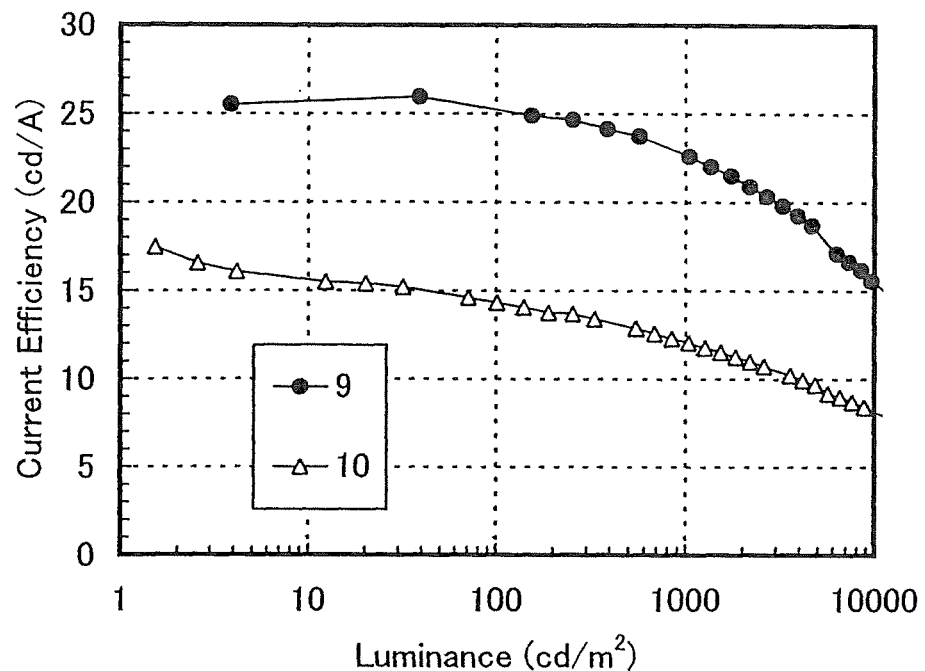
FIG. 19 is a graph showing characteristics of light-emitting elements formed in Example 5.
Figure 20:
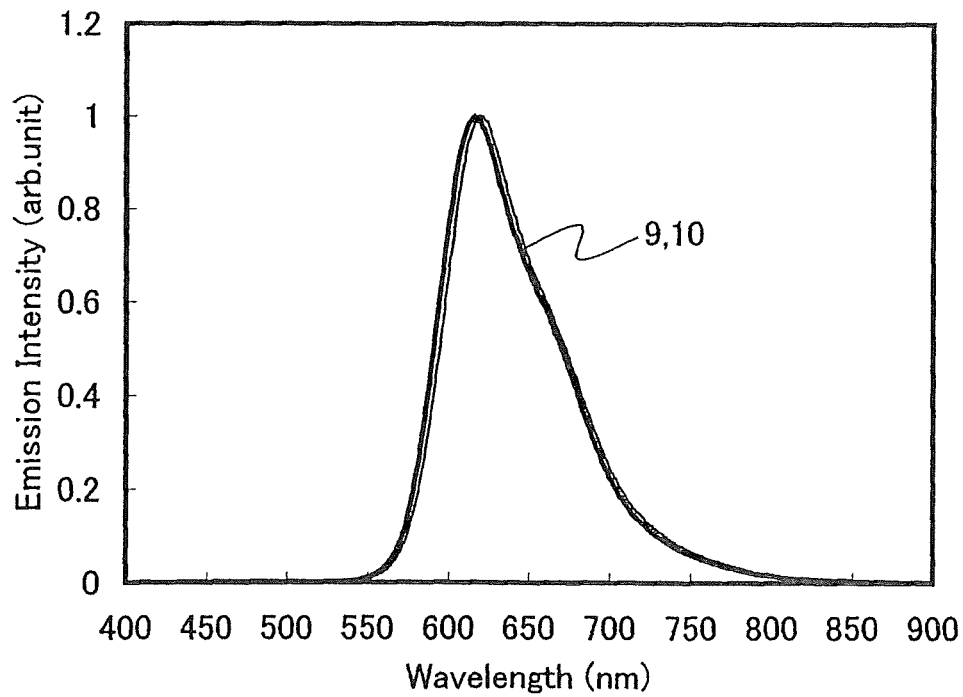
FIG. 20 is a graph showing emission spectra of light-emitting elements formed in Example 5.

FIG. 18A shows current density-luminance characteristics of the light-emitting elements, and FIG. 18B shows voltage-luminance characteristics thereof. FIG. 19 shows luminance-current efficiency characteristics of the light-emitting elements. FIG. 20 shows emission spectra of the light-emitting elements. The emission spectra of the light-emitting elements were almost the same and emission was red, which was derived from Ir(tppr)$_2$(acac).

As seen from FIG. 19, the current efficiency of the comparative light-emitting element 10 is decreased in the practical luminance region (100 cd/m$^2$ or more). The comparative light-emitting element 10 is in the state illustrated in FIG. 2B in Embodiment Mode 1. Since Ir(tppr)$_2$(acac) having a high electron-trapping property is added into CO11 which is an electron-transporting compound, it is considered that the carrier balance is bad and current efficiency is decreased. In addition, as apparent from FIG. 18B, driving voltage is high. On the other hand, the light-emitting element 9 of the present invention exhibited high emission efficiency as apparent from FIG. 19.

Figure 21:
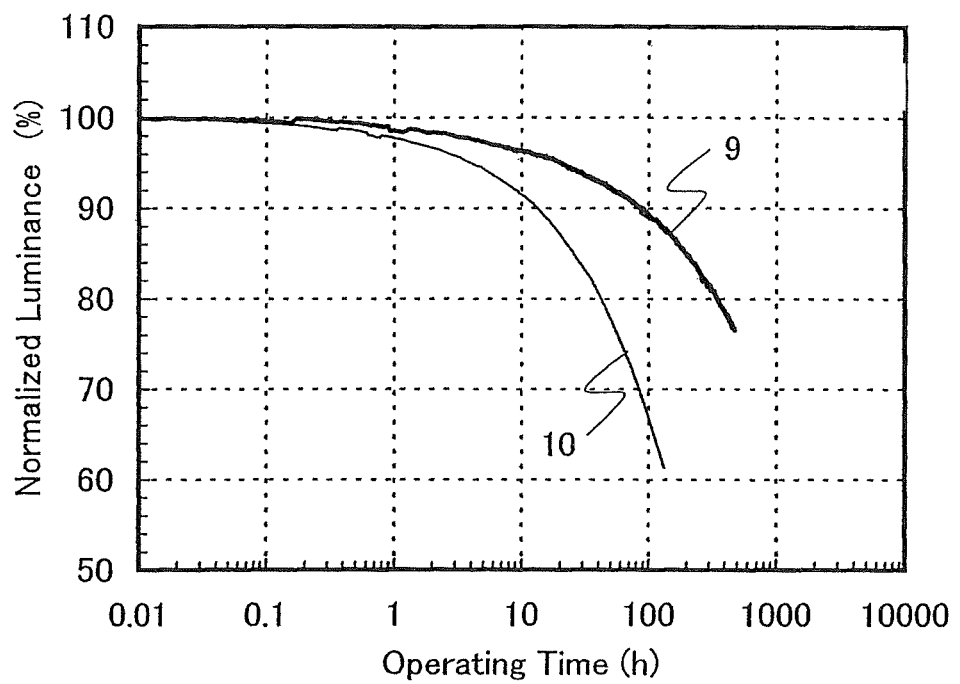
FIG. 21 is a graph showing luminance degradation curves of light-emitting elements formed in Example 5.

Next, the initial luminance was set at 1000 cd/m$^2$, and these elements were driven at the constant current density. Thus, luminance degradation curves as seen in FIG. 21 are obtained. FIG. 21 is a graph in which the horizontal axis represents time and the vertical axis represents relative luminance (%) when the initial luminance is 100. As apparent from FIG. 21, the light-emitting element of the present invention has greatly improved lifetime. The comparison of characteristics at 1000 cd/m² and lifetime is shown in Table 6.

TABLE 6

|  | Voltage [V] | Current Efficiency [cd/A] | External quantum efficiency [%] | Power efficiency [lm/W] | Luminance half-life period [hr] |
|---|---|---|---|---|---|
| Light-emitting element 9 | 4.4 | 22 | 17 | 16 | 2,900* |
| Comparative light-emitting element 10 | 7.0 | 12 | 10 | 5.4 | 230* |

*Extrapolation value

As described above, it can be found that the light-emitting element of the present invention can achieve both high emission efficiency and long lifetime. Accordingly, by implementing the present invention, a light-emitting element having high emission efficiency and long lifetime can be provided.

Example 6

Example 6 will specifically exemplify the light-emitting element of the present invention with reference to a comparative example. In addition, FIG. 3 illustrates a structure of the element.

<<Fabrication of a Light-Emitting Element 11 of the Present Invention and a Comparative Light-Emitting Element 12>.

A light-emitting element 11 of the present invention was fabricated in the same way as the light-emitting element 2 of Example 2, except that BAlq of the light-emitting layer 313 was changed to CzQn represented by the structural formula (V). Note that the ratio of NPB, CzQn and Ir (tppr)$_2$(acac) was NPB:CzQn:Ir(tppr)$_2$(acac)=0.25:1:0.06 (mass ratio). In addition, a comparative light-emitting element 12 was fabricated in the same way as the comparative light-emitting element 3 of Example 2, except that BAlq of the light-emitting layer 313 was changed to CzQn. CzQn is a heteroaromatic compound having a quinoxaline skeleton.

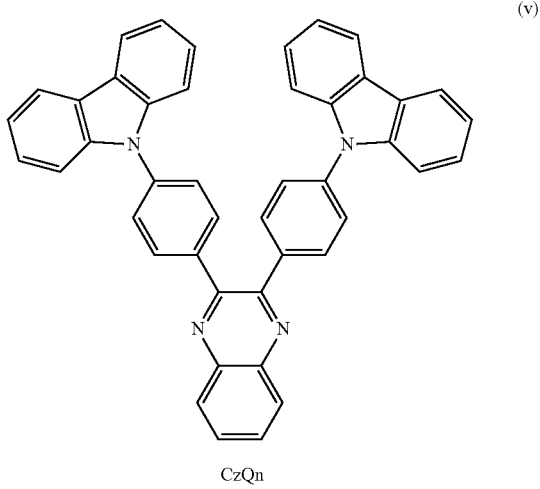 [SMILES: c1ccc2nc(-c3ccc(-n4c5ccccc5c5ccccc54)cc3)c(-c3ccc(-n4c5ccccc5c5ccccc54)cc3)nc2c1]

CzQn (v)

<<Operation Characteristics of the Light-Emitting Element 11 and the Comparative Light-Emitting Element 12>>

The thus obtained light-emitting element 11 and the comparative light-emitting element 12 were sealed in a glove box with a nitrogen atmosphere so as not to expose the light-emitting elements to the air, operation characteristics of the light-emitting elements were measured. Note that the measurement was performed at room temperature (an atmosphere kept at 25° C.).

Figure 22A:
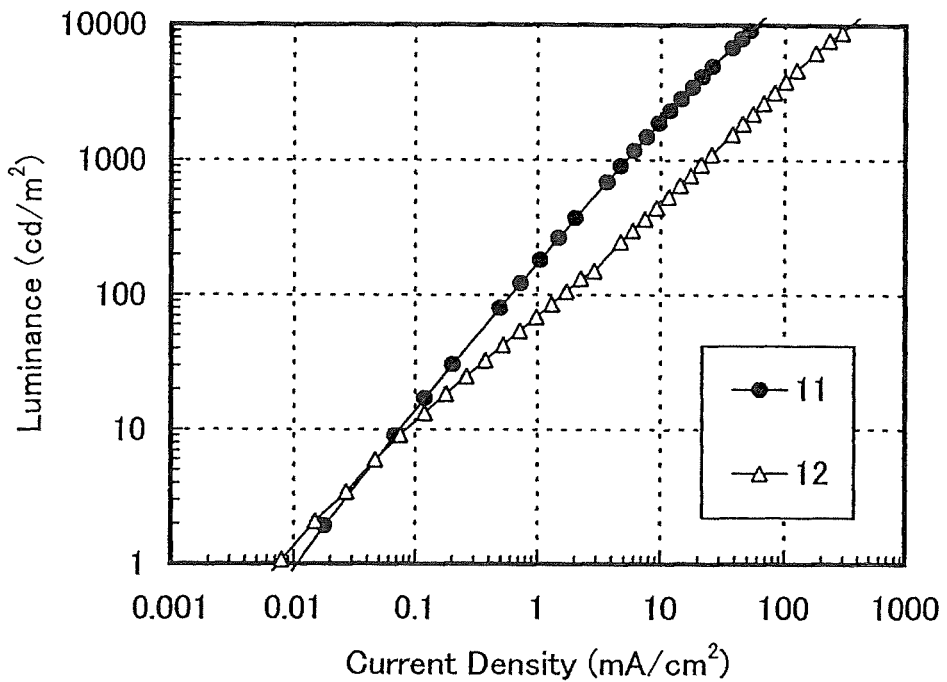
FIGS. 22A and 22B are graphs showing characteristics of light-emitting elements formed in Example 6.
Figure 22B:
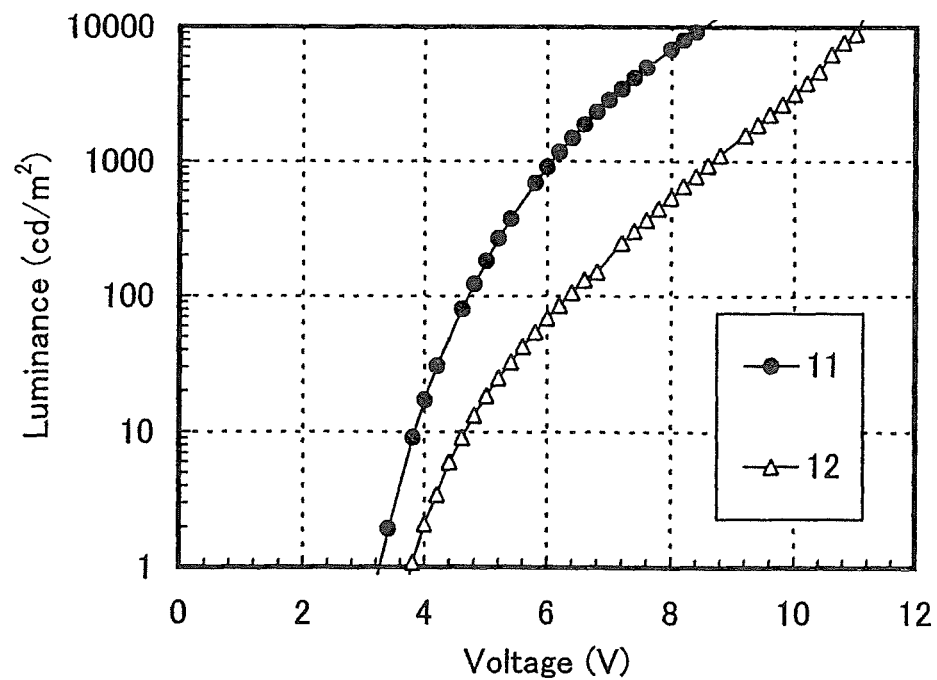
Figure 23:
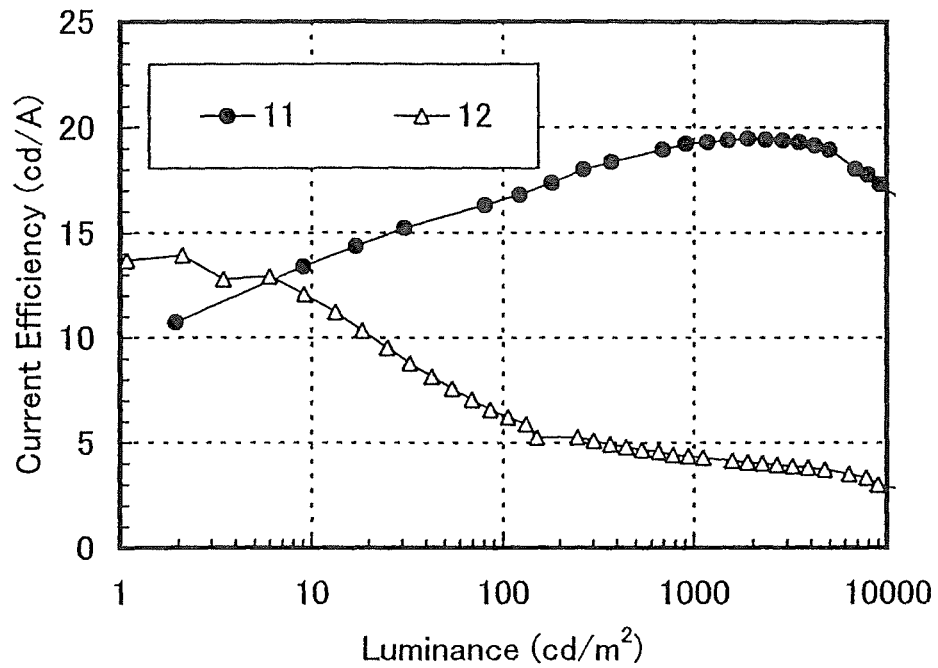
FIG. 23 is a graph showing characteristics of light-emitting elements formed in Example 6.
Figure 24:
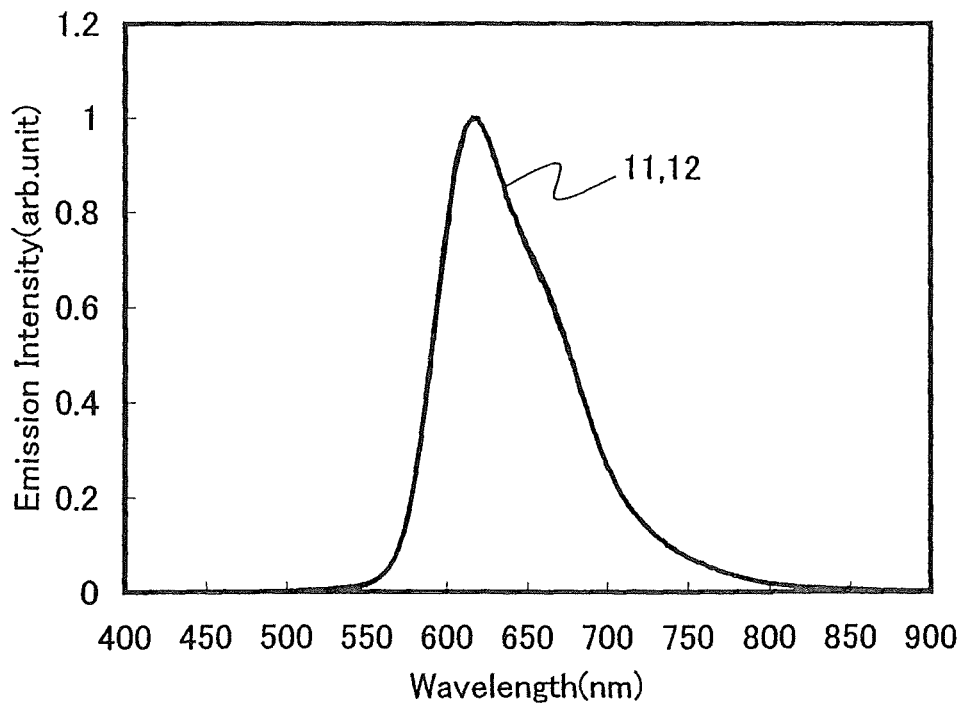
FIG. 24 is a graph showing emission spectrum of light-emitting elements formed in Example 6.

FIG. 22A shows current density-luminance characteristics of the light-emitting elements, and FIG. 22B shows voltage-luminance characteristics thereof. FIG. 23 shows luminance-current efficiency characteristics of the light-emitting elements. FIG. 24 shows emission spectra of the light-emitting elements. The emission spectra of the light-emitting elements were almost the same and emission was red, which was derived from Ir(tppr)$_2$(acac).

As apparent from FIG. 23, the current efficiency of the comparative light-emitting element 12 is decreased in the practical luminance region (100 cd/m² or more). The comparative light-emitting element 12 is in the state illustrated in FIG. 2B in Embodiment Mode 1. Since Ir(tppr)$_2$(acac) having a high electron-trapping property was added into CzQn which was an electron-transporting compound, it is considered that the carrier balance was bad and current efficiency was decreased. In addition, as apparent from FIG. 22B, driving voltage is high. On the other hand, the light-emitting element 11 of the present invention exhibited high emission efficiency as apparent from FIG. 23.

Figure 25:
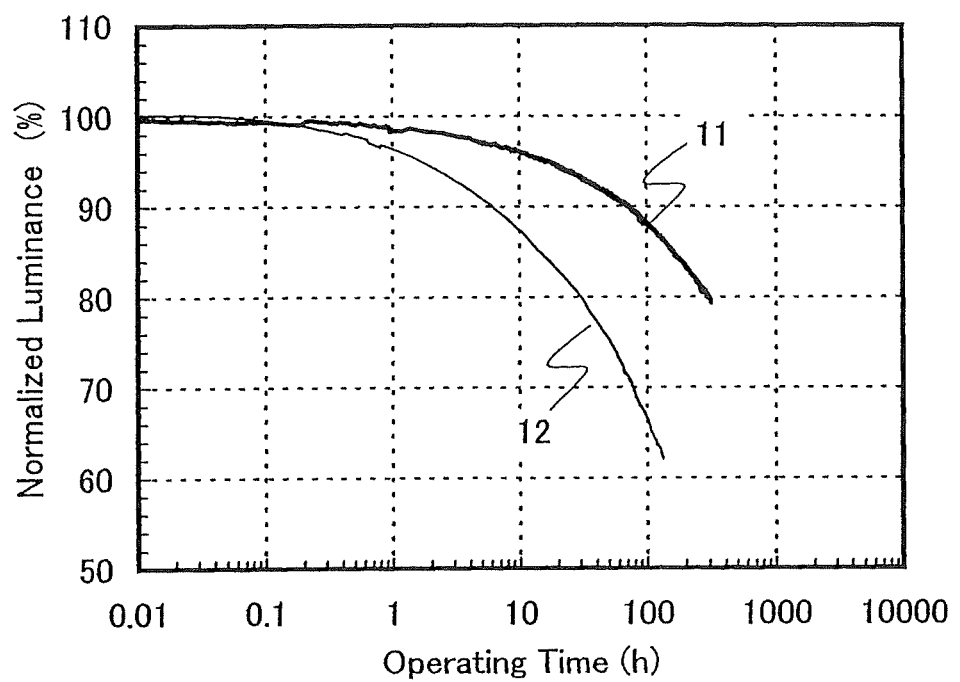
FIG. 25 is a graph showing luminance degradation curves of light-emitting elements formed in Example 6.

Next, the initial luminance was set at 1000 cd/m², and these elements were driven at the constant current density. At that time, luminance degradation curves as seen in FIG. 25 was obtained. FIG. 25 is a graph in which the horizontal axis represents time and the vertical axis represents relative luminance (%) when the initial luminance is 100. As apparent from FIG. 25, the light-emitting element of the present invention has greatly improved lifetime. The comparison of characteristics at 1000 cd/m² and lifetime is shown in Table 7.

TABLE 7

|  | Voltage [V] | Current Efficiency [cd/A] | External quantum efficiency [%] | Power efficiency [lm/W] | Luminance half-life period [hr] |
|---|---|---|---|---|---|
| Light-emitting element 11 | 6.0 | 19 | 15 | 10 | 2,600* |
| Comparative light-emitting element 12 | 8.6 | 4.4 | 3.5 | 1.6 | 310* |

*Extrapolation value

As described above, it can be found that the light-emitting element of the present invention can achieve both high emission efficiency and long lifetime. Accordingly, by implementing the present invention, a light-emitting element having high emission efficiency and long lifetime can be provided.

Example 7

Example 7 will specifically exemplify the light-emitting element of the present invention with reference to a comparative example. In addition, FIG. 3 illustrates a structure of the element.

<<Fabrication of a Light-Emitting Element 13 of the Present Invention and a Comparative Light-Emitting Element 14>>

A light-emitting element 13 of the present invention was fabricated in the same way as the light-emitting element 2 of Example 2, except that BAlq of the light-emitting layer 313 was changed to DCzPQ represented by the structural formula (Vi). Note that the ratio of NPB, DCzPQ and Ir(tppr)$_2$(acac) was NPB:DCzPQ:Ir(tppr)$_2$(acac)=0.5:1:0.06 (mass ratio). In addition, a comparative light-emitting element 14 was fabricated in the same way as the comparative light-emitting element 3 of Example 2, except that BAlq of the light-emitting layer 313 was changed to DCzPQ. DCzPQ is a heteroaromatic compound having a quinoxaline skeleton.

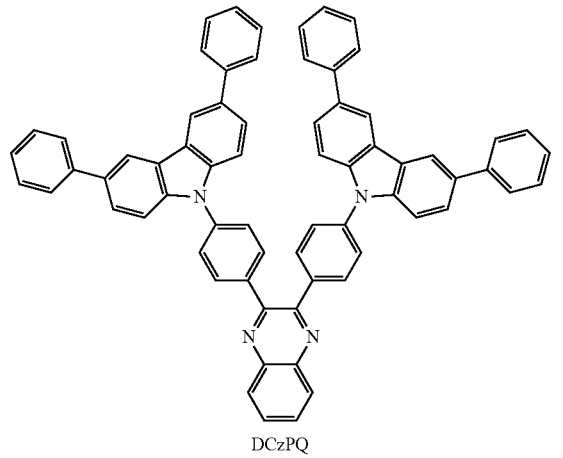

(vi)

DCzPQ

<<Operation Characteristics of the Light-Emitting Element 13 and the Comparative Light-Emitting Element 14>>

The thus obtained light-emitting element 13 and the comparative light-emitting element 14 were sealed in a glove box with a nitrogen atmosphere so as not to expose the light-emitting elements to the air, operation characteristics of the light-emitting elements were measured. Note that the measurement was performed at room temperature (an atmosphere kept at 25° C.).

Figure 26A:
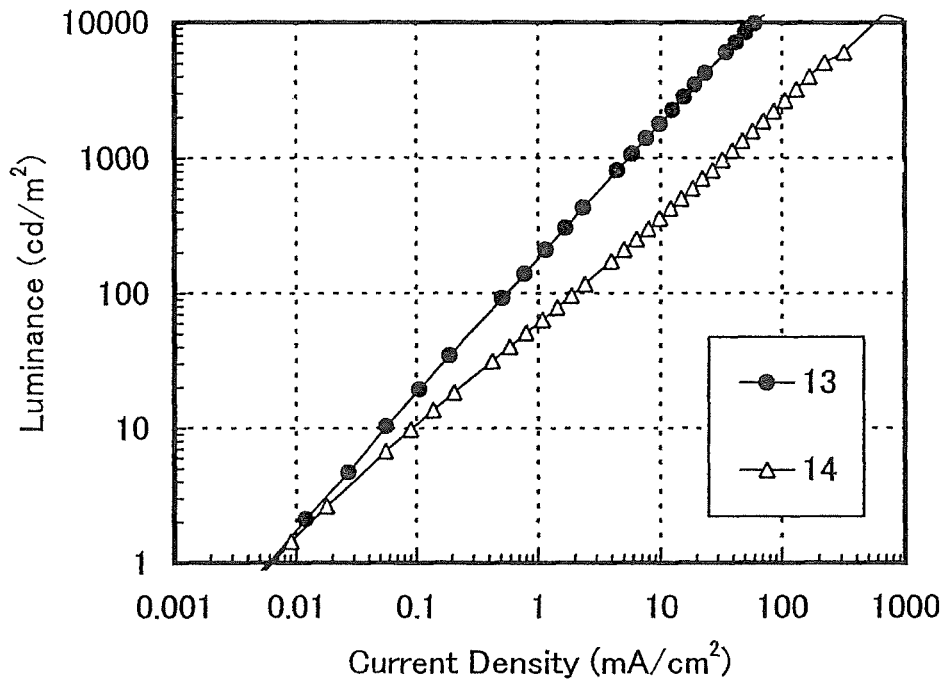
FIGS. 26A and 26B are graphs showing characteristics of light-emitting elements formed in Example 7.
Figure 26B:
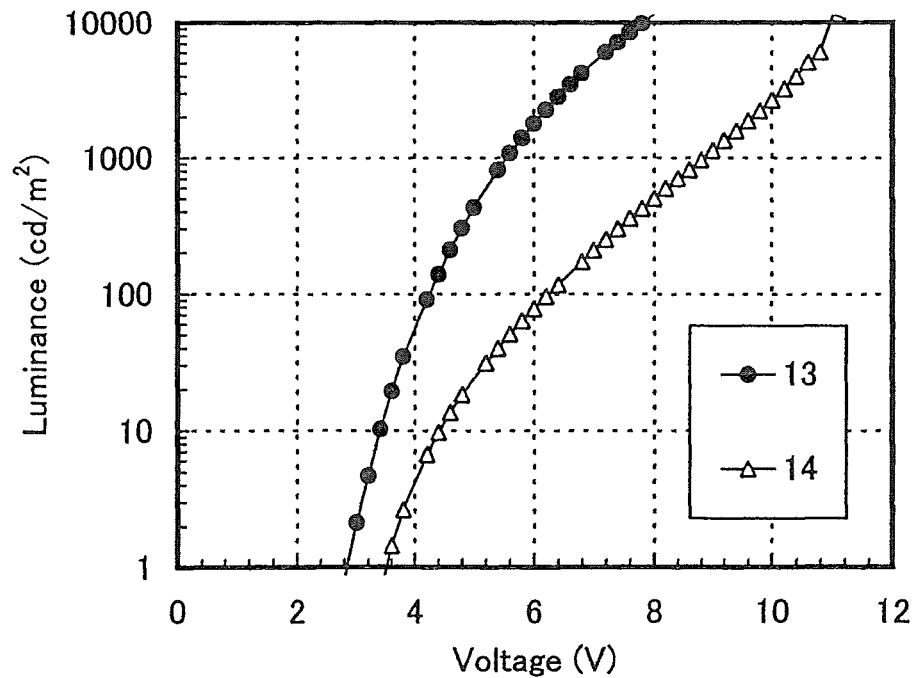
Figure 27:
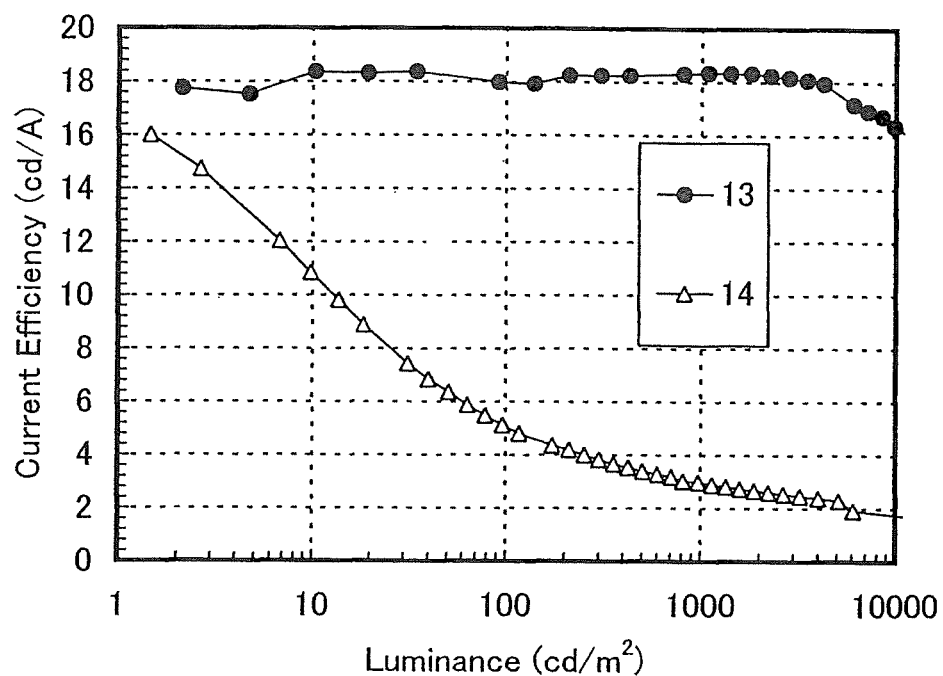
FIG. 27 is a graph showing characteristics of light-emitting elements formed in Example 7.
Figure 28:
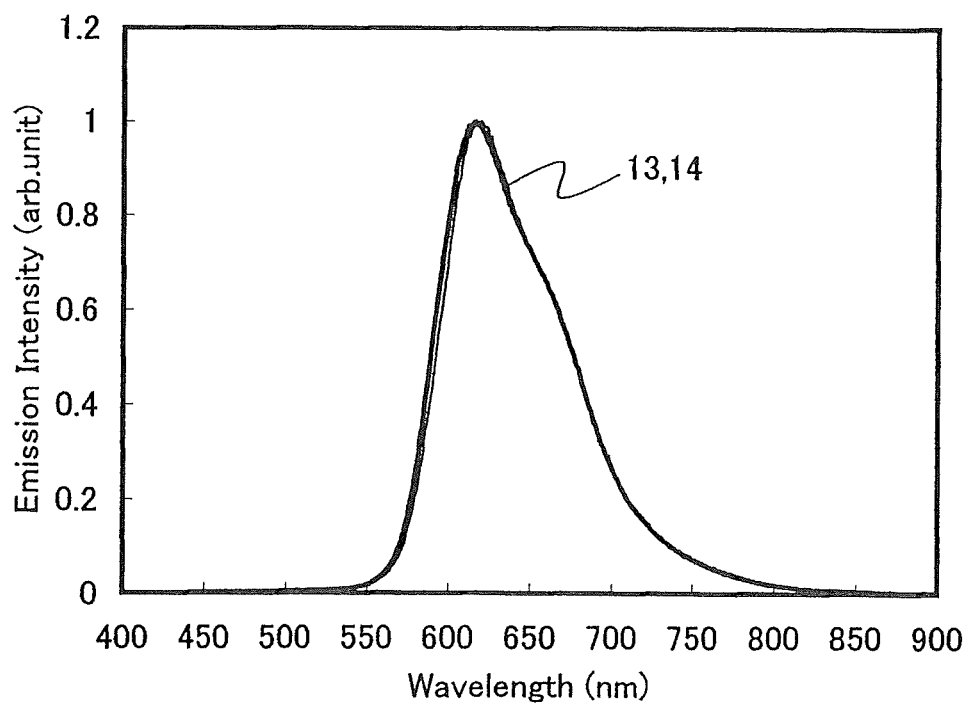
FIG. 28 is a graph showing emission spectra of light-emitting elements formed in Example 7.

FIG. 26A shows current density-luminance characteristics of the light-emitting elements, and FIG. 26B shows voltage-luminance characteristics thereof. FIG. 27 shows luminance-current efficiency characteristics of the light-emitting elements. FIG. 28 shows emission spectra of the light-emitting elements. The emission spectra of the light-emitting elements were almost the same and emission was red, which was derived from Ir(tppr)$_2$(acac).

As seen from FIG. 27, the current efficiency of the comparative light-emitting element 14 is decreased in the practical luminance region (100 cd/m$^2$ or more). The comparative light-emitting element 14 is in the state illustrated in FIG. 2B in Embodiment Mode 1. Since Ir(tppr)$_2$(acac) having a high electron-trapping property was added into DCzPQ which was an electron-transporting compound, it is considered that the carrier balance was bad and current efficiency was decreased. In addition, as apparent from FIG. 26B, driving voltage is high. On the other hand, the light-emitting element 13 of the present invention exhibited high emission efficiency as apparent from FIG. 27.

Figure 29:
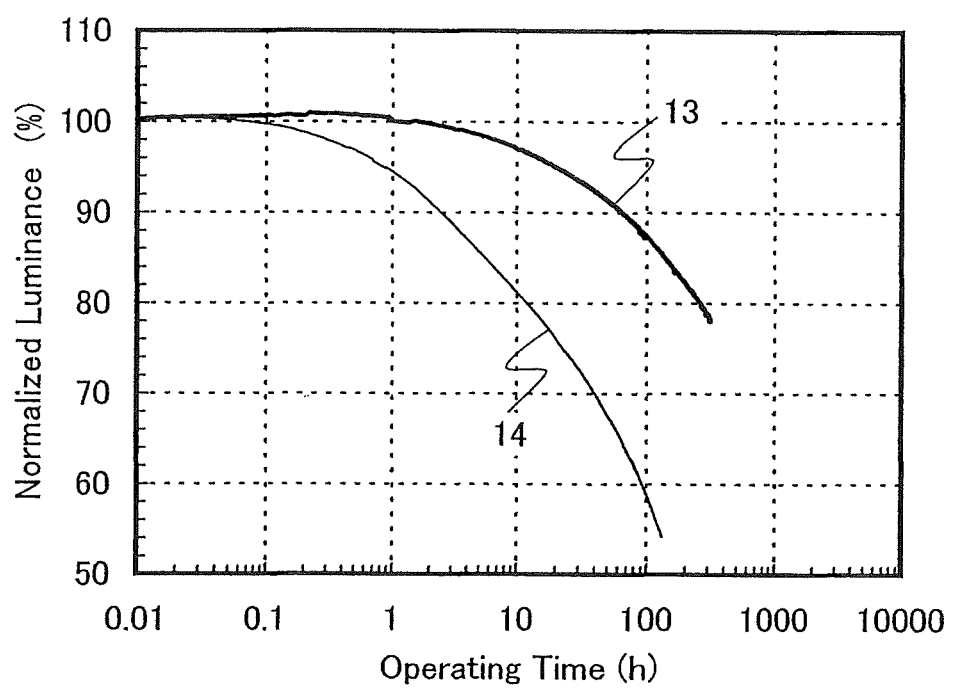
FIG. 29 is a graph showing luminance degradation curves of light-emitting elements formed in Example 7.

Next, the initial luminance was 1000 cd/m$^2$, and these elements were driven at the constant current density. At that time, luminance degradation curves as seen in FIG. 29 was obtained. FIG. 29 is a graph in which the horizontal axis represents time and the vertical axis represents relative luminance (%) when the initial luminance is 100. As apparent from FIG. 29, the light-emitting element of the present invention has greatly improved lifetime. The comparison of characteristics at 1000 cd/m$^2$ and lifetime is shown in Table 8.

TABLE 8

| | Voltage [V] | Current Efficiency [cd/A] | External quantum efficiency [%] | Power efficiency [lm/W] | Luminance half-life period [hr] |
|---|---|---|---|---|---|
| Light-emitting element 13 | 5.6 | 18 | 14 | 10 | 2,200* |
| Comparative light-emitting element 14 | 8.8 | 3.0 | 2.5 | 1.1 | 180* |

*Extrapolation value

As described above, it can be found that the light-emitting element of the present invention can achieve both high emission efficiency and long lifetime. Accordingly, by implementing the present invention, a light-emitting element having high emission efficiency and long lifetime can be provided.

Example 8

Example 8 will specifically exemplify the light-emitting element of the present invention with reference to a comparative example. In addition, FIG. 3 illustrates a structure of the element.

<<Fabrication of a Light-Emitting Element 15 of the Present Invention and a Comparative Light-Emitting Element 16>>

The hole-injecting layer 311 and the hole-transporting layer 312 were formed in the same way as those of the light-emitting element 1 in Example 2. The light-emitting layer 313 was formed over the hole-transporting layer 312. In the light-emitting element 15 of the present invention, the light-emitting layer 313 includes NPB as the first organic compound, BAlq as the second organic compound and (acetylacetonato)bis[5-(3-fluorophenyl)-2,3-diphenylpyrazinato]iridium(III) (abbreviation: [Ir(dppr-3FP)$_2$(acac)]), represented by the structural formula (18), as the pyrazine-based organometallic complex. The light-emitting layer 313 was formed by co-evaporation such that the mass ratio is NPB: BAlq: Ir(dppr-3FP)$_2$(acac)=0.05:1:0.06. The thickness was 50 nm. On the other hand, in the comparative light-emitting element 16, the light-emitting layer 313 was formed by co-evaporation such that the mass ratio, BAlq: Ir(dppr-3FP)$_2$(acac)=1:0.06, without using NPB. The thickness of the light-emitting layer 313 was 50 nm. Note that Ir(dppr-3FP)$_2$(acac) is a kind of organometallic complexes represented by the general formula (G6) in Embodiment Mode 3.

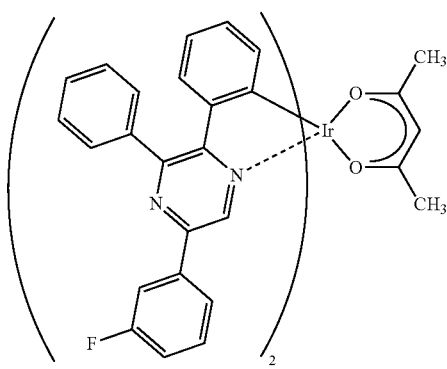

(18)

Next, a 30-nm-thick Alq$_3$ was evaporated to form the electron-transporting layer 314. Over the electron-transporting layer 314, a 1-am-thick lithium fluoride (LF) was evaporated to form the electron-injecting layer 315. Lastly, a 200-nm-thick aluminum was formed as the second electrode 302 serving as a cathode. In this manner, the light-emitting element 15 of the present invention and the comparative light-emitting element 16 were fabricated. All the above evaporation processes were conducted by resistance heating.

<<Operation Characteristics of the Light-Emitting Element 15 and the Comparative Light-Emitting Element 16>>

The thus obtained light-emitting element 15 and the comparative light-emitting element 16 were scaled in a glove box with a nitrogen atmosphere so as not to expose the light-emitting elements to the air, operation characteristics of the light-emitting elements were measured. Note that the measurement was performed at room temperature (an atmosphere kept at 25° C.).

Figure 33A:
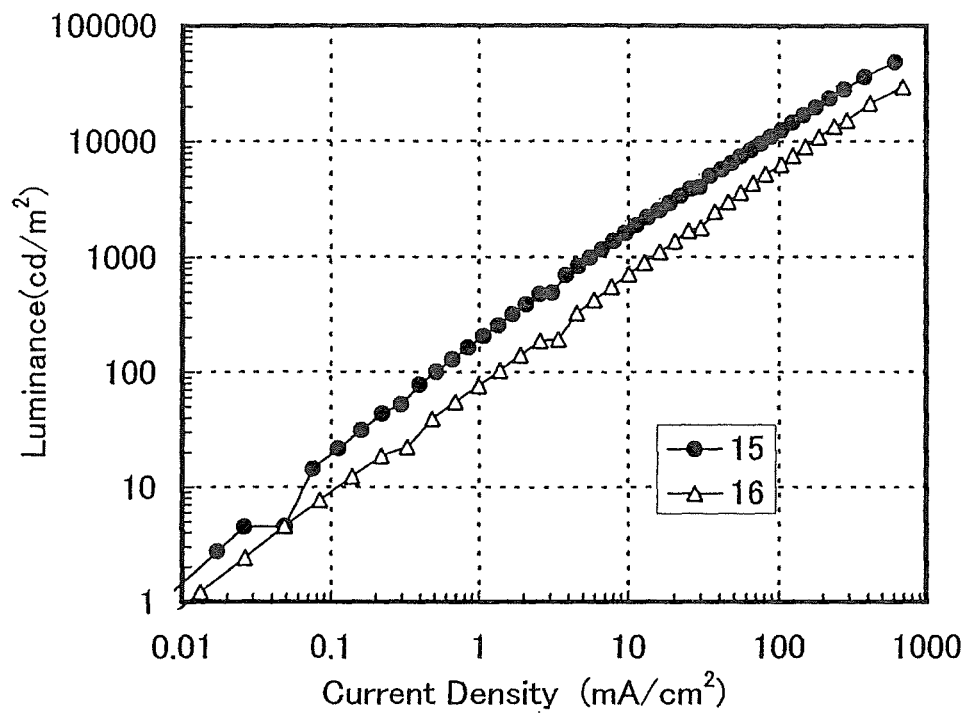
FIGS. 33A and 33B are graphs showing characteristics of light-emitting elements formed in Example 8.
Figure 33B:
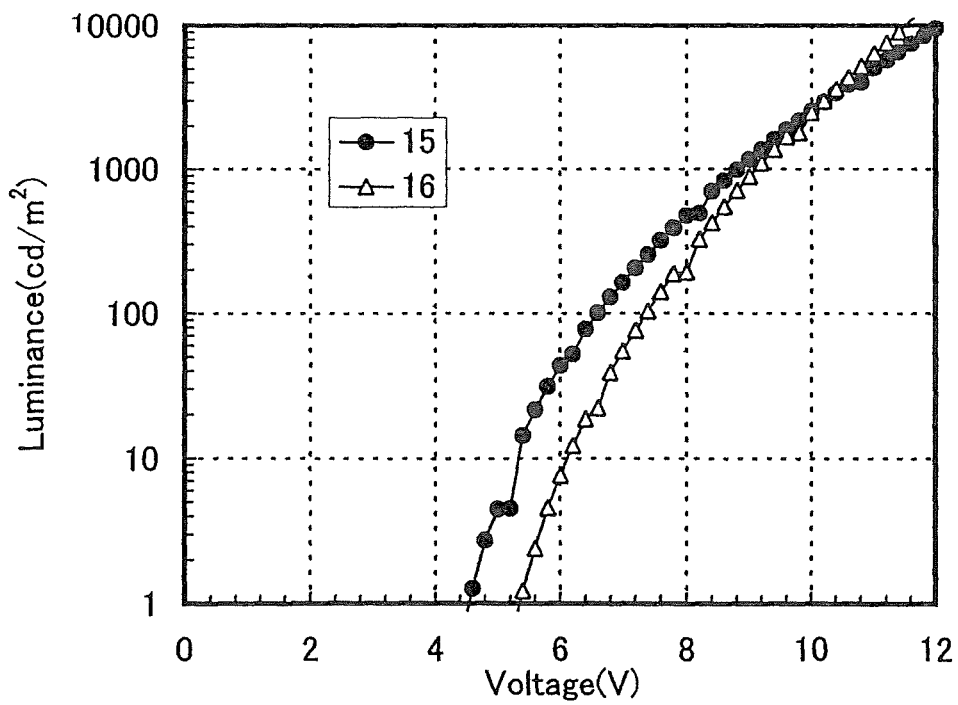
Figure 34:
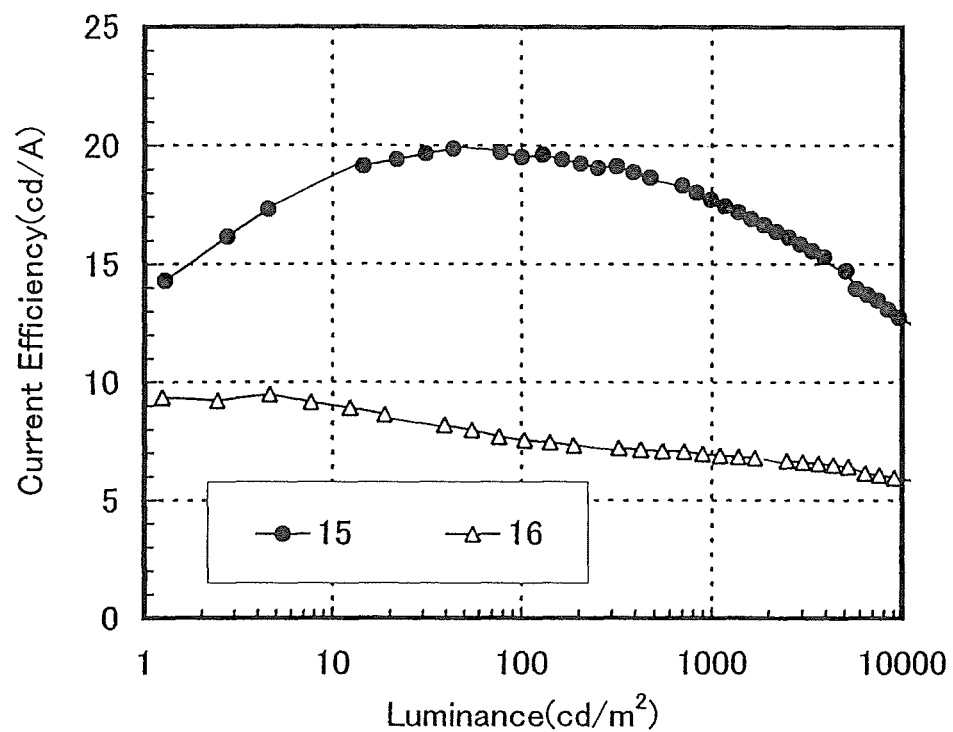
FIG. 34 is a graph showing characteristics of light-emitting elements formed in Example 8.
Figure 35:
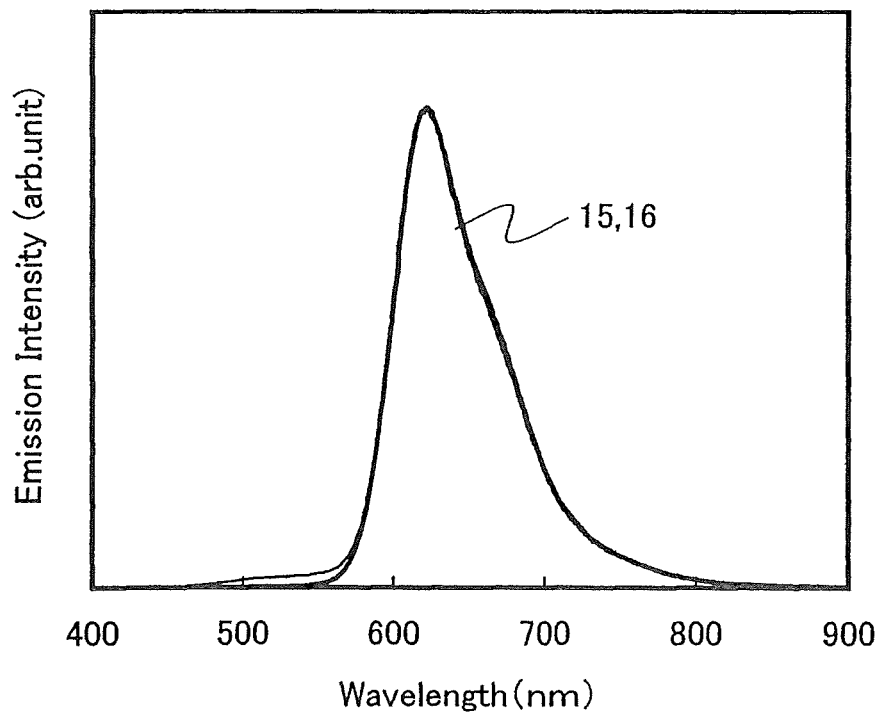
FIG. 35 is a graph showing emission spectra of light-emitting elements formed in Example 8.

FIG. 33A shows current density-luminance characteristics of the light-emitting elements, and FIG. 33B shows voltage-luminance characteristics thereof. FIG. 34 shows luminance-current efficiency characteristics of the light-emitting elements. FIG. 35 shows emission spectra of the light-emitting elements. From the emission spectra, it is found that red emission from the both light-emitting elements was observed, which was derived from Ir(dppr-3Fp)$_2$(acac). Note that CIE chromaticity coordinates of the light-emitting element 15 was (x, y)=(0.67, 0.33), and the coordinates correspond to the red coordinates of red color according to NTSC. Thus, the light-emitting elements exhibited favorable red emission.

Figure 36:
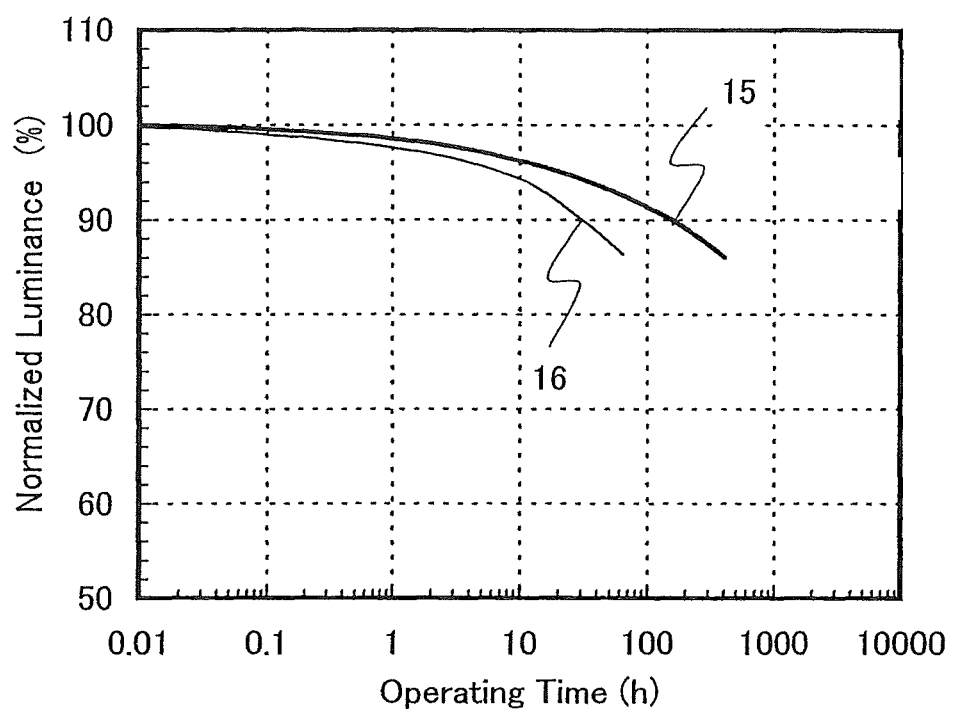
FIG. 36 is a graph showing luminance degradation curves of light-emitting elements formed in Example 8.

Next, the initial luminance was set at 1000 cd/m$^2$, and these elements were driven at the constant current density. At that time, luminance degradation curves as seen in FIG. 36 were obtained. FIG. 36 is a graph in which the horizontal axis represents time and the vertical axis represents relative luminance (%) when the initial luminance is 100. As apparent from FIG. 36, the light-emitting element of the present invention have greatly improved lifetime. The comparison of characteristics at 1000 cd/m$^2$ and lifetime is shown in Table 9. Note that it appears to take 10000 hours or more for the light-emitting element 15 to reach the luminance half-life period as apparent from FIG. 36, and thus the lifetime of the light-emitting element is compared in terms of the period in which the luminance decreased to 86%.

TABLE 9

| | Voltage [V] | Current Efficiency [cd/A] | External quantum efficiency [%] | Power efficiency [lm/W] | The period in which the luminance decreased to 86% [hr] |
|---|---|---|---|---|---|
| Light-emitting element 15 | 8.8 | 18 | 16 | 6.3 | 2,200* |
| Comparative light-emitting element 16 | 9.2 | 6.9 | 5.8 | 2.4 | 180* |

*Extrapolation value

As described above, it can be found that the light-emitting element of the present invention can achieve both high emission efficiency and long lifetime. Accordingly, by implementing the present invention, a light-emitting element having high emission efficiency and long lifetime can be provided.

In this example, a novel substance, (acetylacetonato)bis[5-(3-fluorophenyl)-2,3-diphenylpyrazinato]iridium(III) (abbreviation: Ir(dppr-3FP)$_2$(acac) was used. Thus, a synthesis example thereof will be described specifically.

<Step 1: Synthesis of 5-(3-fluorophenyl)-2,3-diphenylpyrazine (abbreviation: Hdppr-3FP)>

In a nitrogen atmosphere, 7.5 mL of a hexane solution of n-butyllithium (1.58 mol/L) was dropped into a mixed solution of 1.49 g of 3-bromofluorobenzene and 11 mL of tetrahydrofuran at −78° C. and stirred for 30 minutes at −78° C. The obtained solution was dropped into a mixed solution, which was cooled by ice, of 2.45 g of 2,3-diphenylpyrazine and 20 mL of tetrahydrofuran, and stirred for one hour at room temperature. Water was added into this mixture and an organic layer was extracted as ethyl acetate using an extraction solvent. The obtained organic layer was washed with water, and dried with anhydrous magnesium. The solution after drying was filtrated. The solvent of the solution was distilled off and the residue obtained by distillation was refined with a silica gel column chromatography using dichloromethane as a developing solvent. In this way, an objective pyrazine derivative, Hdppr-3FP (orange powder, yield: 8%) was obtained. The synthesis scheme of Step 1 is shown by (a-1).

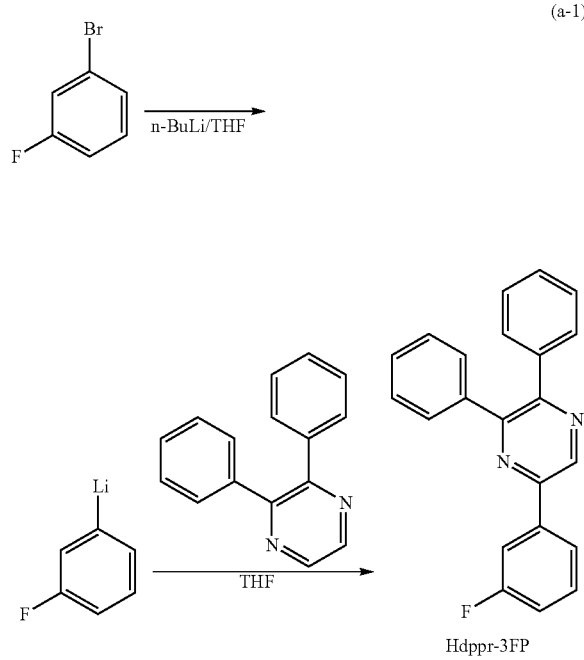

(a-1)

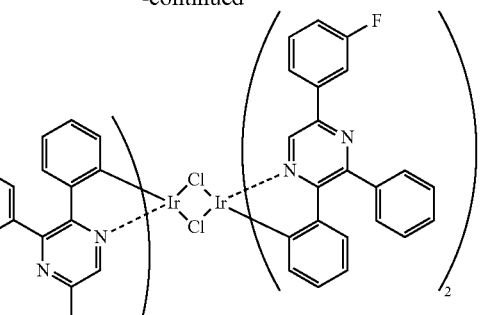

<Step 2: Synthesis of di-μ-chloro-bis[bis{5-(3-fluorophenyl)-2,3-diphenylpyrazinato}iridium(III)](abbreviation: [Ir(dppr-3FP)₂Cl]₂)>

Subsequently to Step 1, 4.5 mL of 2-ethoxyethanol, 1.5 mL of water, 0.40 g of the pyrazine derivative, Hdppr-3FP obtained in Step 1, and 0.18 g of iridium chloride hydrate (IrCl₃·H₂O) (manufactured by Sigma-Aldrich Corp.) were put in an egg plant flask attached with a reflux tube, and the inside of the flask was substituted by argon. After that, it was subjected to microwave (2.45 GHz, 200 W) for five hours to be reacted. Orange powder precipitated from the reaction solution was filtrated and washed with ethanol to form a binuclear complex, [Ir(dppr-3FP)₂Cl]₂ (yield: 12%). A microwave synthesizer (Discovery, manufactured by CEM corporation) was used for the irradiation of microwave. The synthesis scheme of Step 2 is shown by (b-1).

<Step 3: Synthesis of (acetylacetonato)bis[5-(3-fluorophenyl)-2,3-diphenylpyrazinato]iridium(III) (abbreviation: [Ir(dppr-3FP)₂(acac)]

Subsequently to Step 2, 5 mL of 2-ethoxyethanol, 0.13 g of the binuclear complex, [Ir(dppr-3FP)₂Cl]₂ obtained in Step 2, 0.02 mL of acetylacetone, and 0.078 g of sodium carbonate were put in an egg plant flask attached with a reflux tube, and the inside of the flask was substituted by argon. After that, it was subjected to a microwave (2.45 GHz 200 W) for 15 minutes to be reacted. The reaction solution was filtrated, and the solvent of the obtained filtrate was distilled off. The residue obtained by distillation was recrystallized by methanol. In this way, [Ir(dppr-3FP)₂(acac)] was obtained (red powder, yield: 100%). The synthesis scheme of Step 3 is shown by (c-1).

(b-1)

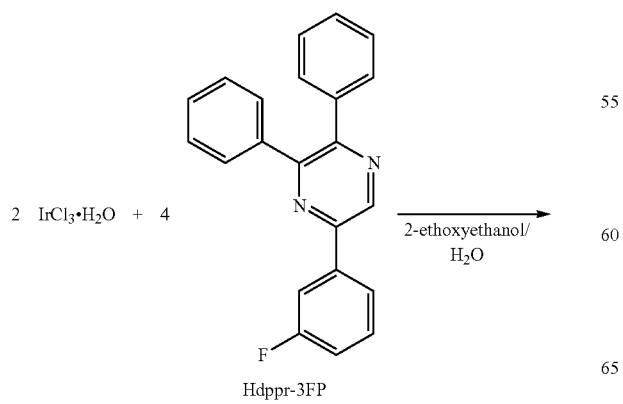

(c-1)

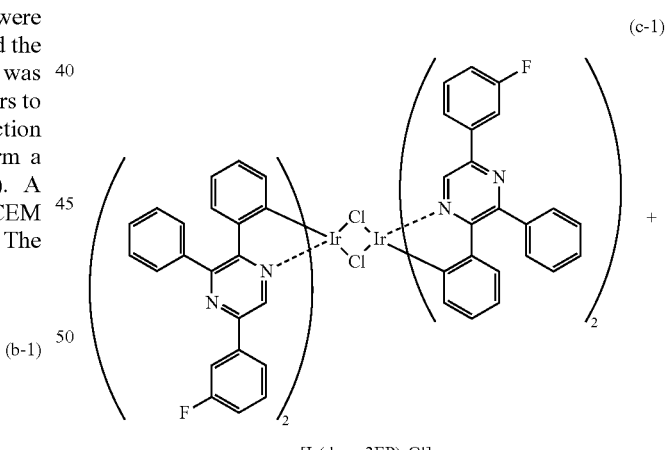

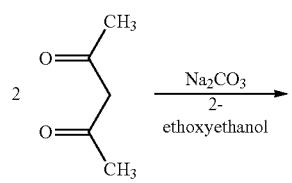

-continued

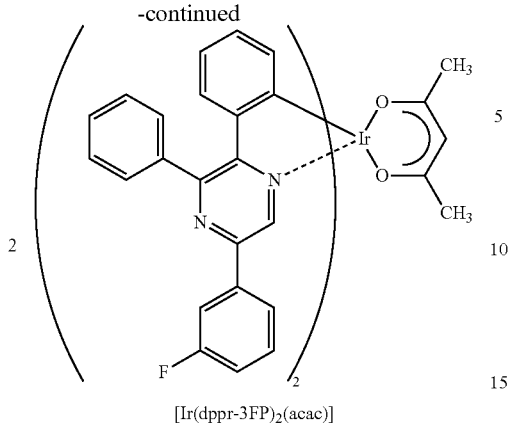

[Ir(dppr-3FP)$_2$(acac)]

This application is based on Japanese Patent Application serial no. 2006-325057 filed in Japan Patent Office on Nov. 30, 2006, the entire contents of which are hereby incorporated by reference.

What is claimed is:

1. A light-emitting device comprising:
a first electrode;
a hole transporting layer over the first electrode;
a light-emitting layer over the hole transporting layer;
an electron transporting layer over the light-emitting layer; and
a second electrode over the electron transporting layer,
wherein the light-emitting layer includes a first organic compound having a hole-transporting property, a second organic compound having an electron transporting property, and an organometallic complex,
wherein a central metal of the organometallic complex comprises an element belonging to one of Group 9 and Group 10,
wherein a ligand of the organometallic complex comprises a pyrazine skeleton, and
wherein an amount of the second organic compound is equal to or higher than an amount of the first organic compound.

2. The light-emitting device according to claim 1, wherein the ligand comprises a 2-arylpyrazine derivative.

3. The light-emitting device according to claim 1, wherein the ligand comprises a 2-phenylpyrazine derivative.

4. The light-emitting device according to claim 1, wherein the ligand comprises a 2,5-diphenylpyrazine derivative.

5. The light-emitting device according to claim 1, wherein the central metal comprises one of iridium and platinum, the first organic compound comprises one of an aromatic amine compound and a carbazole derivative, and the second organic compound comprises one of a heteroaromatic compound and a metal complex.

6. The light-emitting device according to claim 1, wherein an amount of the organometallic complex in the light-emitting layer is greater than or equal to 1 percent by mass and less than or equal to 10 percent by mass.

7. The light-emitting device according to claim 1, wherein a mass ratio of the second organic compound to the first organic compound is 1 to 20 inclusive.

8. The light-emitting device according to claim 1,
wherein a LUMO level of the organometallic complex is deeper than a LUMO level of the first organic compound and a LUMO level of the second organic compound by 0.2 eV or more, and
wherein a HOMO level of the organometallic complex is located between a HOMO level of the first organic compound and a HOMO level of the second organic compound.

9. A light-emitting device comprising:
a first electrode;
a hole transporting layer over the first electrode;
a light-emitting layer over the hole transporting layer;
an electron transporting layer over the light-emitting layer; and
a second electrode over the electron transporting layer,
wherein the light-emitting layer includes a first organic compound having a hole-transporting property, a second organic compound having an electron transporting property, and an organometallic complex,
wherein the organometallic complex is represented by a general formula (G1),

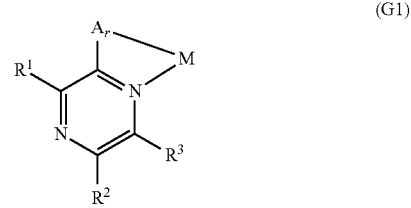

(G1)

wherein Ar represents an arylene group, $R^1$ represents one of an alkyl group and an aryl group, $R^2$ represents one of hydrogen, an alkyl group and an aryl group, $R^3$ represents one of hydrogen and an alkyl group, M represents a central metal, and the central metal comprises an element belonging to one of Group 9 and Group 10, and
wherein an amount of the second organic compound is equal to or higher than an amount of the first organic compound.

10. The light-emitting device according to claim 9, wherein the Ar is represented by a general formula (G2), and

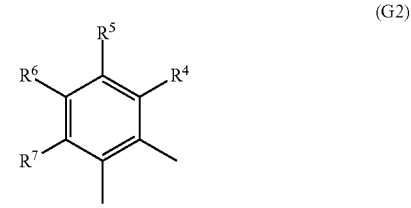

(G2)

wherein $R^4$ to $R^7$ each represent one of hydrogen, an alkyl group, a halogen group, a haloalkyl group, an alkoxy group, and an alkoxycarbonyl group.

11. The light-emitting device according to claim 9, wherein the Ar is represented by a general formula (G2),

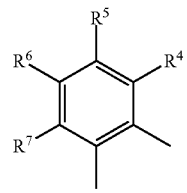
(G2)

wherein the $R^2$ is represented by a general formula (G3), and

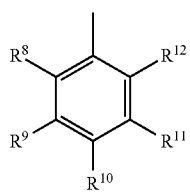
(G3)

wherein $R^4$ to $R^{12}$ each represent one of hydrogen, an alkyl group, a halogen group, a haloalkyl group, an alkoxy group, and an alkoxycarbonyl group.

12. The light-emitting device according to claim 9, wherein the central metal comprises one of iridium and platinum, the first organic compound comprises one of an aromatic amine compound and a carbazole derivative, and the second organic compound comprises one of a heteroaromatic compound and a metal complex.

13. The light-emitting device according to claim 9, wherein an amount of the organometallic complex in the light-emitting layer is greater than or equal to 1 percent by mass and less than or equal to 10 percent by mass.

14. The light-emitting device according to claim 9, wherein a mass ratio of the second organic compound to the first organic compound is 1 to 20 inclusive.

15. The light-emitting device according to claim 9,
wherein a LUMO level of the organometallic complex is deeper than a LUMO level of the first organic compound and a LUMO level of the second organic compound by 0.2 eV or more, and
wherein a HOMO level of the organometallic complex is located between a HOMO level of the first organic compound and a HOMO level of the second organic compound.

16. A light-emitting device comprising:
a first electrode;
a hole transporting layer over the first electrode;
a light-emitting layer over the hole transporting layer;
an electron transporting layer over the light-emitting layer; and
a second electrode over the electron transporting layer,
wherein the light-emitting layer includes a first organic compound having a hole-transporting property, a second organic compound having an electron transporting property, and an organometallic complex,
wherein the organometallic complex is represented by a general formula (G4),

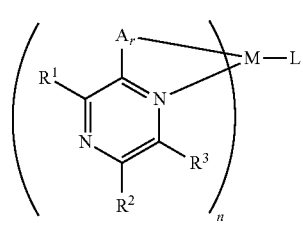
(G4)

wherein Ar represents an arylene group, $R^1$ represents one of an alkyl group and an aryl group, $R^2$ represents one of hydrogen, an alkyl group and an aryl group, $R^3$ represents one of hydrogen and an alkyl group, M represents a central metal, the central metal comprises an element belonging to one of Group 9 and Group 10, and L represents a monoanionic ligand,
wherein when the central metal comprises an element belonging to Group 9, n is 2 and when the central metal comprises an element belonging to Group 10, n is 1,
wherein an amount of the second organic compound is equal to or higher than an amount of the first organic compound.

17. The light-emitting device according to claim 16, wherein the Ar is represented by a general formula (G5), and

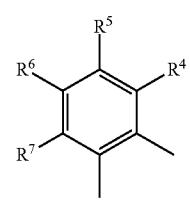
(G5)

wherein $R^4$ to $R^7$ each represent one of hydrogen, an alkyl group, a halogen group, a haloalkyl group, an alkoxy group, and an alkoxycarbonyl group.

18. The light-emitting device according to claim 16, wherein the Ar is represented by a general formula (G5),

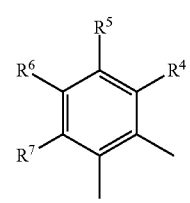
(G5)

wherein the $R^2$ is represented by a general formula (G6), and

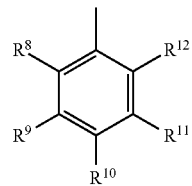 (G6)

wherein $R^4$ to $R^{12}$ each represent one of hydrogen, an alkyl group, a halogen group, a haloalkyl group, an alkoxy group, and an alkoxycarbonyl group.

19. The light-emitting device according to claim 16, wherein the central metal comprises one of iridium and platinum, the first organic compound comprises one of an aromatic amine compound and a carbazole derivative, and the second organic compound comprises one of a heteroaromatic compound and a metal complex.

20. The light-emitting device according to claim 16, wherein an amount of the organometallic complex in the light-emitting layer is greater than or equal to 1 percent by mass and less than or equal to 10 percent by mass.

21. The light-emitting device according to claim 16, wherein a mass ratio of the second organic compound to the first organic compound is 1 to 20 inclusive.

22. The light-emitting device according to claim 16,
wherein a LUMO level of the organometallic complex is deeper than a LUMO level of the first organic compound and a LUMO level of the second organic compound by 0.2 eV or more, and
wherein a HOMO level of the organometallic complex is located between a HOMO level of the first organic compound and a HOMO level of the second organic compound.

\* \* \* \* \*